United States Patent
Tsai et al.

(10) Patent No.: US 9,653,516 B2
(45) Date of Patent: May 16, 2017

(54) ACOUSTIC WAVE DEVICE STRUCTURE, INTEGRATED STRUCTURE OF POWER AMPLIFIER AND ACOUSTIC WAVE DEVICE, AND FABRICATION METHODS THEREOF

(71) Applicant: WIN Semiconductors Corp., Kuei Shan Hsiang, Tao Yuan Shien (TW)

(72) Inventors: Shu-Hsiao Tsai, Tao Yuan Shien (TW); Re Ching Lin, Tao Yuan Shien (TW); Pei-Chun Liao, Tao Yuan Shien (TW); Cheng-Kuo Lin, Tao Yuan Shien (TW); Yung-Chung Chin, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 0 days.

(21) Appl. No.: 14/586,592

(22) Filed: Dec. 30, 2014

(65) Prior Publication Data
US 2016/0190206 A1    Jun. 30, 2016

(51) Int. Cl.
*H01L 29/49*    (2006.01)
*H01L 27/20*    (2006.01)
*H01L 41/332*    (2013.01)
*H03H 9/17*    (2006.01)
*H03H 9/05*    (2006.01)
*H01L 41/311*    (2013.01)

(52) U.S. Cl.
CPC ............ *H01L 27/20* (2013.01); *H01L 41/311* (2013.01); *H01L 41/332* (2013.01); *H03H 9/0542* (2013.01); *H03H 9/171* (2013.01); *H03H 9/173* (2013.01)

(58) Field of Classification Search
CPC ..................................................... H01L 41/332
See application file for complete search history.

(56) References Cited

U.S. PATENT DOCUMENTS

2010/0295100 A1* 11/2010 Huang ................ H01L 29/2003
257/256

* cited by examiner

*Primary Examiner* — Michael Shingleton
(74) *Attorney, Agent, or Firm* — Muncy, Geissler, Olds & Lowe, P.C.

(57) ABSTRACT

An integrated structure of power amplifier and acoustic wave device comprises: a compound semiconductor epitaxial substrate, a power amplifier upper structure formed on a first side of said compound semiconductor epitaxial substrate, and a film bulk acoustic resonator formed on a second side of said compound semiconductor epitaxial substrate; wherein forming an epitaxial structure on a compound semiconductor substrate to form said compound semiconductor epitaxial substrate; wherein said first side of said compound semiconductor epitaxial substrate and said power amplifier upper structure form a power amplifier; said second side of said compound semiconductor epitaxial substrate and said film bulk acoustic resonator form an acoustic wave device; the integrated structure of power amplifier and acoustic wave device on the same compound semiconductor epitaxial substrate is capable of reducing the component size, optimizing the impedance matching, and reducing the signal loss between power amplifier and acoustic wave device.

34 Claims, 39 Drawing Sheets

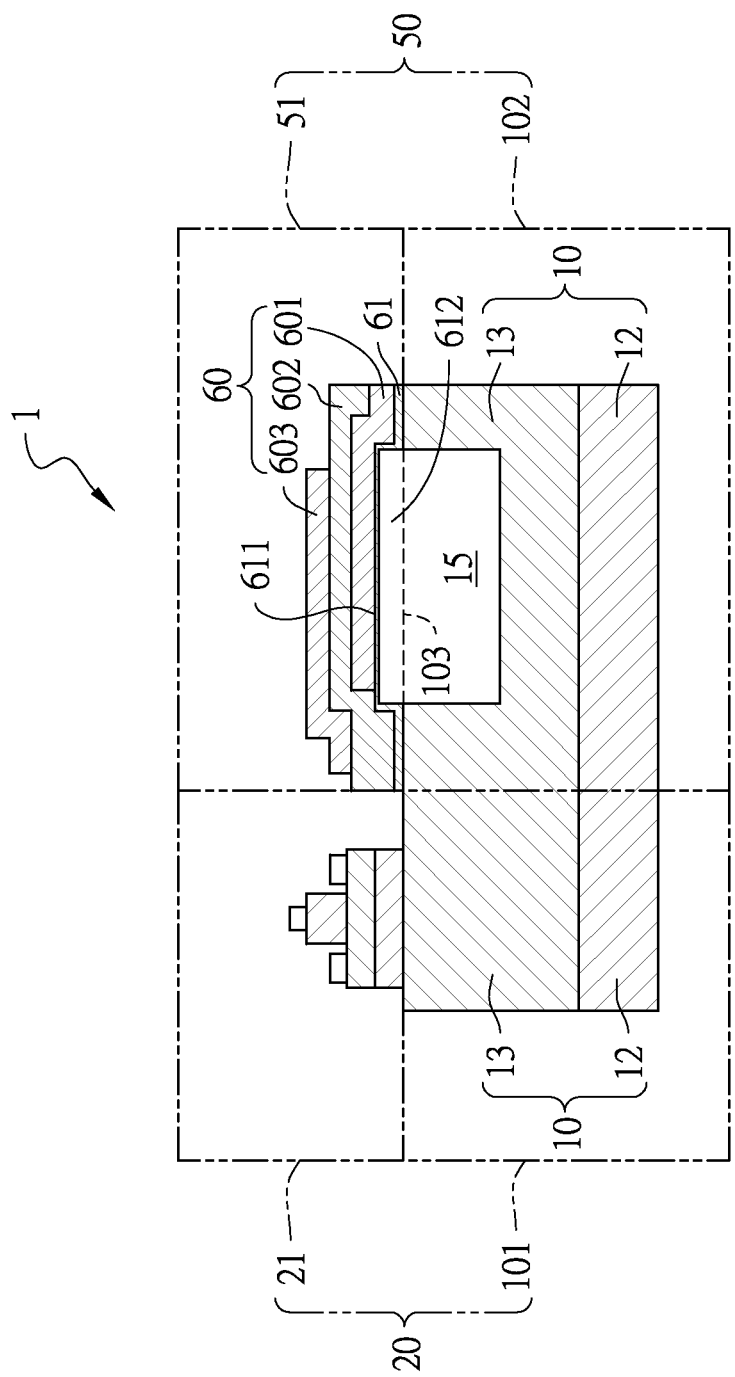

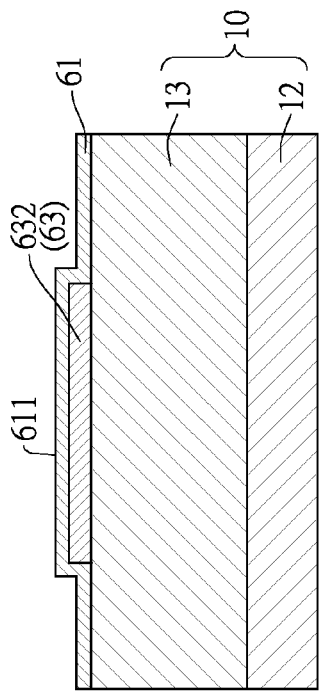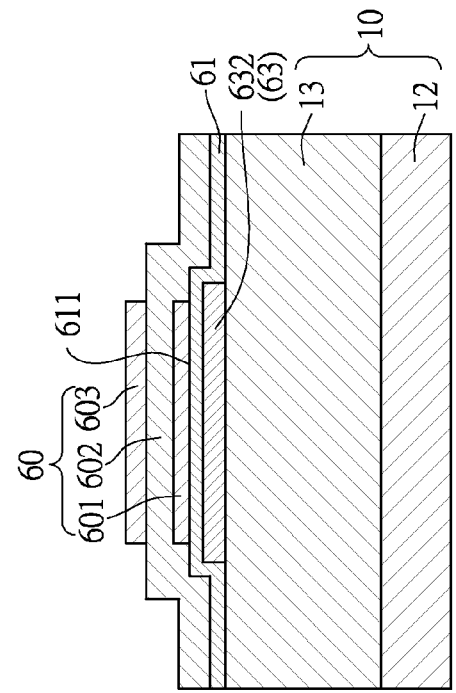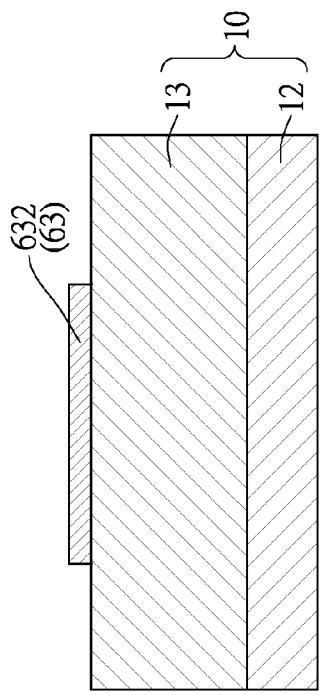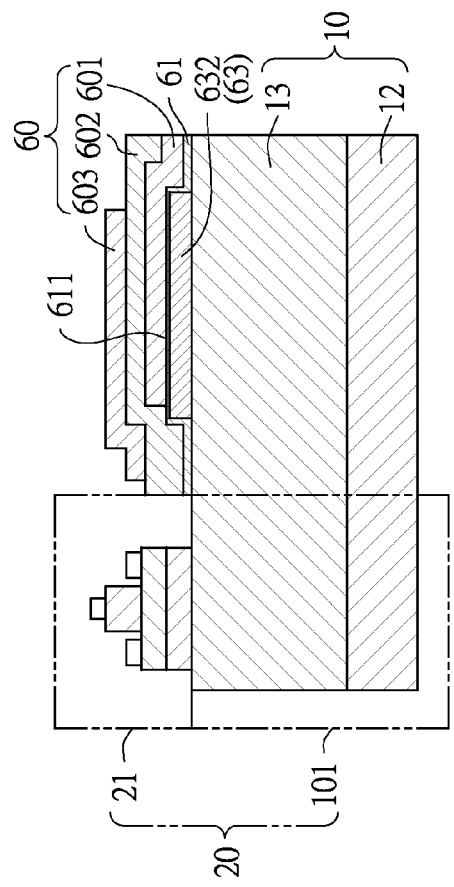

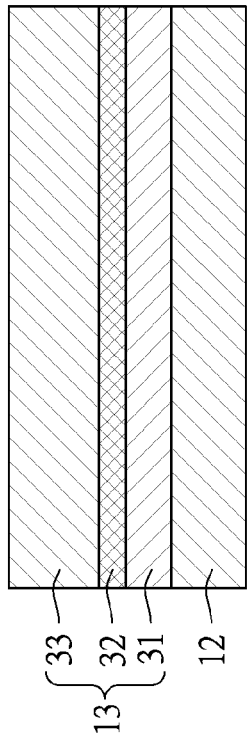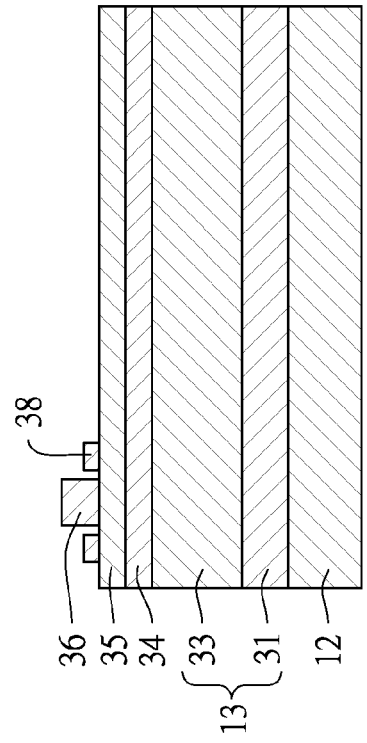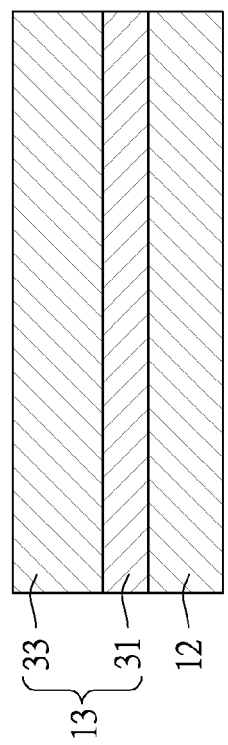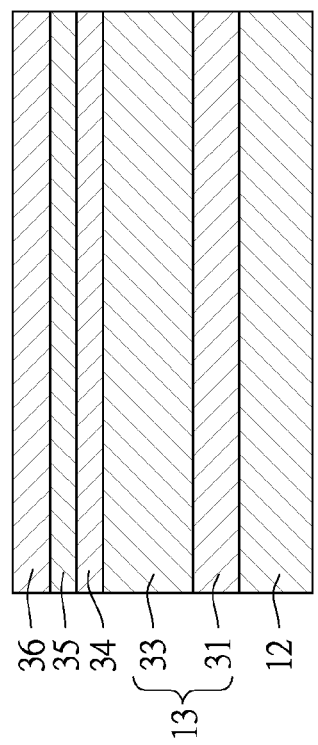

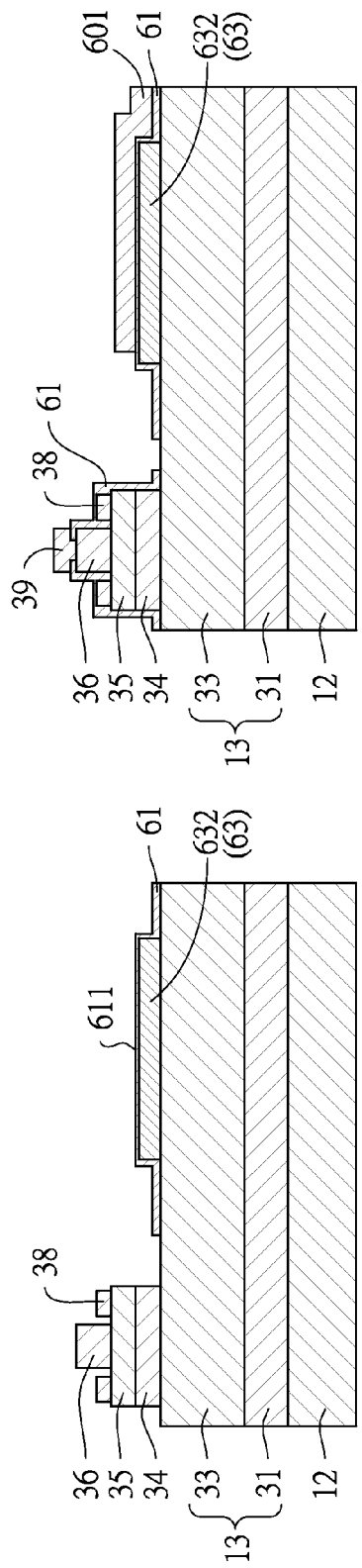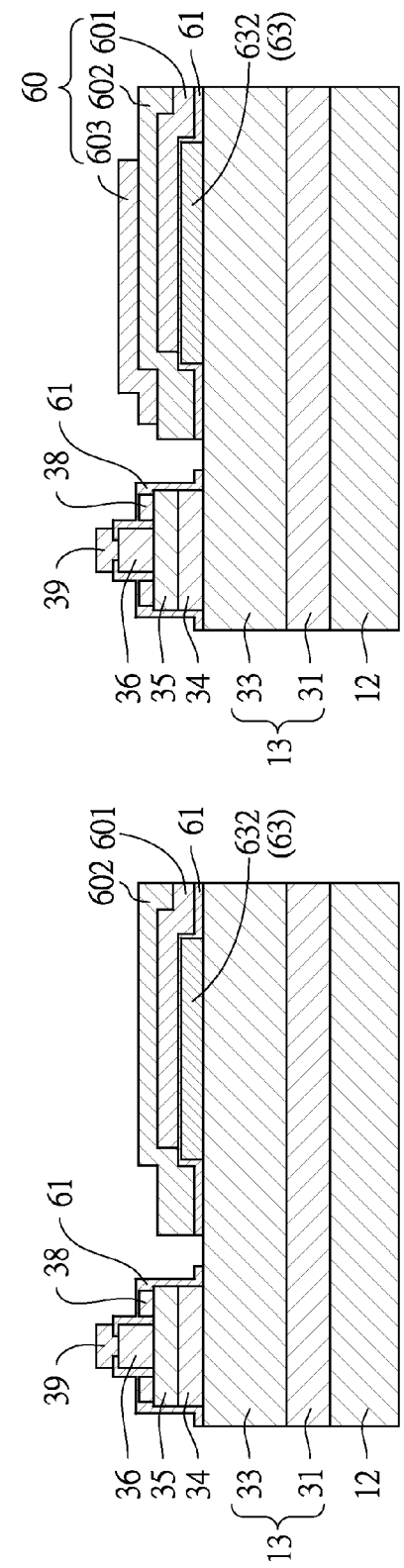

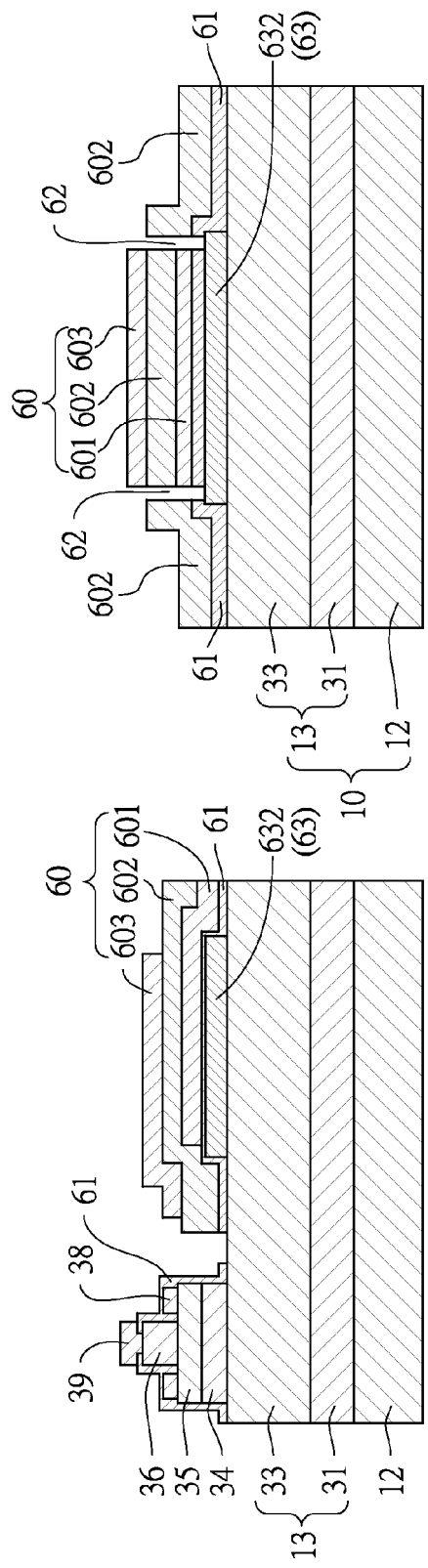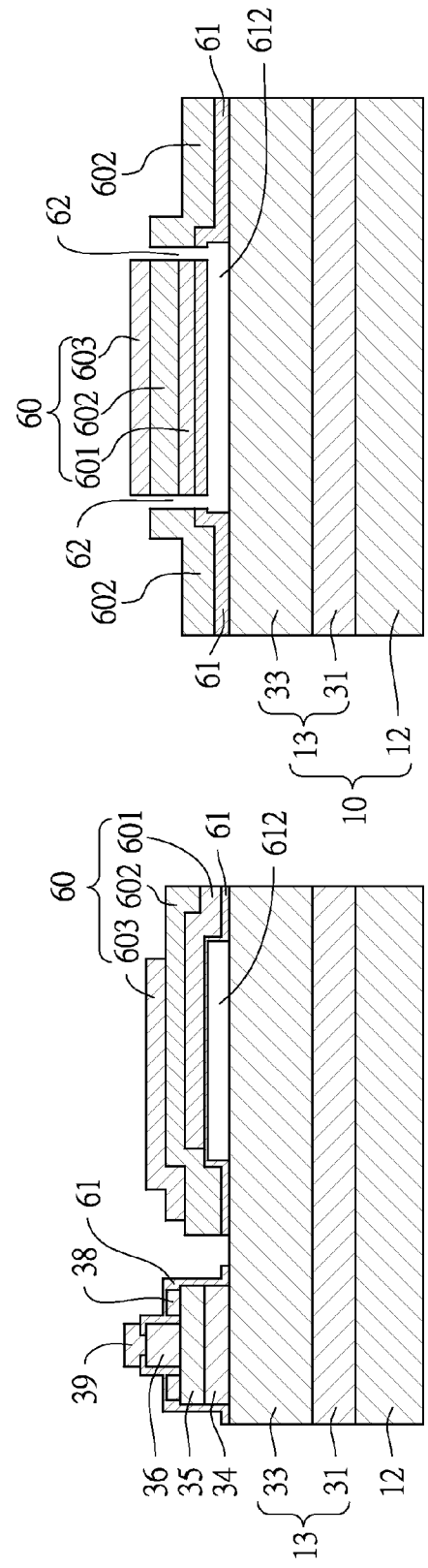

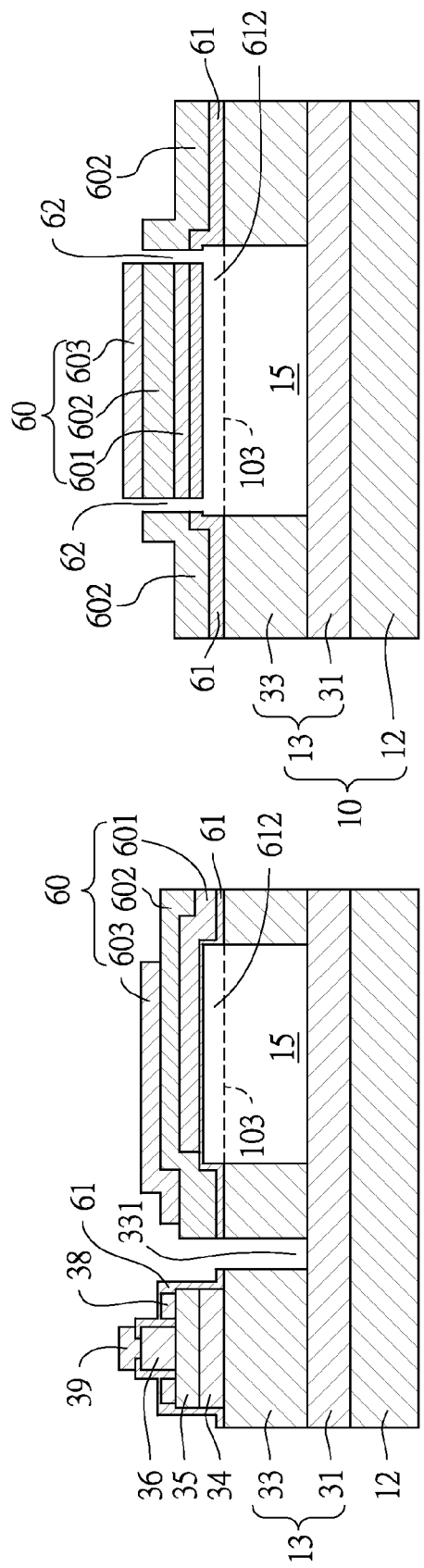

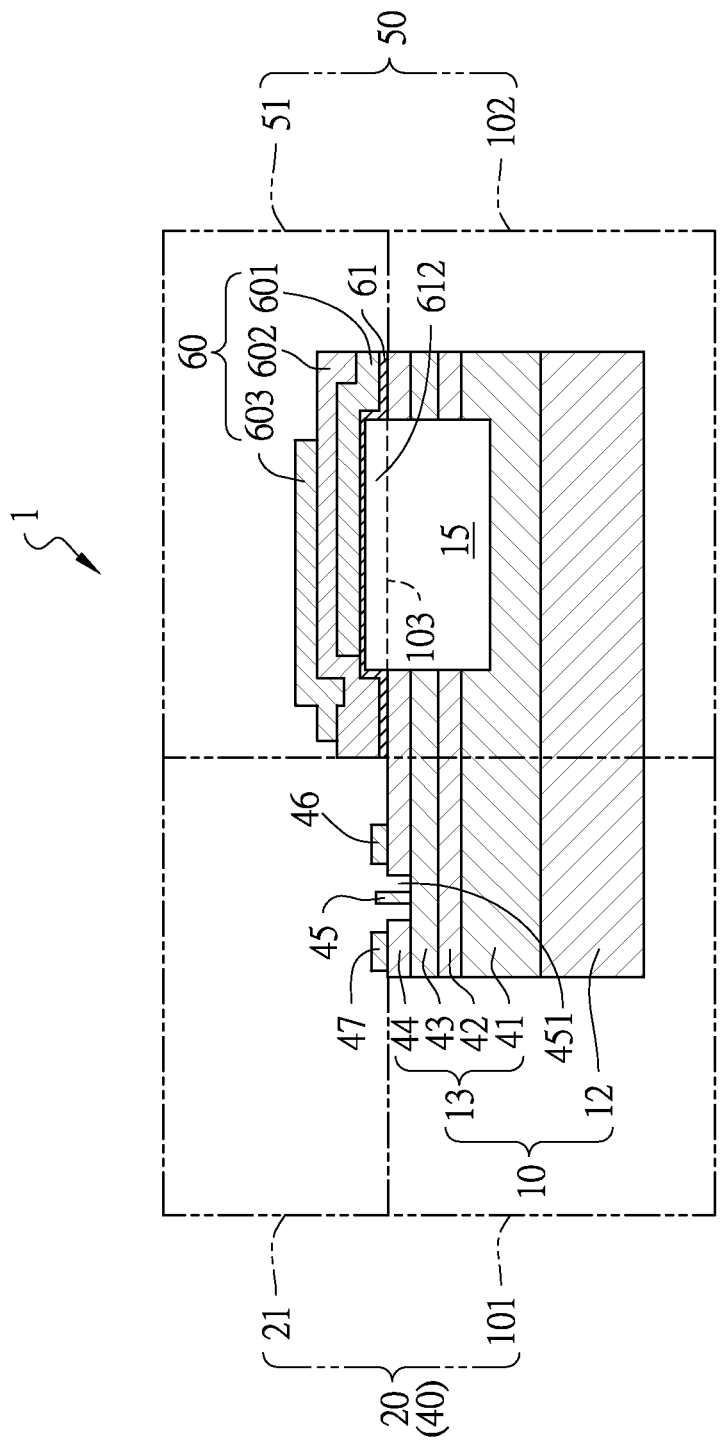

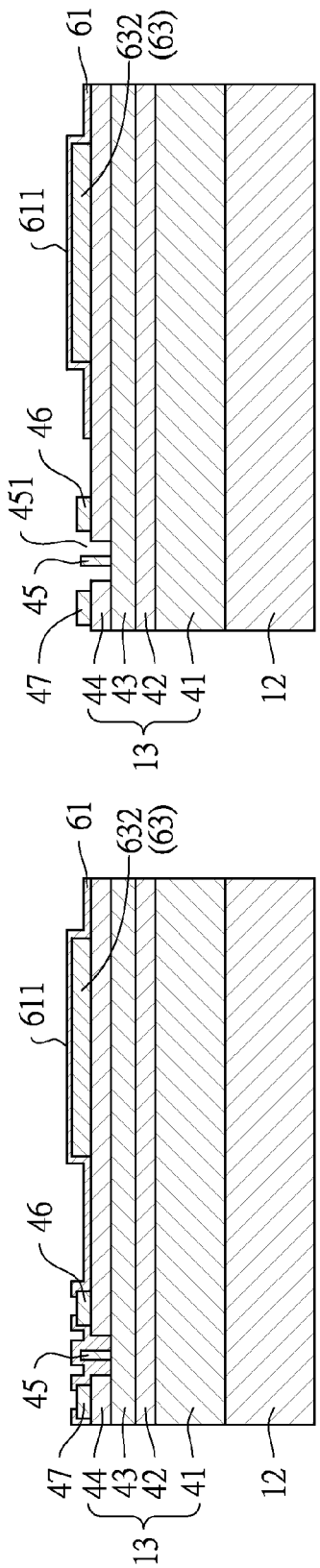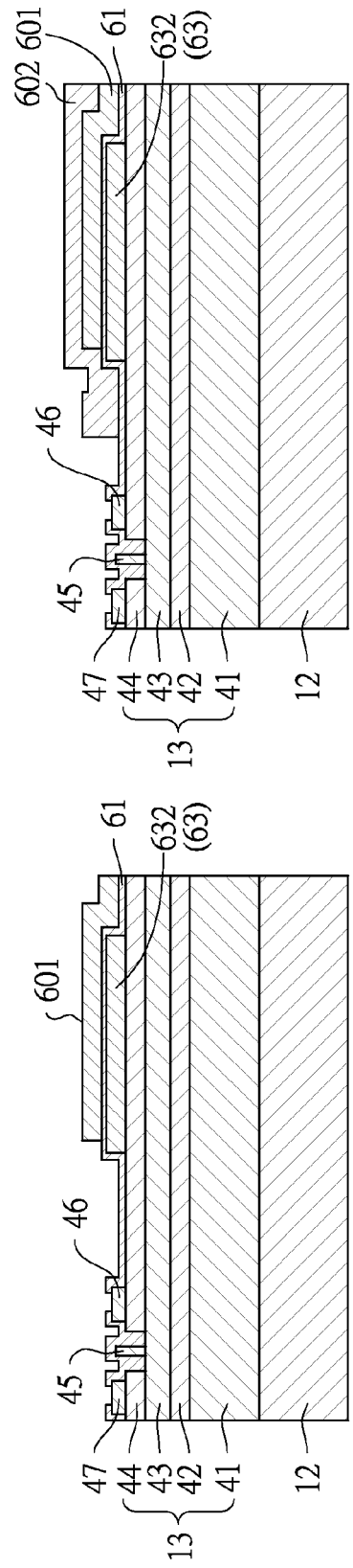
Fig. 3H  Fig. 3I  Fig. 3J  Fig. 3K

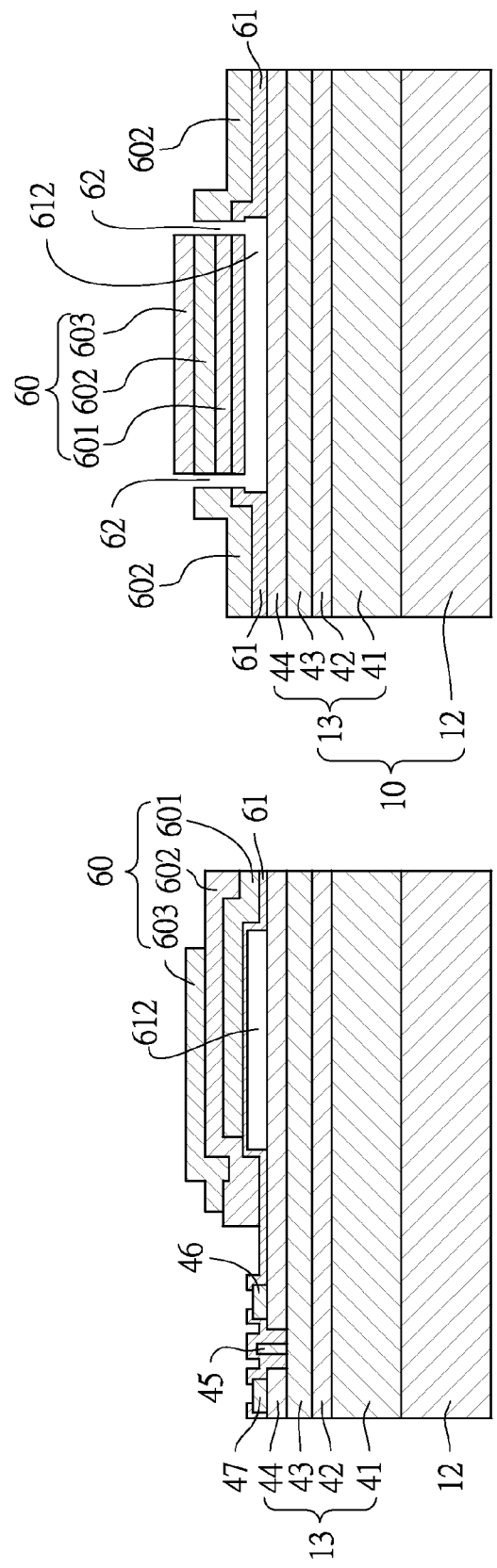

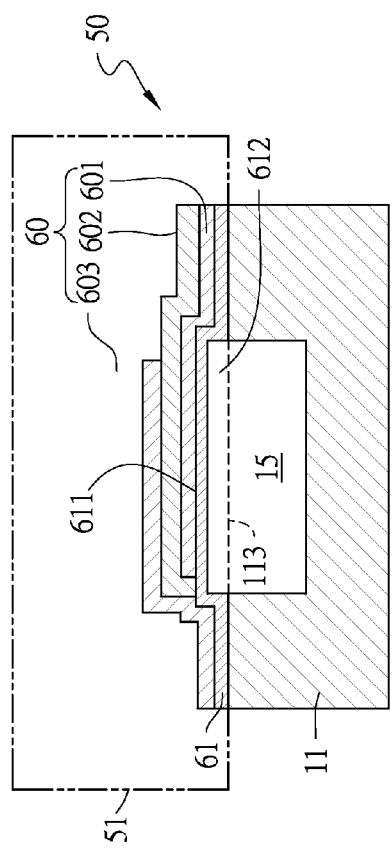
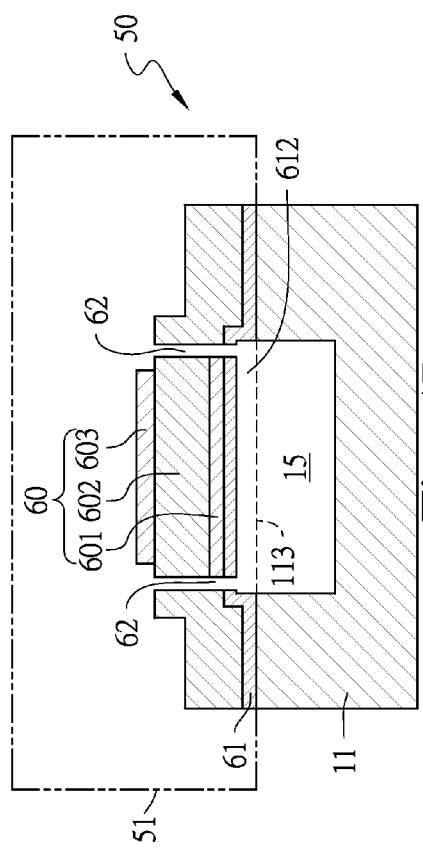
Fig. 4A
Fig. 4B

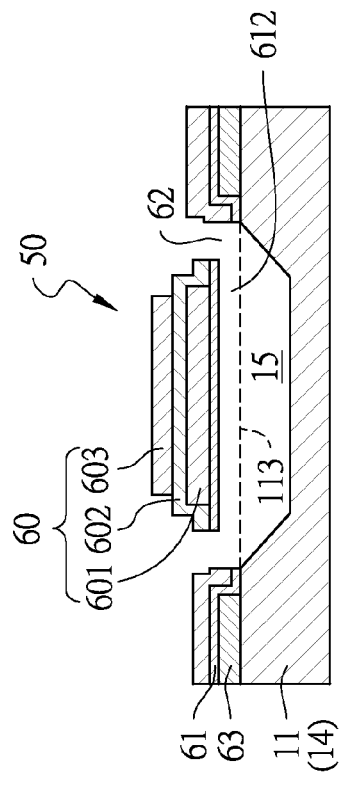
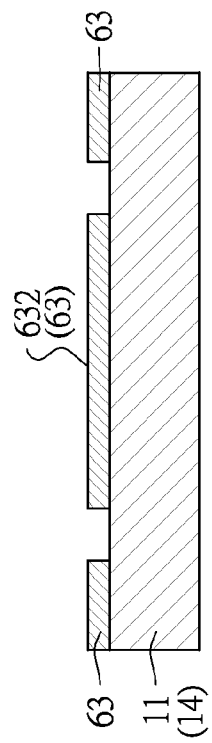
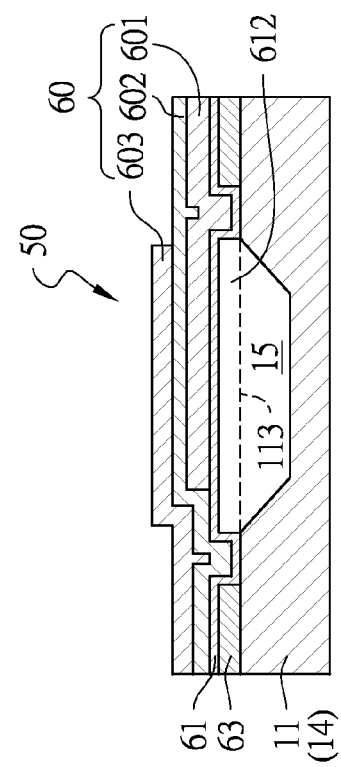
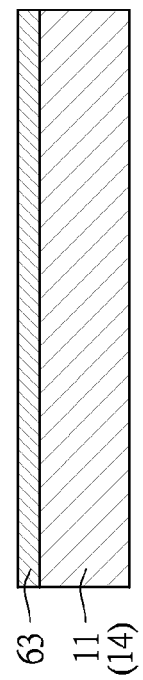
Fig. 6
Fig. 6A
Fig. 6B
Fig. 6C

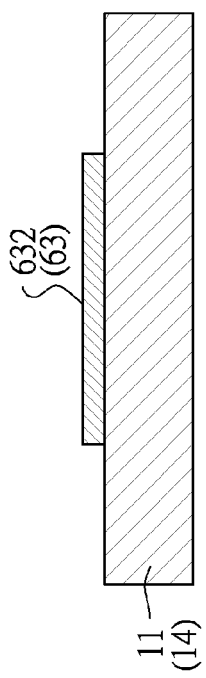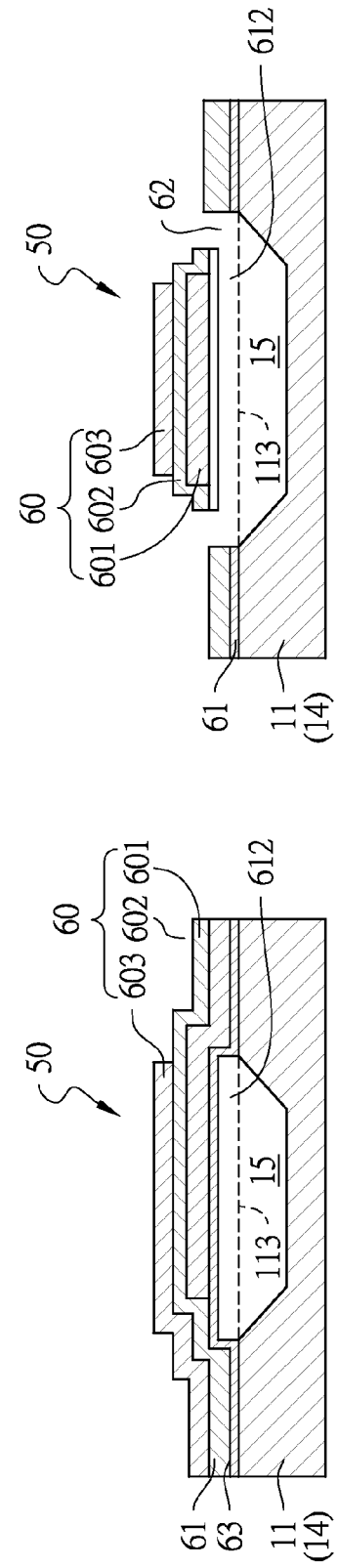

US 9,653,516 B2

ACOUSTIC WAVE DEVICE STRUCTURE, INTEGRATED STRUCTURE OF POWER AMPLIFIER AND ACOUSTIC WAVE DEVICE, AND FABRICATION METHODS THEREOF

FIELD OF THE INVENTION

The present invention relates to an integrated structure of power amplifier and acoustic wave device, wherein the integrated structure of the power amplifier and the acoustic wave device on the same compound semiconductor epitaxial substrate is capable of reducing the component size, optimizing the impedance matching, and reducing the signal loss between the power amplifier and the acoustic wave device.

BACKGROUND OF THE INVENTION

Please refer to FIG. 7-7D, which are the schematics of conventional production processes of acoustic wave device. First, forming a recess 702 on a silicon substrate 701; then forming a protection layer 703 on the silicon substrate 701 and the recess 702; and then forming a phosphosilicate glass (PSG) layer 705 on the protection layer 703 such that the phosphosilicate glass (PSG) layer 705 at least filled the recess 702; then polishing to remove the phosphosilicate glass (PSG) layer 705 outside the recess 702 by chemical mechanical polishing (CMP). Forming an acoustic wave device 710 with metal 711—insulator 712—metal 713 structure above the recess 702 such that the two ends of the acoustic wave device 710 with metal 711—insulator 712—metal 713 structure across outside of the recess 702; removing the rest of the phosphosilicate glass (PSG) layer 705 within the recess 702 such that the recess 702 forms a cavity.

Conventional technical producing the acoustic wave device needs to apply chemical mechanical polishing (CMP) technique for polishing to remove the phosphosilicate glass (PSG) layer 705 outside the recess 702. Furthermore the polishing requires fine polishing such that the roughness of polished surface is very smooth. Otherwise, the formation of the acoustic wave device 710 with metal 711—insulator 712—metal 713 structure will be influenced by the roughness of the polished surface. However the fine polished surface requirement for chemical mechanical polishing (CMP) process, not only the cost of the equipment is very expensive but also the time consuming and the materials cost are very high, such that the cost of production is too high.

Furthermore, the design of the single recess 702 has the problem that the gap between the bottom of the acoustic wave device 710 and the bottom of the recess 702 cannot efficiently widen. Hence, when the acoustic wave device 710 is affected by stress such that the acoustic wave device 710 is bended downwardly, the bottom of the acoustic wave device 710 may easily contact with the bottom of the recess 702 such that the characteristics of the acoustic wave device 710 been affected.

On the other hand, the application of the acoustic wave device 710 is often used as a radio frequency signal filter. When the application is with the power amplifier, the acoustic wave device plays a role to filter the signal firstly and then transmits the filtered signal to the power amplifier; or the power amplifier amplifies the signal firstly and then transmits the amplified signal to the acoustic wave device for filtering. However, the conventional acoustic wave device design is usually based on the silicon substrate. There is no one who ever tries to integrate the acoustic wave device with the compound semiconductor power amplifier on the same compound semiconductor epitaxial substrate. Integrating the acoustic wave device and the power amplifier on the same compound semiconductor epitaxial substrate may reduce the component size, and optimize the impedance matching, and reduce the signal loss between the power amplifier and the acoustic wave device.

Accordingly, the inventor has developed the design which may effectively widen the gap between the bottom of the acoustic wave device and the bottom of the recess, also may integrate the acoustic wave device and the power amplifier on the same compound semiconductor epitaxial substrate with the above mentioned benefits, the advantage of low cost, and with reduced component size, the optimized impedance matching, and the reduced signal loss between the power amplifier and the acoustic wave device.

SUMMARY OF THE INVENTION

There are two technical problems the present invention desires to solve: 1. How to provide a design which may effectively widen the gap between the bottom of the acoustic wave device and the bottom of the recess? 2. How to integrate the acoustic wave device and the power amplifier on the same compound semiconductor epitaxial substrate such that the component size is reduced, the impedance matching is optimized, and the signal loss between the power amplifier and the acoustic wave device is reduced?

To solve the above technical problems to achieve the expected effect, the present invention provides an integrated structure of power amplifier and acoustic wave device, which comprises: a compound semiconductor epitaxial substrate, a power amplifier upper structure and a film bulk acoustic resonator; wherein said compound semiconductor epitaxial substrate includes a compound semiconductor substrate and an epitaxial structure formed on said compound semiconductor substrate; said power amplifier upper structure is formed on a first side of said compound semiconductor epitaxial substrate, wherein said first side of said compound semiconductor epitaxial substrate and said power amplifier upper structure form a power amplifier; said film bulk acoustic resonator is formed on a second side of said compound semiconductor epitaxial substrate, wherein said second side of said compound semiconductor epitaxial substrate and said film bulk acoustic resonator form an acoustic wave device; wherein, the integrated structure of said power amplifier and said acoustic wave device on the same said compound semiconductor epitaxial substrate is capable of reducing the component size, optimizing the impedance matching, and reducing the signal loss between said power amplifier and said acoustic wave device.

In an embodiment, said compound semiconductor substrate is made of GaAs, SiC, InP, GaN, AlN or Sapphire.

In an embodiment, said film bulk acoustic resonator comprises: a supporting layer and a bulk acoustic resonator structure; wherein said supporting layer is formed on said compound semiconductor epitaxial substrate, wherein said supporting layer has a supporting layer recess on the bottom of said supporting layer, said supporting layer has an upwardly protruding supporting layer mesa right above said supporting layer recess, and wherein said compound semiconductor epitaxial substrate has a substrate recess on the top of said compound semiconductor epitaxial substrate, said substrate recess is located right below said supporting layer recess, said supporting layer recess is communicated with said substrate recess, and said supporting layer recess and said substrate recess have a boundary therebetween and the boundary is the extended from the top surface of said compound semiconductor epitaxial substrate; wherein said bulk acoustic resonator structure is formed on said supporting layer, said bulk acoustic resonator structure includes: a bottom electrode, a dielectric layer and a top electrode; wherein said bottom electrode is formed on one end of said supporting layer, where said bottom electrode is formed on and at least extended along said supporting layer mesa; wherein said dielectric layer is formed at least on said bottom electrode above said supporting layer mesa; wherein said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa; wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly.

In an embodiment, said supporting layer recess has a depth between 10 nm and 3500 nm.

In an embodiment, the optimized depth of said supporting layer recess is between 10 nm and 1500 nm.

In an embodiment, said supporting layer recess has an opening smaller than or almost equal to that of said substrate recess.

In an embodiment, said film bulk acoustic resonator further comprises at least one etching recess, one end of said at least one etching recess is communicated with said supporting layer recess, the other end of said at least one etching recess penetrates said supporting layer or penetrates both said supporting layer and said bulk acoustic resonator structure such that said at least one etching recess is communicated with the outside, and thereby said supporting layer recess is communicated with the outside.

In an embodiment, said power amplifier is a heterojunction bipolar transistor (HBT).

In an embodiment, said epitaxial structure includes: a subcollector layer and a collector layer; wherein said subcollector layer is formed on said compound semiconductor substrate; said collector layer is formed on said subcollector layer.

In an embodiment, said substrate recess is peripherally surrounded by said collector layer, and the bottom of said substrate recess is said subcollector layer.

In an embodiment, said collector layer is made of GaAs.

In an embodiment, said collector layer has a thickness between 500 nm and 3000 nm.

In an embodiment, said first side of said compound semiconductor epitaxial substrate further comprises a collector recess, the bottom of said collector recess is said subcollector layer, and wherein said power amplifier upper structure includes: a base layer, an emitter ledge layer, an emitter layer, a base electrode, an emitter electrode and a collector electrode; wherein said base layer is formed on said collector layer; said emitter ledge layer is formed on said base layer; said emitter layer is formed on said emitter ledge layer; said base electrode is formed on said base layer and/or said emitter ledge layer; said emitter electrode is formed on said emitter layer; said collector electrode is formed on said subcollector layer within said collector recess; thereby said first side of said compound semiconductor epitaxial substrate includes: said compound semiconductor substrate, said subcollector layer, said collector layer and said collector recess; wherein said first side of said compound semiconductor epitaxial substrate and said power amplifier upper structure form said heterojunction bipolar transistor.

In an embodiment, said base layer is made of GaAs.

In an embodiment, said base layer has a thickness between 60 nm and 100 nm.

In an embodiment, said epitaxial structure further comprises an etching stop layer, wherein said etching stop layer is formed on said subcollector layer, and said collector layer is formed on said etching stop layer, wherein the bottom of said collector recess is said subcollector layer, said collector electrode is formed on said subcollector layer within said collector recess.

In an embodiment, said substrate recess is peripherally surrounded by said collector layer and said etching stop layer, and the bottom of said substrate recess is said subcollector layer.

In an embodiment, said etching stop layer is made of InGaP.

In an embodiment, said etching stop layer has a thickness between 5 nm and 1000 nm.

In an embodiment, the optimized thickness of said etching stop layer is 20 nm.

In an embodiment, said power amplifier is a field effect transistor (FET), a high electron mobility transistor (HEMT) or a pseudomorphic high electron mobility transistor (pHEMT).

In an embodiment, said epitaxial structure includes: a buffer layer, a channel layer, a Schottky layer and a cap layer; wherein said buffer layer is formed on said compound semiconductor substrate; said channel layer is formed on said buffer layer; said Schottky layer is formed on said channel layer; said cap layer is formed on said Schottky layer.

In an embodiment, the bottom of said substrate recess is said buffer layer, and said substrate recess is peripherally surrounded by said channel layer, said Schottky layer and said cap layer or by said buffer layer, said channel layer, said Schottky layer and said cap layer.

In an embodiment, said first side of said compound semiconductor epitaxial substrate further comprises a gate recess; the bottom of said gate recess is said Schottky layer; and wherein said power amplifier upper structure includes: a drain electrode, a source electrode and a gate electrode; wherein said drain electrode is formed on one end of said cap layer; said source electrode is formed on the other end of said cap layer, wherein said gate recess is located between said drain electrode and said source electrode; said gate electrode is formed on said Schottky layer within said gate recess; thereby said first side of said compound semiconductor epitaxial substrate includes: said compound semiconductor substrate, said buffer layer, said channel layer, said Schottky layer, said cap layer and said gate recess; wherein said first side of said compound semiconductor epitaxial substrate and said power amplifier upper structure form said pseudomorphic high electron mobility transistor.

In addition, the present invention also provides a fabrication method for integrated structure of power amplifier and acoustic wave device, which comprises following steps of: forming an epitaxial structure on a compound semiconductor substrate to form a compound semiconductor epitaxial substrate, wherein said compound semiconductor epitaxial substrate includes said epitaxial structure and said compound semiconductor substrate; forming a power amplifier upper structure on a first side of said compound semiconductor epitaxial substrate to form a power amplifier, wherein said power amplifier is made of said first side of said compound semiconductor epitaxial substrate and said power amplifier upper structure; and forming a film bulk acoustic resonator on a second side of said compound semiconductor epitaxial substrate to form an acoustic wave device, wherein said acoustic wave device is made of said second side of said compound semiconductor epitaxial substrate and said film bulk acoustic resonator; wherein, the integrated structure of said power amplifier and said acoustic wave device on the same said compound semiconductor epitaxial substrate is capable of reducing the component size, optimizing the impedance matching, and reducing the signal loss between said power amplifier and said acoustic wave device.

In an embodiment, said compound semiconductor substrate is made of GaAs, SiC, InP, GaN, AlN or Sapphire.

In an embodiment, forming said film bulk acoustic resonator on said second side of said compound semiconductor epitaxial substrate includes following steps of: forming a top sacrificial layer on said compound semiconductor epitaxial substrate; defining a top sacrificial layer etching area, and etching to remove said top sacrificial layer within said top sacrificial layer etching area to form a top sacrificial layer mesa, such that said compound semiconductor epitaxial substrate within said top sacrificial layer etching area is exposed; forming a supporting layer on said top sacrificial layer and said compound semiconductor epitaxial substrate, wherein said supporting layer has a supporting layer mesa right above said top sacrificial layer mesa; forming a bulk acoustic resonator structure on said supporting layer, which includes following steps of: forming a bottom electrode on one end of said supporting layer, where said bottom electrode is formed on and at least extended along said supporting layer mesa; forming a dielectric layer, wherein said dielectric layer is formed at least on said bottom electrode above said supporting layer mesa; and forming a top electrode, wherein said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa; defining at least one recess etching area, and etching to remove said supporting layer within said at least one recess etching area or etching to remove said supporting layer and said bulk acoustic resonator structure within said at least one recess etching area such that the etching stops at said top sacrificial layer mesa and/or said compound semiconductor epitaxial substrate to form at least one etching recess, thereby part of said top sacrificial layer mesa is exposed; etching to remove said top sacrificial layer mesa to form a supporting layer recess, wherein at least one top sacrificial layer etching solution contacts with said top sacrificial layer mesa via said at least one etching recess and etches to remove said top sacrificial layer mesa, thereby the top and the bottom of said supporting layer recess are said supporting layer and said compound semiconductor epitaxial substrate respectively; and etching to remove part of said compound semiconductor epitaxial substrate below said supporting layer recess to form a substrate recess, wherein the bottom of said substrate recess is said compound semiconductor epitaxial substrate, wherein at least one substrate recess etching solution contacts with the top surface of said compound semiconductor epitaxial substrate via said at least one etching recess and said supporting layer recess, said at least one substrate recess etching solution is uniformly distributed on the top surface of said compound semiconductor epitaxial substrate through said supporting layer recess so as to uniformly etch part of said compound semiconductor epitaxial substrate below said supporting layer recess to form said substrate recess, and thereby prevents the side etching phenomenon during the etching, wherein said supporting layer recess is communicated with said substrate recess, and said supporting layer recess and said substrate recess have a boundary therebetween and the boundary is the extended from the top surface of said compound semiconductor epitaxial substrate, wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly.

In an embodiment, said top sacrificial layer is made of AlAs or TiW.

In an embodiment, said top sacrificial layer has a thickness between 10 nm and 3500 nm.

In an embodiment, the optimized thickness of said top sacrificial layer is between 10 nm and 1500 nm.

In an embodiment, said supporting layer recess has an opening smaller than or almost equal to that of said substrate recess.

In an embodiment, said power amplifier is a heterojunction bipolar transistor (HBT).

In an embodiment, forming said epitaxial structure on said compound semiconductor substrate includes following steps of: forming a subcollector layer on said compound semiconductor substrate; and forming a collector layer on said subcollector layer.

In an embodiment, said substrate recess is peripherally surrounded by said collector layer, and the bottom of said substrate recess is said subcollector layer.

In an embodiment, said collector layer is made of GaAs.

In an embodiment, said collector layer has a thickness between 500 nm and 3000 nm.

In an embodiment, forming said power amplifier upper structure on said first side of said compound semiconductor epitaxial substrate includes following steps of: forming a base layer on said collector layer; forming an emitter ledge layer on said base layer; forming an emitter layer on said emitter ledge layer; defining an emitter layer etching area, and etching to remove said emitter layer within said emitter layer etching area; defining an emitter ledge layer etching area, and etching to remove said emitter ledge layer within said emitter ledge layer etching area; forming a base electrode on said base layer and/or said emitter ledge layer; defining a base layer etching area, and etching to remove said base layer within said base layer etching area; forming an emitter electrode on said emitter layer; defining a collector electrode etching area, and etching to remove said collector layer within said collector electrode etching area such that the etching stops at said subcollector layer to form a collector recess, thereby said subcollector layer within said collector recess is exposed; and forming a collector electrode on said subcollector layer within said collector recess; thereby said first side of said compound semiconductor epitaxial substrate includes: said compound semiconductor substrate, said subcollector layer, said collector layer and said collector recess; said power amplifier upper structure includes: said base layer, said emitter ledge layer, said emitter layer, said base electrode, said emitter electrode and said collector electrode; wherein said first side of said compound semiconductor epitaxial substrate and said power amplifier upper structure form said heterojunction bipolar transistor.

In an embodiment, said base layer is made of GaAs.

In an embodiment, said base layer has a thickness between 60 nm and 100 nm.

In an embodiment, the fabrication method for integrated structure of power amplifier and acoustic wave device further comprises a step of forming an etching stop layer on said subcollector layer, and a step of etching to remove said etching stop layer within said collector electrode etching area; wherein forming said etching stop layer on said subcollector layer and then forming said collector layer on said etching stop layer such that said epitaxial structure includes: said subcollector layer, said etching stop layer and said collector layer; and wherein etching to remove said etching stop layer within said collector electrode etching area such that the etching stops at said subcollector layer to form said collector recess, and thereby said subcollector layer within said collector recess is exposed; wherein said the bottom of said substrate recess is said etching stop layer; thereby said first side of said compound semiconductor epitaxial substrate includes: said compound semiconductor substrate, said subcollector layer, said etching stop layer, said collector layer and said collector recess; said power amplifier upper structure includes: said base layer, said emitter ledge layer, said emitter layer, said base electrode, said emitter electrode and said collector electrode; wherein said first side of said compound semiconductor epitaxial substrate and said power amplifier upper structure form said heterojunction bipolar transistor.

In an embodiment, the fabrication method for integrated structure of power amplifier and acoustic wave device further comprises a step of etching to remove said etching stop layer below the bottom of said substrate recess such that said substrate recess is peripherally surrounded by said collector layer and said etching stop layer, and the bottom of said substrate recess is said subcollector layer.

In an embodiment, said etching stop layer is made of InGaP.

In an embodiment, said etching stop layer has a thickness between 5 nm and 1000 nm.

In an embodiment, the optimized thickness of said etching stop layer is 20 nm.

In an embodiment, said power amplifier is a field effect transistor (FET), a high electron mobility transistor (HEMT) or a pseudomorphic high electron mobility transistor (pHEMT).

In an embodiment, forming said epitaxial structure on said compound semiconductor substrate includes following steps of: forming a buffer layer on said compound semiconductor substrate; forming a channel layer on said buffer layer; forming a Schottky layer on said channel layer; and forming a cap layer on said Schottky layer.

In an embodiment, the bottom of said substrate recess is said buffer layer, and said substrate recess is peripherally surrounded by said channel layer, said Schottky layer and said cap layer or by said buffer layer, said channel layer, said Schottky layer and said cap layer.

In an embodiment, forming said power amplifier upper structure on said first side of said compound semiconductor epitaxial substrate includes following steps of: defining a gate electrode etching area, and etching to remove said cap layer within said gate electrode etching area such that the etching stops at said Schottky layer to form a gate recess, thereby said Schottky layer within said gate recess is exposed; forming a drain electrode on one end of said cap layer; forming a source electrode on the other end of said cap layer, wherein said gate recess is located between said drain electrode and said source electrode; and forming a gate electrode on said Schottky layer within said gate recess; thereby said first side of said compound semiconductor epitaxial substrate includes: said compound semiconductor substrate, said buffer layer, said channel layer, said Schottky layer, said cap layer and said gate recess; said power amplifier upper structure includes: said drain electrode, said source electrode and said gate electrode; wherein said first side of said compound semiconductor epitaxial substrate and said power amplifier upper structure form said pseudomorphic high electron mobility transistor.

In addition, the present invention further provides an improved acoustic wave device structure, which comprises: a substrate and a film bulk acoustic resonator; wherein said substrate has a substrate recess on the top of said substrate; said film bulk acoustic resonator formed on said substrate, wherein said film bulk acoustic resonator includes: a supporting layer and a bulk acoustic resonator structure; wherein said supporting layer is formed on said substrate, wherein said supporting layer has a supporting layer recess on the bottom of said supporting layer, said supporting layer has an upwardly protruding supporting layer mesa right above said supporting layer recess, and said supporting layer recess is located right above said substrate recess, said supporting layer recess is communicated with said substrate recess, and said supporting layer recess and said substrate recess have a boundary therebetween and the boundary is the extended from the top surface of said substrate; bulk acoustic resonator structure is formed on said supporting layer, wherein said bulk acoustic resonator structure includes: a bottom electrode, a dielectric layer and a top electrode; wherein said bottom electrode is formed on one end of said supporting layer, where said bottom electrode is formed on and at least extended along said supporting layer mesa; said dielectric layer is formed at least on said bottom electrode above said supporting layer mesa; said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa; wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly.

In an embodiment, said film bulk acoustic resonator further comprises at least one etching recess, one end of said at least one etching recess is communicated with said supporting layer recess, the other end of said at least one etching recess penetrates said supporting layer or penetrates both said supporting layer and said bulk acoustic resonator structure such that said at least one etching recess is communicated with the outside, and thereby said supporting layer recess is communicated with the outside.

In an embodiment, said supporting layer recess has an opening smaller than or almost equal to that of said substrate recess.

In an embodiment, said substrate includes a base substrate and an epitaxial structure formed on said base substrate.

In an embodiment, said base substrate is made of GaAs, SiC, InP, GaN, AlN, Sapphire, Si or glass.

In an embodiment, said epitaxial structure includes: a buffer layer, an etching stop layer and a bottom sacrificial layer; wherein said buffer layer is formed on said base substrate; said etching stop layer is formed on said buffer layer; said bottom sacrificial layer is formed on said etching stop layer; wherein said substrate recess is peripherally surrounded by said bottom sacrificial layer, and the bottom of said substrate recess is said etching stop layer.

In an embodiment, said bottom sacrificial layer is made of GaAs.

In an embodiment, said bottom sacrificial layer has a thickness between 500 nm and 3000 nm.

In an embodiment, said etching stop layer is made of InGaP.

In an embodiment, said etching stop layer has a thickness between 5 nm and 1000 nm.

In an embodiment, the optimized thickness of said etching stop layer is 20 nm.

In an embodiment, said substrate is made of a silicon substrate.

In an embodiment, said supporting layer recess has a depth between 10 nm and 2500 nm.

In an embodiment, the optimized depth of said supporting layer recess is between 10 nm and 50 nm.

In addition, the present invention also provides a fabrication method for improved acoustic wave device structure, which comprises following steps of: forming a film bulk acoustic resonator on a substrate, which includes following steps of: forming a top sacrificial layer on said substrate; defining a top sacrificial layer etching area, and etching to remove said top sacrificial layer within said top sacrificial layer etching area to form a top sacrificial layer mesa, such that said substrate within said top sacrificial layer etching area is exposed; forming a supporting layer on said top sacrificial layer and said substrate, wherein said supporting layer has a supporting layer mesa right above said top sacrificial layer mesa; forming a bulk acoustic resonator structure on said supporting layer, which includes following steps of: forming a bottom electrode on one end of said supporting layer, where said bottom electrode is formed on and at least extended along said supporting layer mesa; forming a dielectric layer, wherein said dielectric layer is formed at least on said bottom electrode above said supporting layer mesa; and forming a top electrode, wherein said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa; defining at least one recess etching area, and etching to remove said supporting layer within said at least one recess etching area or etching to remove said supporting layer and said bulk acoustic resonator structure within said at least one recess etching area such that the etching stops at said top sacrificial layer mesa and/or said substrate to form at least one etching recess, thereby part of said top sacrificial layer mesa is exposed; etching to remove said top sacrificial layer mesa to form a supporting layer recess, wherein at least one top sacrificial layer etching solution contacts with said top sacrificial layer mesa via said at least one etching recess and etches to remove said top sacrificial layer mesa, thereby the top and the bottom of said supporting layer recess are said supporting layer and said substrate respectively; and etching to remove part of said substrate below said supporting layer recess to form a substrate recess, wherein the bottom of said substrate recess is said substrate, wherein at least one substrate recess etching solution contacts with the top surface of said substrate via said at least one etching recess and said supporting layer recess, said at least one substrate recess etching solution is uniformly distributed on the top surface of said substrate through said supporting layer recess so as to uniformly etch part of said substrate below said supporting layer recess to form said substrate recess, and thereby prevents the side etching phenomenon during the etching, wherein said supporting layer recess is communicated with said substrate recess, and said supporting layer recess and said substrate recess have a boundary therebetween and the boundary is the extended from the top surface of said substrate, wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly.

In an embodiment, said top sacrificial layer is made of AlAs or TiW.

In an embodiment, said top sacrificial layer has a thickness between 10 nm and 3500 nm.

In an embodiment, the optimized thickness of said top sacrificial layer is between 10 nm and 1500 nm.

In an embodiment, said supporting layer recess has an opening smaller than or almost equal to that of said substrate recess.

In an embodiment, said substrate includes a base substrate and an epitaxial structure formed on said base substrate.

In an embodiment, said base substrate is made of GaAs, SiC, InP, GaN, AlN, Sapphire, Si or glass.

In an embodiment, forming said epitaxial structure on said base substrate includes following steps of: forming a buffer layer on said base substrate; forming an etching stop layer on said buffer layer; and forming a bottom sacrificial layer on said etching stop layer; wherein said substrate recess is peripherally surrounded by said bottom sacrificial layer, and the bottom of said substrate recess is said etching stop layer.

In an embodiment, said bottom sacrificial layer is made of GaAs.

In an embodiment, said bottom sacrificial layer has a thickness between 500 nm and 3000 nm.

In an embodiment, said etching stop layer is made of InGaP.

In an embodiment, said etching stop layer has a thickness between 5 nm and 1000 nm.

In an embodiment, the optimized thickness of said etching stop layer is 20 nm.

In an embodiment, said substrate is made of a silicon substrate.

In an embodiment, said substrate is made of a silicon substrate, and said top sacrificial layer is made of TiW.

For further understanding the characteristics and effects of the present invention, some preferred embodiments referred to drawings are in detail described as follows.

BRIEF DESCRIPTION OF DRAWINGS

FIGS. 1 and 1A~1B are the cross-sectional views of embodiments of the integrated structure of power amplifier and acoustic wave device of the present invention.

FIG. 1C~1H are the cross-sectional schematics showing steps of a fabrication method for the embodiments of the integrated structure of power amplifier and acoustic wave device of the present invention.

FIGS. 3 and 3A~3C are the cross-sectional views of embodiments of the integrated structure of power amplifier and acoustic wave device of the present invention.

FIG. 3D~3O are the cross-sectional schematics showing steps of a fabrication method for the embodiments of the integrated structure of power amplifier and acoustic wave device of the present invention.

FIGS. 4 and 4A~4B are the cross-sectional views of embodiments of the improved acoustic wave device structure of the present invention.

FIGS. 6 and 6A are the cross-sectional views of an embodiment of the improved acoustic wave device structure of the present invention.

FIG. 6B~6L are the cross-sectional schematics showing steps of a fabrication method for the embodiments of the improved acoustic wave device structure of the present invention.

FIGS. 6M and 6N are the cross-sectional views of an embodiment of the improved acoustic wave device structure of the present invention.

DETAILED DESCRIPTION OF PREFERRED EMBODIMENTS

Figure 1A:
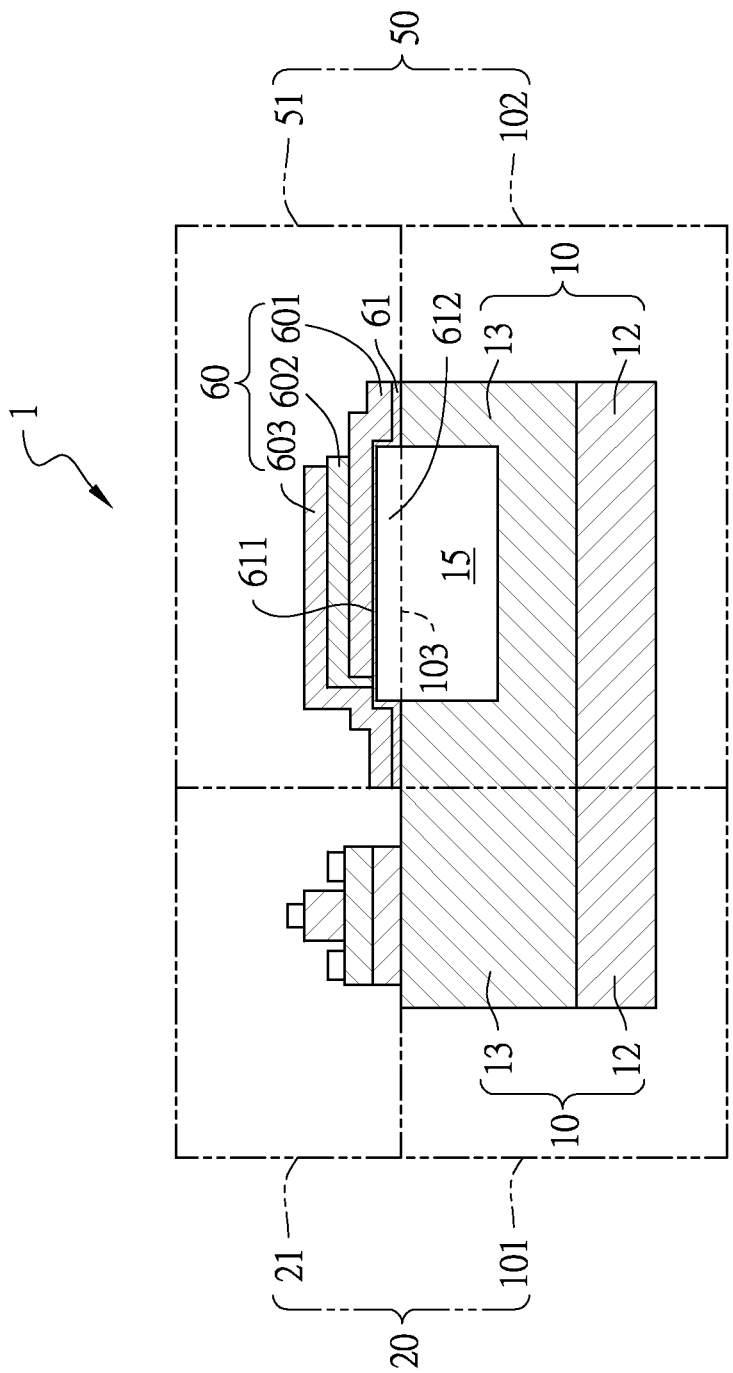

Please refer to FIG. 1, the cross-sectional view of an embodiment of the integrated structure of power amplifier and acoustic wave device of the present invention, the integrated structure comprises: a compound semiconductor epitaxial substrate 10, a power amplifier upper structure 21 and a film bulk acoustic resonator 51. The compound semiconductor epitaxial substrate 10 includes a compound semiconductor substrate 12 and an epitaxial structure 13 formed on the compound semiconductor substrate 12. The power amplifier upper structure 21 is formed on a first side 101 of the compound semiconductor epitaxial substrate 10, wherein the first side 101 of the compound semiconductor epitaxial substrate 10 and the power amplifier upper structure 21 form a power amplifier 20. The film bulk acoustic resonator 51 is formed on a second side 102 of the compound semiconductor epitaxial substrate 10, wherein the second side 102 of the compound semiconductor epitaxial substrate 10 and the film bulk acoustic resonator 51 form an acoustic wave device 50. The integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50.

The film bulk acoustic resonator 51 comprises: a supporting layer 61 and a bulk acoustic resonator structure 60. The supporting layer 61 is formed on the compound semiconductor epitaxial substrate 10, wherein the supporting layer 61 has a supporting layer recess 612 on the bottom of the supporting layer 61, and the supporting layer 61 has an upwardly protruding supporting layer mesa 611 right above the supporting layer recess 612. The compound semiconductor epitaxial substrate 10 has a substrate recess 15 on the top of the compound semiconductor epitaxial substrate 10, and the substrate recess 15 is located right below the supporting layer recess 612. The supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10. The bulk acoustic resonator structure 60 is formed on the supporting layer 61, wherein the bulk acoustic resonator structure 60 includes: a bottom electrode 601, a dielectric layer 602 and a top electrode 603. The bottom electrode 601 is formed on one end of the supporting layer 61, where the bottom electrode 601 is formed on and at least extended along the supporting layer mesa 611. The dielectric layer 602 is formed at least on the bottom electrode 601 above the supporting layer mesa 611. In the embodiment of FIG. 1, the dielectric layer 602 is formed on both the bottom electrode 601 and the supporting layer 61, and the dielectric layer 602 is also formed on the bottom electrode 601 above the supporting layer mesa 611. Please also refer to FIG. 1A, which shows the cross-sectional view of another embodiment of the integrated structure of power amplifier and acoustic wave device of the present invention. The main structure in FIG. 1A is basically the same as the structure shown in FIG. 1, except that the dielectric layer 602 is formed on the bottom electrode 601 above the supporting layer mesa 611 and also formed on a small part of the supporting layer 61 above the supporting layer mesa 611. The top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611. In the embodiment of FIG. 1, the top electrode 603 is formed on the dielectric layer 602, while in embodiment of FIG. 1A, the top electrode 603 is formed on both the dielectric layer 602 and the supporting layer 61. The top electrode 603 and the bottom electrode 601 are not electrically connected. The gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the integrated structure 1 of power amplifier 20 and acoustic wave device 50 is not limited to integrating one single power amplifier 20 and one single acoustic wave device 50. In another embodiment, the integrated structure 1 of power amplifier 20 and acoustic wave device 50 may integrates one single power amplifier 20 and plural acoustic wave devices 50, plural power amplifiers 20 and one single acoustic wave device 50 or plural power amplifiers 20 and plural acoustic wave devices 50.

In an embodiment, the integrated structure 1 of power amplifier 20 and acoustic wave device 50 may also integrate other components, such as metal-insulator-metal capacitor, resistor, inductor or diode, on the same the compound semiconductor epitaxial substrate 10, wherein the components may be directly or indirectly electrically connected. In another embodiment, the power amplifier 20 and the acoustic wave device 50 may be directly electrically connected. In other embodiment, the power amplifier 20 may be indirectly electrically connected with the acoustic wave device 50 through other component(s) on the integrated structure.

In an embodiment, the application of the acoustic wave device 50 may be a filter. Usually plural acoustic wave devices 50 are in series and/or in parallel in the combination of circuit to form a filter which may filter the signal. In another embodiment, the signal may flow into the filter formed by the acoustic wave devices 50 to be filtered, and then the filtered signal flows into the power amplifier 20 to be amplified. In other embodiment, the signal may flow into the power amplifier 20 to be amplified, and then the amplified signal flows into the filter formed by the acoustic wave devices 50 to be filtered. In one another embodiment, the integrated structure may integrate one power amplifier 20 and two filters formed by acoustic wave devices 50. The signal may firstly flow into the first filter formed by acoustic wave devices 50 to be filtered, and then flow into the power amplifier 20 to be amplified, and finally flow into the second filter formed by acoustic wave devices 50 to be filtered.

In one embodiment, the application of the acoustic wave device 50 may be a mass sensing device, a biomedical sensing device, an UV sensing device, a pressure sensing device or a temperature sensing device.

In an embodiment, the compound semiconductor substrate 12 may be made of GaAs, SiC, InP, GaN, AlN or Sapphire.

In an embodiment, the function of the supporting layer 61 may be the supporting for the film bulk acoustic resonator 51 for preventing the film bulk acoustic resonator 51 from collapsing. The supporting layer 61 also may be the seed layer for the bottom electrode 601 and the dielectric layer 602 for improving the crystalline quality. In an embodiment, the supporting layer 61 is made of $SiN_x$ or AlN. The supporting layer 61 is formed on the epitaxial structure 13 by molecular beam epitaxy (MBE), sputtering or chemical vapor deposition (CVD).

In an embodiment, the bottom electrode 601 is needed to have a lower roughness and resistivity for benefit the preferable crystal growth axis. In an embodiment, the bottom electrode 601 is made of Mo, Pt, Al, Au, W or Ru. The bottom electrode 601 is formed on the supporting layer 61 by evaporation or sputtering.

In an embodiment, the dielectric layer 602 is made of AlN, monocrystalline $SiO_2$, ZnO, $HfO_2$, barium strontium titanate (BST) or lead zirconate titanate (PZT), and is formed on the bottom electrode 601 or formed on both the electrode 601 and the supporting layer 61 by epitaxial growth or sputtering. The selection of the materials of the dielectric layer 602 is associated with the application. AlN is a high acoustic wave velocity material (12000 m/s) and is suitable for high frequency application, and after the formation of the micro structure of the material, it has good physical and chemical stability and its properties are not easily to be influenced by the circumstance. ZnO may be formed under lower temperature and it has an acoustic wave velocity 6000 m/s. Its electromechanical coupling coefficient is higher (8.5%) and it is suitable for the application of broadband filter. However when forming ZnO, the concentration of oxygen vacancies in ZnO is not easily controlled, yet it is easily influenced by the humidity and oxygen of the circumstance. Both barium strontium titanate (BST) and lead zirconate titanate (PZT) are ferroelectric materials. Their dielectric constant may vary under external electric field. Hence, they are suitable for the application of acoustic wave device with tunable frequency within dozen MHz range of frequencies. Both barium strontium titanate (BST) and lead zirconate titanate (PZT) need to be polarized under high voltage electric field in order to obtain their piezoelectric characteristics. Lead zirconate titanate (PZT) has higher electromechanical coupling coefficient, however it contains lead.

In an embodiment, the top electrode 603 is needed to have a lower resistivity for reducing power loss so as to reduce the insertion loss. In an embodiment, the top electrode 603 may be made of Mo, Pt, Al, Au, W or Ru. The top electrode 603 is formed on the dielectric layer 602 or is formed on both the dielectric layer 602 and the supporting layer 61 by evaporation or sputtering.

In an embodiment, the bottom electrode 601 is made of Mo or Pt, while the dielectric layer 602 is made of AlN. The Mo of the bottom electrode 601 may be etched by Lithography and Lift-off process. And the AlN of the dielectric layer 602 may be etched by inductively coupled plasma (ICP) process with $CF_4$ plasma.

In an embodiment, the depth of the substrate recess 15 is between 50 nm and 10000 nm.

In an embodiment, the depth of the supporting layer recess 612 is between 10 nm and 3500 nm. In another embodiment, the optimized depth of the supporting layer recess 612 is between 10 nm and 1500 nm.

Figure 1B:
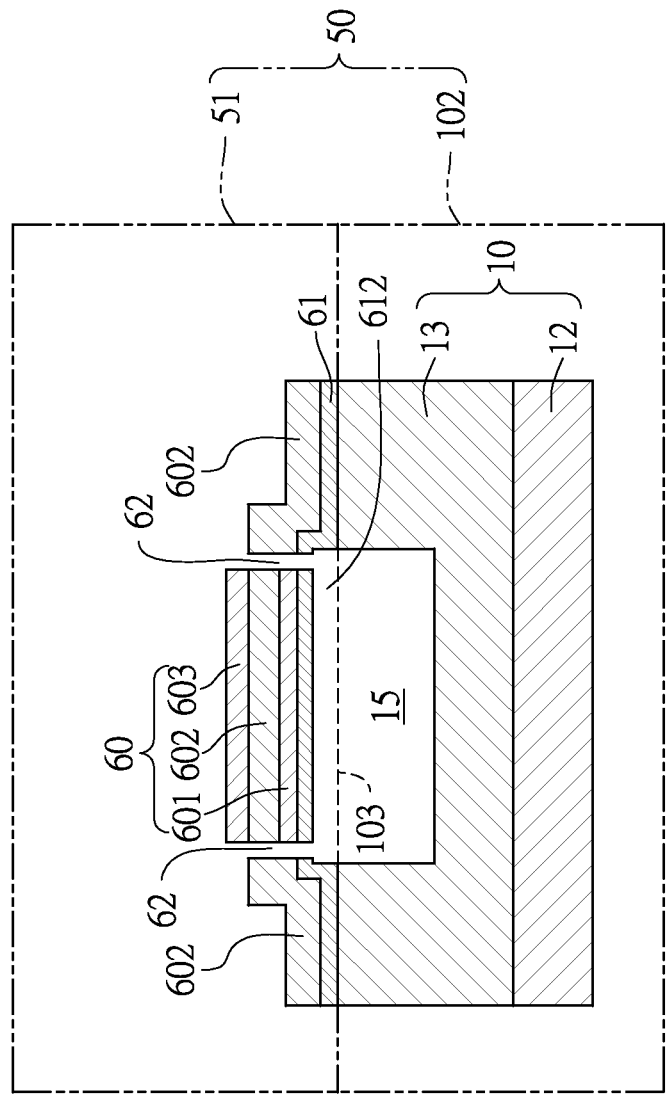
Figure 1G:
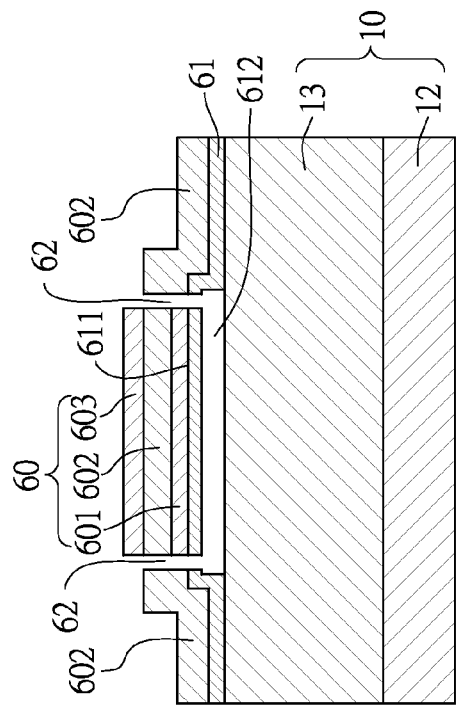

Please refer to FIG. 1B, which shows the cross-sectional view of another embodiment of the integrated structure of power amplifier and acoustic wave device of the present invention. The main structure in FIG. 1B is basically the same as the structure shown in FIG. 1, except that the film bulk acoustic resonator 51 further comprises at least one etching recess 62. The cross-sectional direction of FIG. 1B is orthogonal to that of FIG. 1. And there is only the acoustic wave device 50 at the position of the cross-sectional direction of FIG. 1B, hence there is no power amplifier 20 shown in FIG. 1B. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside.

Please refer to the embodiment of FIGS. 1 and 1B, the present invention provides a fabrication method for integrated structure of power amplifier and acoustic wave device. The fabrication method for the embodiment of FIGS. 1 and 1B comprises following steps of: Step A1: forming an epitaxial structure 13 on a compound semiconductor substrate 12 to form a compound semiconductor epitaxial substrate 10; Step A2: forming a power amplifier upper structure 21 on a first side 101 of the compound semiconductor epitaxial substrate 10 to form a power amplifier 20; and Step A3: forming a film bulk acoustic resonator 51 on a second side 102 of the compound semiconductor epitaxial substrate 10 to form an acoustic wave device 50. The integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50. Step A3 includes following steps of: Step A31: (Please referring to FIG. 1C) forming a top sacrificial layer 63 on the compound semiconductor epitaxial substrate 10; Step A32: defining a top sacrificial layer etching area, and etching to remove the top sacrificial layer 63 within the top sacrificial layer etching area to form a top sacrificial layer mesa 632, such that the compound semiconductor epitaxial substrate 10 within the top sacrificial layer etching area is exposed; Step A33: (Please referring to FIG. 1D) forming a supporting layer 61 on the top sacrificial layer 63 and the compound semiconductor epitaxial substrate 10, wherein the supporting layer 61 has a supporting layer mesa 611 right above the top sacrificial layer mesa 632; Step A34: forming a bulk acoustic resonator structure 60 on the supporting layer 61 (Please referring to FIGS. 1E and 1F, wherein the cross-sectional direction of FIG. 1F is orthogonal to that of FIG. 1E, and there is only the acoustic wave device 50 at the position of the cross-sectional direction of FIG. 1F, hence there is no power amplifier 20 shown in FIG. 1F), which includes following steps of: Step A341: forming a bottom electrode 601 on one end of the supporting layer 61, where the bottom electrode 601 is formed on and at least extended along the supporting layer mesa 611; Step A342: forming a dielectric layer 602, wherein the dielectric layer 602 is formed at least on the bottom electrode 601 above the supporting layer mesa 611; and Step A343: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step A35: (Please referring to FIG. 1G) defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 to form at least one etching recess 62, thereby part of the top sacrificial layer mesa 632 is exposed; Step A36: (Please referring to FIG. 1H) etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 respectively; and Step A37: etching to remove part of the compound semiconductor epitaxial substrate 10 below the supporting layer recess 612 to form a substrate recess 15 (Please referring to FIGS. 1 and 1B, wherein the cross-sectional direction of FIG. 1B is orthogonal to that of FIG. 1, and there is only the acoustic wave device 50 at the position of the cross-sectional direction of FIG. 1B, hence there is no power amplifier 20 shown in FIG. 1B), wherein the bottom of the substrate recess 15 is the compound semiconductor epitaxial substrate 10, wherein at least one substrate recess etching solution contacts with the top surface of the compound semiconductor epitaxial substrate 10 via the at least one etching recess 62 and the supporting layer recess 612, the at least one substrate recess etching solution is uniformly distributed on the top surface of the compound semiconductor epitaxial substrate 10 through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

Figure 1I:
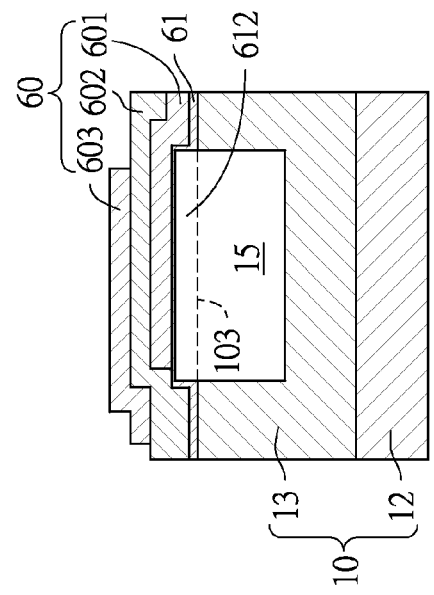
FIGS. 1I and 1J are the partial enlarged cross-sectional views of embodiments of the integrated structure of power amplifier and acoustic wave device of the present invention.
Figure 1H:
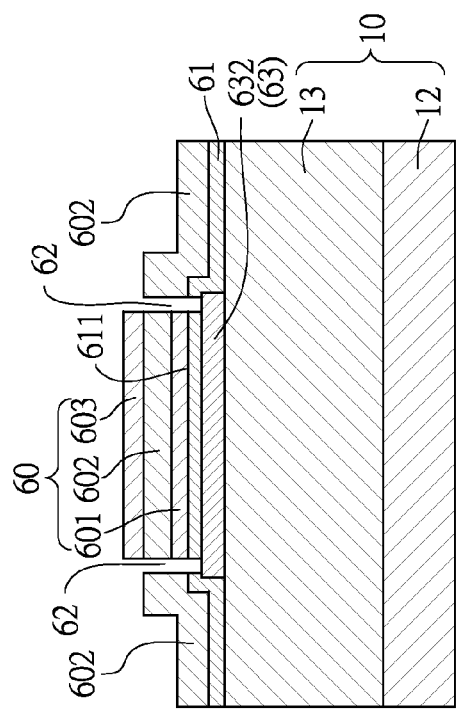
Figure 1J:
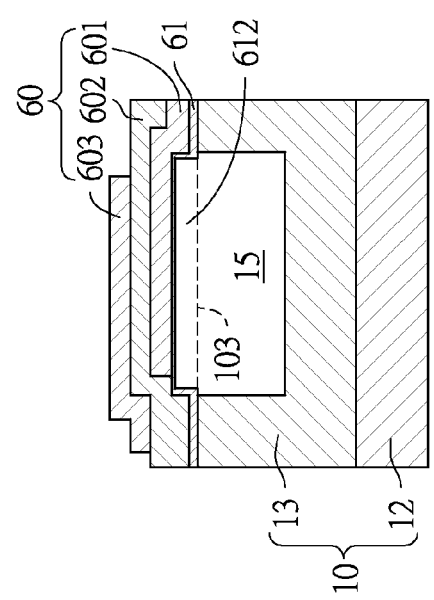

Please refer to FIG. 1I, which shows the partial enlarged cross-sectional view of an embodiment of the integrated structure of power amplifier and acoustic wave device of the present invention. In the embodiment of FIG. 1I, the supporting layer recess 612 has an opening smaller than that of the substrate recess 15. Please refer to FIG. 1J, which shows the partial enlarged cross-sectional view of another embodiment of the integrated structure of power amplifier and acoustic wave device of the present invention. In the embodiment of FIG. 1J, the supporting layer recess 612 has an opening almost equal to that of the substrate recess 15.

Figure 1K:
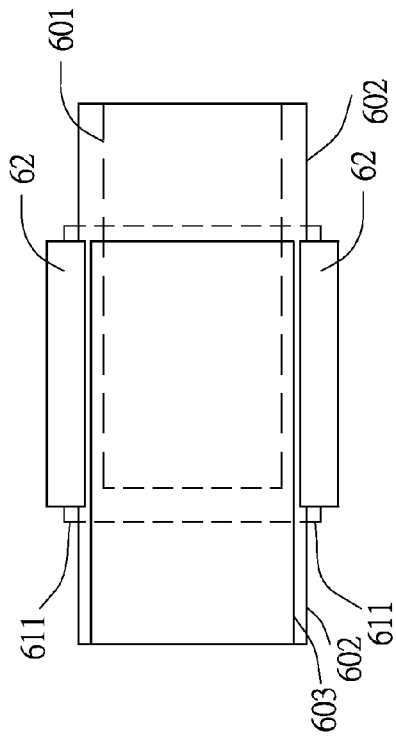
FIG. 1K~1N are the top views showing the relative position of the etching recess and the supporting layer mesa in the embodiments of the integrated structure of power amplifier and acoustic wave device of the present invention.
Figure 1L:
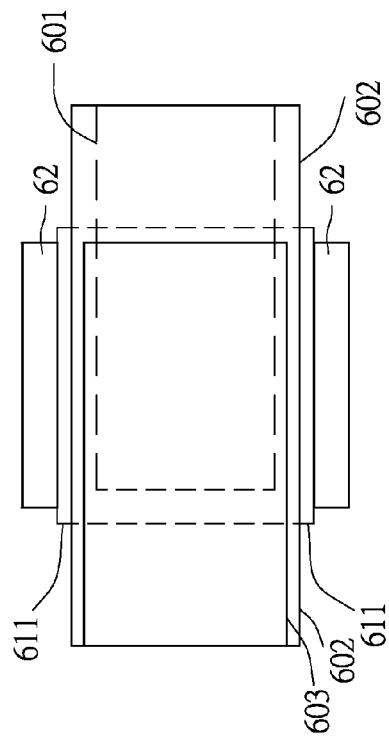
Figure 1M:
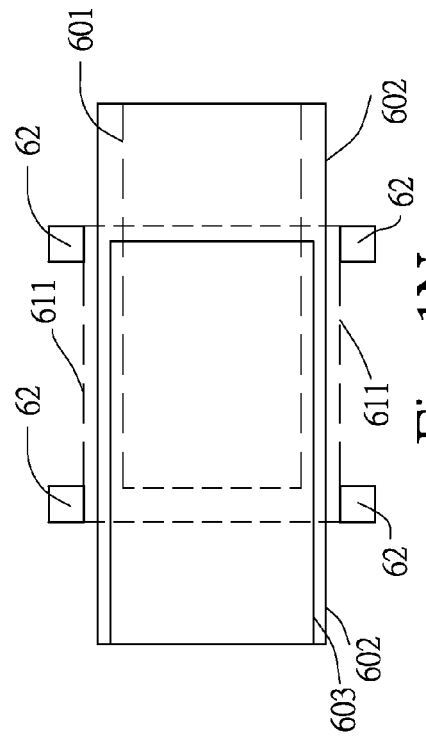
Figure 1N:
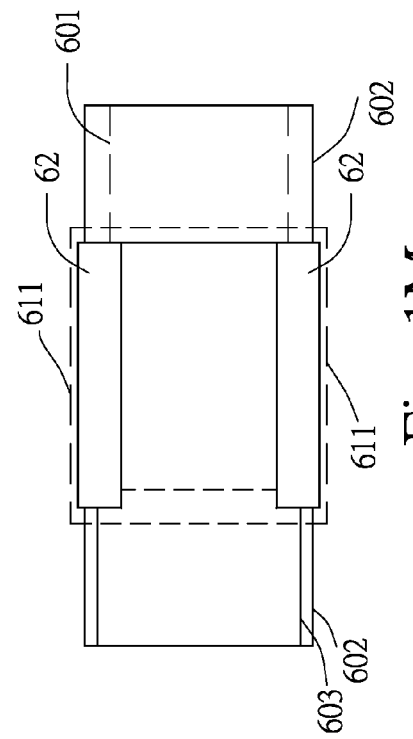

Please refer to FIGS. 1K, 1L, 1M and 1N, which show the top views of the relative position of the etching recess and the supporting layer mesa in the embodiments of the integrated structure of power amplifier and acoustic wave device of the present invention. In the embodiment of FIG. 1K, the integrated structure 1 of power amplifier 20 and acoustic wave device 50 has two etching recess 62 with long strip opening. The two etching recesses 62 are located on two opposite sides of the supporting layer mesa 611 respectively. And the etching recesses 62 penetrate the supporting layer 61 (not shown in FIG. 1K), and thereby the supporting layer recess 612 (not shown in FIG. 1K) is communicated with the outside. In the embodiment of FIG. 1L, the integrated structure 1 of power amplifier 20 and acoustic wave device 50 has two etching recess 62 with long strip opening. The two etching recesses 62 are located on two opposite sides of the supporting layer mesa 611 respectively. (part of the etching recesses 62 are within the supporting layer mesa 611, the rest part of the etching recesses 62 are outside the supporting layer mesa 611) And the etching recesses 62 penetrate the supporting layer 61 (not shown in FIG. 1L) and the dielectric layer 602. In the embodiment of FIG. 1M, the integrated structure 1 of power amplifier 20 and acoustic wave device 50 has two etching recess 62 with long strip opening. The two etching recesses 62 are located respectively on two opposite sides of the supporting layer mesa 611 within the supporting layer mesa 611. And the etching recesses 62 penetrate the supporting layer 61 (not shown in FIG. 1M), the bottom electrode 601, the dielectric layer 602 and the top electrode 603. In the embodiment of FIG. 1N, the integrated structure 1 of power amplifier 20 and acoustic wave device 50 has four etching recess 62 with square opening. The four etching recesses 62 are located on four corners of the supporting layer mesa 611 respectively. And the etching recesses 62 penetrate the supporting layer 61 (not shown in FIG. 1N). The amount of the etching recesses 62 is not limited to one, two, three, four or more. The etching recesses 62 may locate on other position and should not be limited by FIG. 1K, 1L, 1M or 1N.

In one embodiment, the power amplifier 20 may be a heterojunction bipolar transistor (HBT). In another embodiment, the power amplifier 20 may be a field effect transistor (FET), a high electron mobility transistor (HEMT) or a pseudomorphic high electron mobility transistor (pHEMT). In an embodiment, the power amplifier 20 may be any other type of amplifier which may be formed on the compound semiconductor substrate 12.

Figure 2:
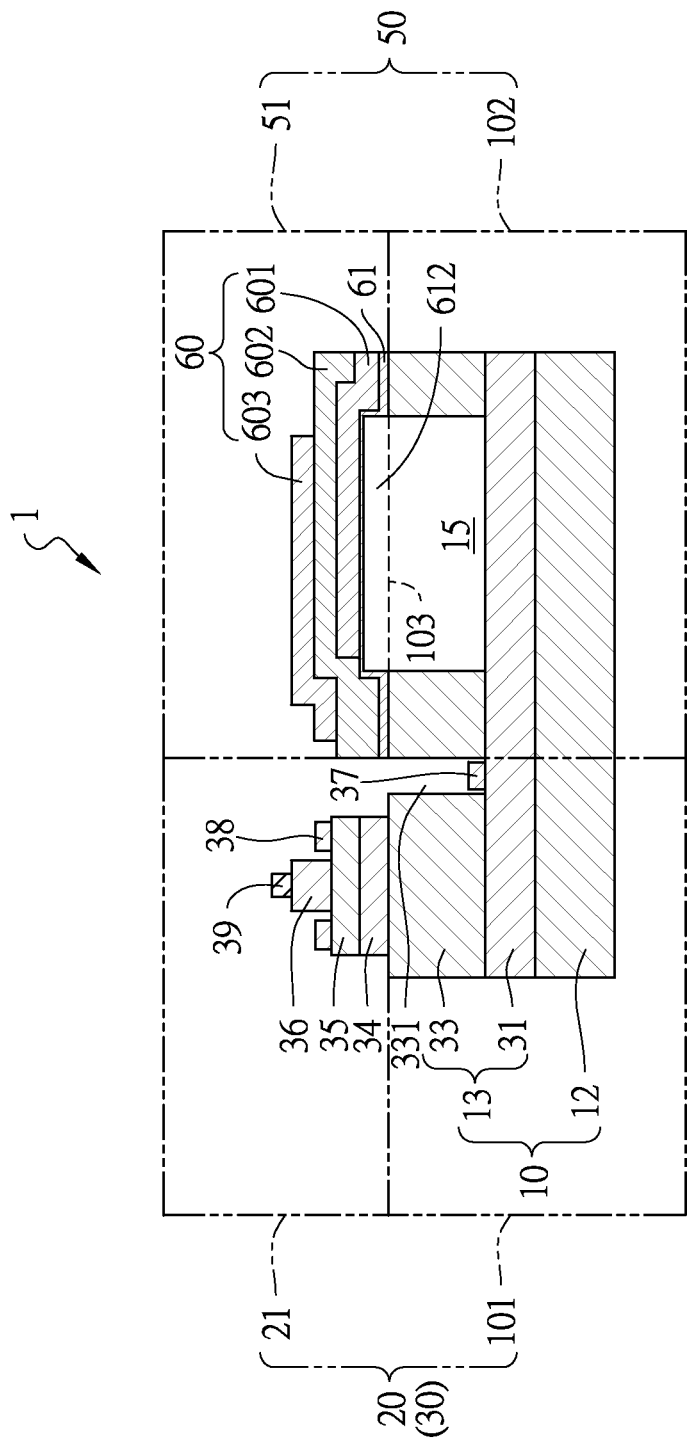
FIGS. 2 and 2A~2E are the cross-sectional views of embodiments of the integrated structure of power amplifier and acoustic wave device of the present invention.

Please refer to FIG. 2, which shows the cross-sectional view of another embodiment of the integrated structure of power amplifier and acoustic wave device of the present invention. The main structure in FIG. 2 is basically the same as the structure shown in FIG. 1, except that the power amplifier 20 is a heterojunction bipolar transistor 30 (HBT). The epitaxial structure 13 includes: a subcollector layer 31 and a collector layer 33. The subcollector layer 31 formed on the compound semiconductor substrate 12; the collector layer 33 formed on the subcollector layer 31. The first side 101 of the compound semiconductor epitaxial substrate 10 further comprises a collector recess 331, and the bottom of the collector recess 331 is the subcollector layer 31. The power amplifier upper structure 21 includes: a base layer 34, an emitter ledge layer 35, an emitter layer 36, a base electrode 38, an emitter electrode 39 and a collector electrode 37. The base layer 34 is formed on the collector layer 33; the emitter ledge layer 35 is formed on the base layer 34; the emitter layer 36 is formed on the emitter ledge layer 35; the base electrode 38 is formed on the emitter ledge layer 35; the emitter electrode 39 is formed on the emitter layer 36; the collector electrode 37 is formed on the subcollector layer 31 within the collector recess 331. The first side 101 of the compound semiconductor epitaxial substrate 10 includes: the compound semiconductor substrate 12, the subcollector layer 31, the collector layer 33 and the collector recess 331. The first side 101 of the compound semiconductor epitaxial substrate 10 and the power amplifier upper structure 21 form the heterojunction bipolar transistor 30. The acoustic wave device 50 in FIG. 2 is basically the same as the acoustic wave device 50 in FIG. 1. The substrate recess 15 of the second side 102 of the compound semiconductor epitaxial substrate 10 is peripherally surrounded by the collector layer 33, and the bottom of the substrate recess 15 is the subcollector layer 31. The second side 102 of the compound semiconductor epitaxial substrate 10 and the film bulk acoustic resonator 51 form the acoustic wave device 50.

In one embodiment, the collector layer 33 is made of GaAs. The thickness of the collector layer 33 is between 500 nm and 3000 nm.

In another embodiment, the base layer 34 is made of GaAs. The thickness of the base layer 34 is between 60 nm and 100 nm.

In one embodiment, the subcollector layer 31 is made of GaAs and is formed on the compound semiconductor substrate 12 by epitaxial growth.

Figure 2A:
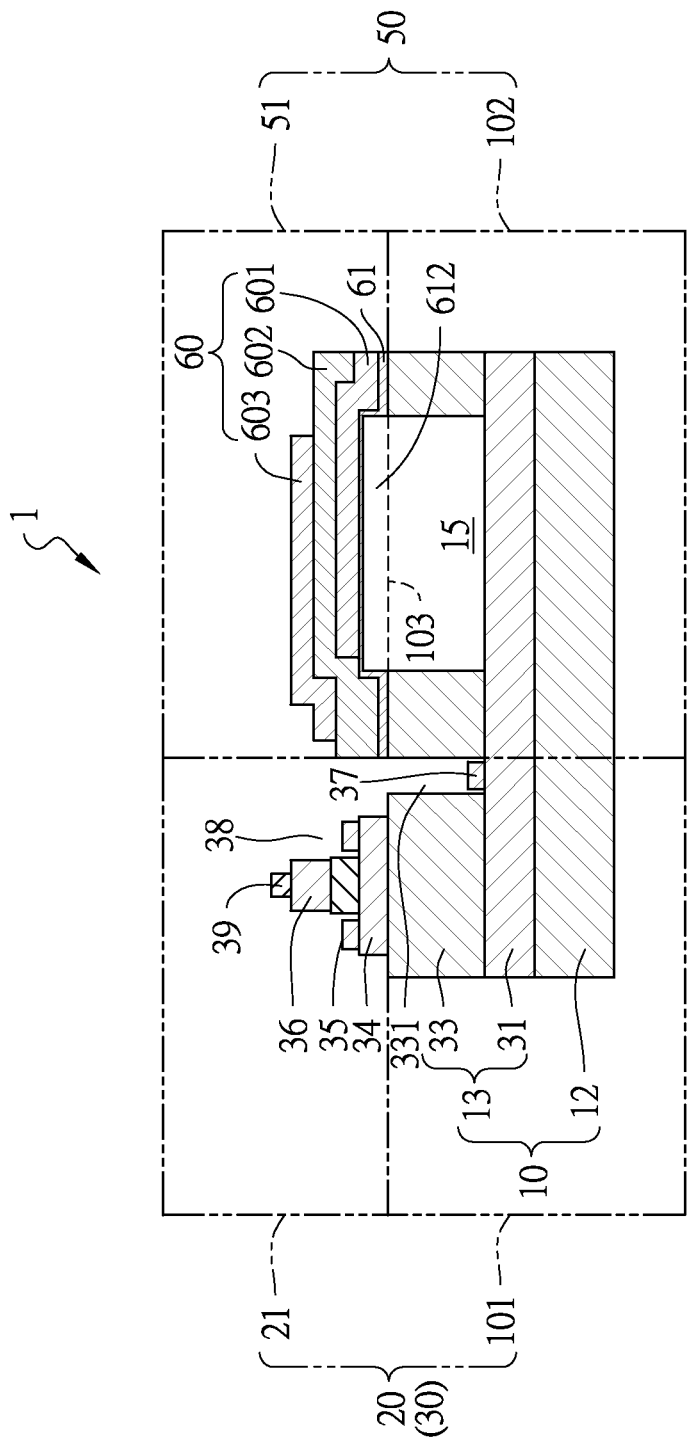

Please refer to FIG. 2A, which shows the cross-sectional view of another embodiment of the integrated structure of power amplifier and acoustic wave device of the present invention. The main structure in FIG. 2A is basically the same as the structure shown in FIG. 2, except that the base electrode 38 is formed on the base layer 34. In one other embodiment, the base electrode 38 may be formed on both the base layer 34 and the emitter ledge layer 35. In other embodiments having basically the same structure as the embodiment in FIG. 2, the base electrode 38 may be formed on the base layer 34 and/or the emitter ledge layer 35.

Figure 2B:
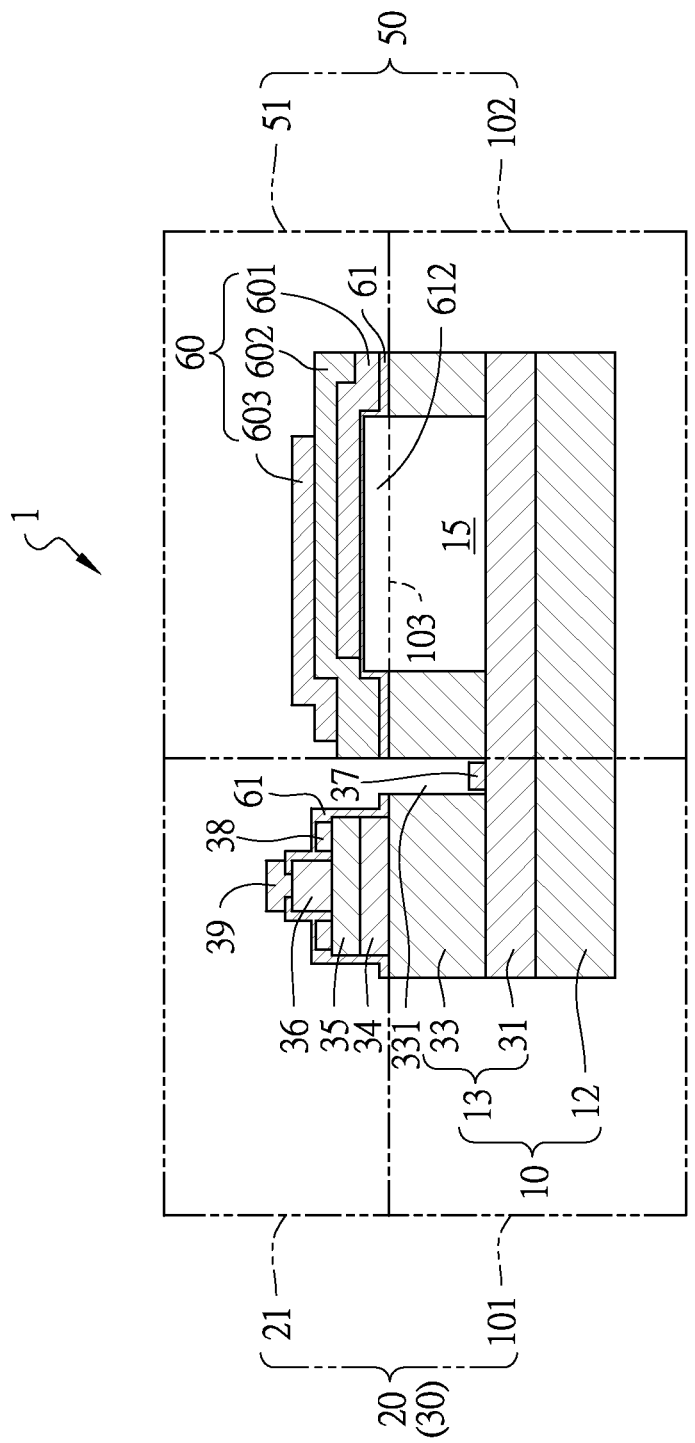

Please refer to FIG. 2B, which shows the cross-sectional view of another embodiment of the integrated structure of power amplifier and acoustic wave device of the present invention. The main structure in FIG. 2B is basically the same as the structure shown in FIG. 2, except that the heterojunction bipolar transistor 30 further comprises the supporting layer 61. The supporting layer 61 plays a role of protection, and may prevent the heterojunction bipolar transistor 30 from oxidation or corrosion. In other embodiments having basically the same structure as the embodiment in FIG. 2, the power amplifier 20 may also include the supporting layer 61.

Figure 2C:
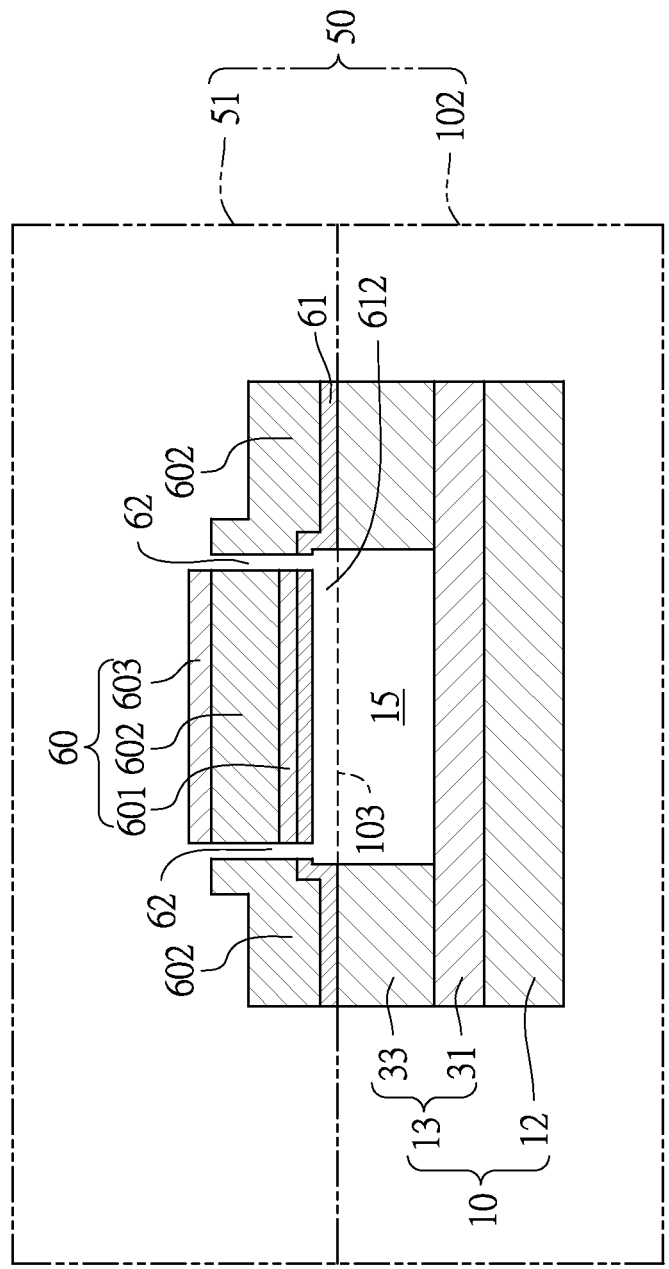

Please refer to FIG. 2C, which shows the cross-sectional view of another embodiment of the integrated structure of power amplifier and acoustic wave device of the present invention. The main structure in FIG. 2C is basically the same as the structure shown in FIG. 2, except that the film bulk acoustic resonator 51 further comprises at least one etching recess 62. The cross-sectional direction of FIG. 2C is orthogonal to that of FIG. 2. And there is only the acoustic wave device 50 at the position of the cross-sectional direction of FIG. 2C, hence there is no power amplifier 20 shown in FIG. 2C. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 2C is basically the same as that of the embodiment in FIG. 1B. The power amplifier 20 may also include the supporting layer 61, or may choose not to include the supporting layer 61.

Figure 2D:
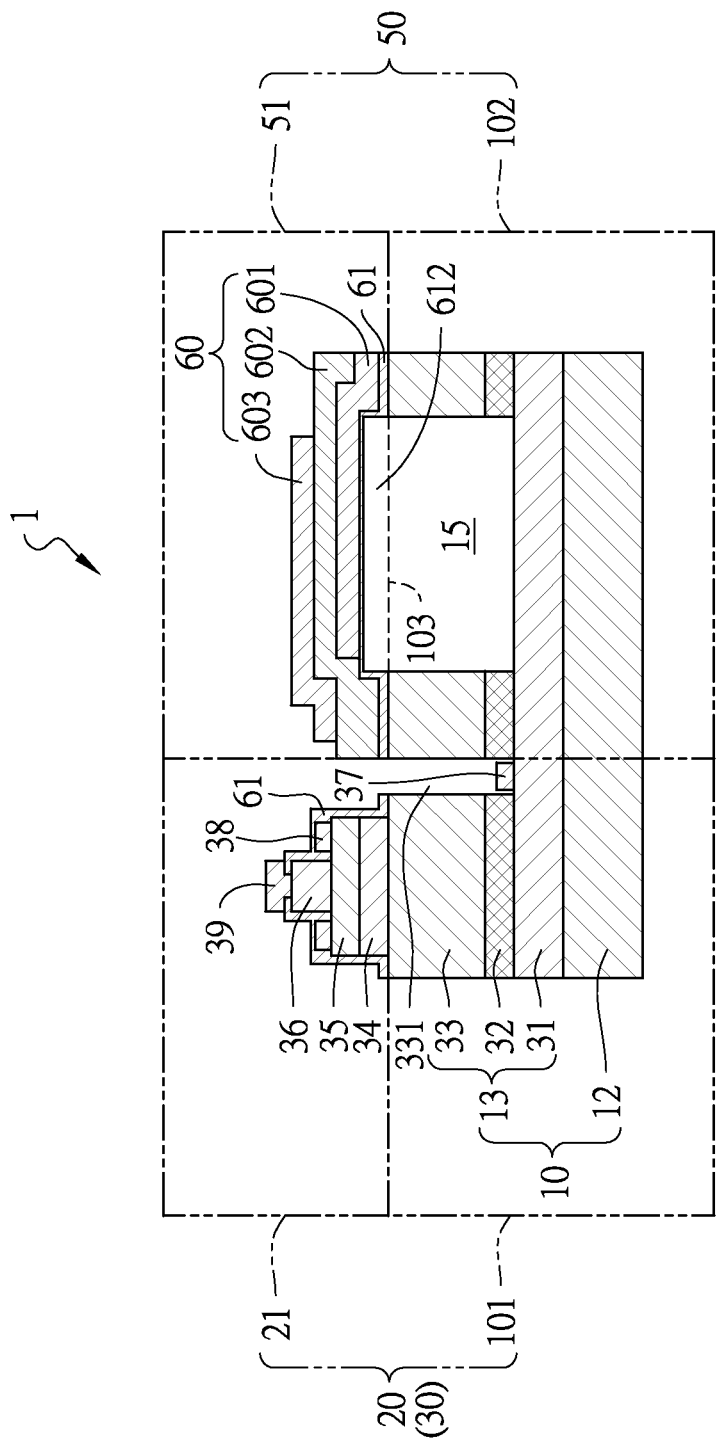

Please refer to FIG. 2D, which shows the cross-sectional view of another embodiment of the integrated structure of power amplifier and acoustic wave device of the present invention. The main structure in FIG. 2D is basically the same as the structure shown in FIG. 2B, except that the epitaxial structure 13 further comprises an etching stop layer 32; wherein the etching stop layer 32 is formed on the subcollector layer 31; and the collector layer 33 is formed on the etching stop layer 32. The bottom of the collector recess 331 is the subcollector layer 31, the collector electrode 37 is formed on the subcollector layer 31 within the collector recess 331. The substrate recess 15 is peripherally surrounded by the collector layer 33 and the etching stop layer 32, and the bottom of the substrate recess 15 is the subcollector layer 31. The power amplifier 20 may also include the supporting layer 61, or may choose not to include the supporting layer 61.

In an embodiment, the etching stop layer 32 is made of InGaP. In one embodiment, the thickness of the etching stop layer 32 is between 5 nm and 1000 nm. In another embodiment, the optimized thickness of the etching stop layer 32 is 20 nm.

Figure 2E:
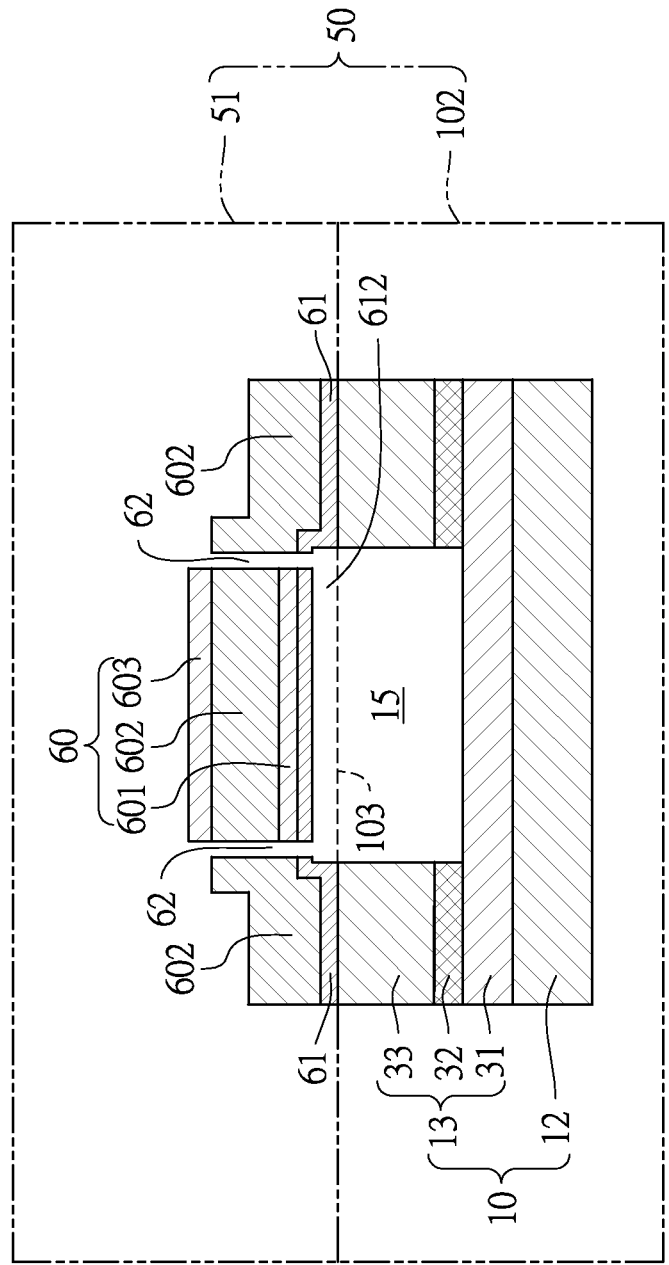

Please refer to FIG. 2E, which shows the cross-sectional view of another embodiment of the integrated structure of power amplifier and acoustic wave device of the present invention. The main structure in FIG. 2E is basically the same as the structure shown in FIG. 2D, except that the film bulk acoustic resonator 51 further comprises at least one etching recess 62. The cross-sectional direction of FIG. 2E is orthogonal to that of FIG. 2D. And there is only the acoustic wave device 50 at the position of the cross-sectional direction of FIG. 2E, hence there is no power amplifier 20 shown in FIG. 2E. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 2E is basically the same as that of the embodiment in FIG. 1B. The power amplifier 20 may also include the supporting layer 61, or may choose not to include the supporting layer 61.

Figure 2J:
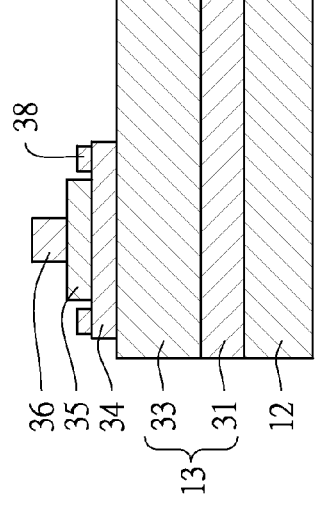
FIG. 2F~2W are the cross-sectional schematics showing steps of a fabrication method for the embodiments of the integrated structure of power amplifier and acoustic wave device of the present invention.
Figure 2K:
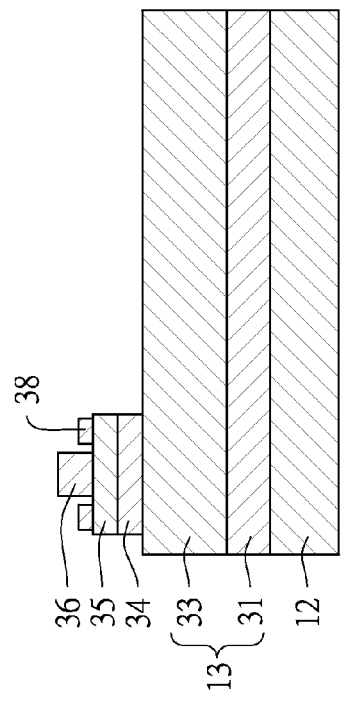
Figure 2L:
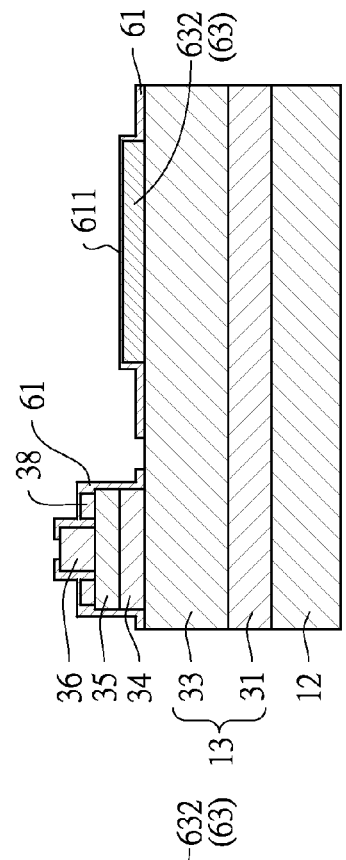
Figure 2M:
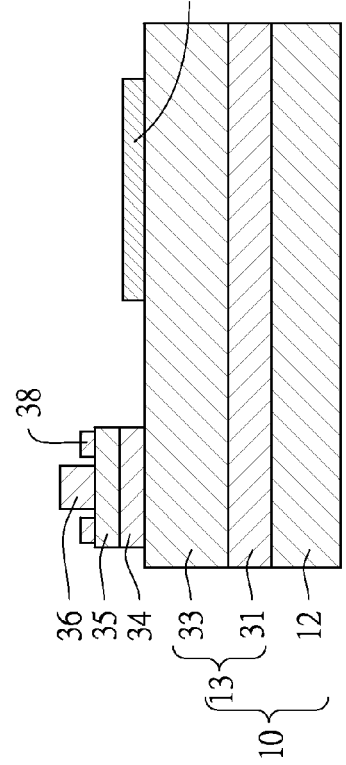

Please refer to FIGS. 2B and 2C. The cross-sectional direction of FIG. 2C is orthogonal to that of FIG. 2B. And there is only the acoustic wave device 50 at the position of the cross-sectional direction of FIG. 2C, hence there is no power amplifier 20 shown in FIG. 2C. The present invention provides a fabrication method for integrated structure of power amplifier and acoustic wave device. The fabrication method for the embodiment of FIGS. 2B and 2C comprises following steps of: Step B1: forming an epitaxial structure 13 on a compound semiconductor substrate 12 to form a compound semiconductor epitaxial substrate 10; Step B2: forming a power amplifier upper structure 21 on a first side 101 of the compound semiconductor epitaxial substrate 10 to form a power amplifier 20, wherein the power amplifier 20 is a heterojunction bipolar transistor 30 (HBT); and Step B3: forming a film bulk acoustic resonator 51 on a second side 102 of the compound semiconductor epitaxial substrate 10 to form an acoustic wave device 50; wherein, the integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50. In this embodiment, Step B1 further includes following steps of: Step B11: (Please referring to FIG. 2F) forming a subcollector layer 31 on the compound semiconductor substrate 12; and Step B12: forming a collector layer 33 on the subcollector layer 31. Step B2 and Step B3 include following steps of: Step B41: (Please referring to FIG. 2H) forming a base layer 34 on the collector layer 33; Step B42: forming an emitter ledge layer 35 on the base layer 34; Step B43: forming an emitter layer 36 on the emitter ledge layer 35; Step B44: (Please referring to FIG. 2I) defining an emitter layer etching area, and etching to remove the emitter layer 36 within the emitter layer etching area; Step B45: forming a base electrode 38 on the emitter ledge layer 35; Step B46: (Please referring to FIG. 2J) defining an emitter ledge layer etching area, and etching to remove the emitter ledge layer 35 within the emitter ledge layer etching area; Step B47: defining a base layer etching area, and etching to remove the base layer 34 within the base layer etching area; Step B48: (Please referring to FIG. 2L) forming a top sacrificial layer 63 on the compound semiconductor epitaxial substrate 10 (the collector layer 33); Step B49: defining a top sacrificial layer etching area, and etching to remove the top sacrificial layer 63 within the top sacrificial layer etching area to form a top sacrificial layer mesa 632, such that the compound semiconductor epitaxial substrate 10 (the collector layer 33) within the top sacrificial layer etching area is exposed; Step B50: (Please referring to FIGS. 2M and 2N) forming a supporting layer 61 on the top sacrificial layer 63 and the compound semiconductor epitaxial substrate 10 (the collector layer 33), wherein the supporting layer 61 has a supporting layer mesa 611 right above the top sacrificial layer mesa 632; wherein the supporting layer 61 may also be formed on the base layer 34, the emitter ledge layer 35, the emitter layer 36 and the base electrode 38, and the supporting layer 61 may play a role of protection; Step B51: forming a bulk acoustic resonator structure 60 on the supporting layer 61, which includes following steps of: Step B511: (Please referring to FIG. 2O) forming a bottom electrode 601 on one end of the supporting layer 61, where the bottom electrode 601 is formed on and at least extended along the supporting layer mesa 611; and forming an emitter electrode 39 on the emitter layer 36 (the emitter electrode 39 may choose to be formed on the emitter layer 36 through other step); Step B512: (Please referring to FIG. 2P) forming a dielectric layer 602, wherein the dielectric layer 602 is formed at least on the bottom electrode 601 above the supporting layer mesa 611; and Step B513: (Please referring to FIG. 2Q) forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step B52: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 (the collector layer 33) to form at least one etching recess 62, thereby part of the top sacrificial layer mesa 632 is exposed (Please referring to FIGS. 2R and 2S, wherein the cross-sectional direction of FIG. 2S is orthogonal to that of FIG. 2R, and there is only the acoustic wave device 50 at the position of the cross-sectional direction of FIG. 2S, hence there is no power amplifier 20 shown in FIG. 2S); Step B53: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 (the collector layer 33) respectively (Please referring to FIGS. 2T and 2U, wherein the cross-sectional direction of FIG. 2U is orthogonal to that of FIG. 2T, and there is only the acoustic wave device 50 at the position of the cross-sectional direction of FIG. 2U, hence there is no power amplifier 20 shown in FIG. 2U); Step B54: defining a collector electrode etching area, and etching to remove the collector layer 33 within the collector electrode etching area such that the etching stops at the subcollector layer 31 to form a collector recess 331 (Please referring to FIGS. 2V and 2W, wherein the cross-sectional direction of FIG. 2W is orthogonal to that of FIG. 2V, and there is only the acoustic wave device 50 at the position of the cross-sectional direction of FIG. 2W, hence there is no power amplifier 20 shown in FIG. 2W), thereby the subcollector layer 31 within the collector recess 331 is exposed; and etching to remove part of the compound semiconductor epitaxial substrate 10 below the supporting layer recess 612 to form a substrate recess 15, wherein the bottom of the substrate recess 15 is the compound semiconductor epitaxial substrate 10 (the subcollector layer 31), wherein at least one substrate recess etching solution contacts with the top surface of the compound semiconductor epitaxial substrate 10 (the collector layer 33) via the at least one etching recess 62 and the supporting layer recess 612, the at least one substrate recess etching solution is uniformly distributed on the top surface of the compound semiconductor epitaxial substrate 10 (the collector layer 33) through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly; and Step B55: forming a collector electrode 37 on the subcollector layer 31 within the collector recess 331 (Please referring to FIGS. 2B and 2C, wherein the cross-sectional direction of FIG. 2C is orthogonal to that of FIG. 2B, and there is only the acoustic wave device 50 at the position of the cross-sectional direction of FIG. 2C, hence there is no power amplifier 20 shown in FIG. 2C); thereby the first side 101 of the compound semiconductor epitaxial substrate 10 includes: the compound semiconductor substrate 12, the subcollector layer 31, the collector layer 33 and the collector recess 331; the power amplifier upper structure 21 includes: the base layer 34, the emitter ledge layer 35, the emitter layer 36, the base electrode 38, the emitter electrode 39 and the collector electrode 37; wherein the first side 101 of the compound semiconductor epitaxial substrate 10 and the power amplifier upper structure 21 form the heterojunction bipolar transistor 30; wherein the substrate recess 15 is peripherally surrounded by the collector layer 33, and the bottom of the substrate recess 15 is the subcollector layer 31.

Step B44, Step B45 and Step B46 may be substituted by Step B441, Step B451, Step B461 and Step B462. These steps are as follows: Step B441: (Please referring to FIG. 2K) defining an emitter layer etching area, and etching to remove the emitter layer 36 within the emitter layer etching area; Step B451: defining an emitter ledge layer etching area, and etching to remove the emitter ledge layer 35 within the emitter ledge layer etching area; Step B461: forming a base electrode 38 on the base layer 34; Step B462: defining a base layer etching area, and etching to remove the base layer 34 within the base layer etching area.

Please refer to FIGS. 2G, 2D and 2E, in which FIG. 2G shows the cross-sectional schematic of the steps of the fabrication method for the embodiment of FIGS. 2D and 2E of the integrated structure of power amplifier and acoustic wave device of the present invention. The steps of the fabrication method for the embodiment of FIGS. 2D and 2E are basically the same as the fabrication method steps for the embodiment of FIGS. 2B and 2C, except that Step B1 further comprises Step B115: forming an etching stop layer 32 on the subcollector layer 31; and Step B545: etching to remove the etching stop layer 32 within the collector electrode etching area such that the etching stops at the subcollector layer 31 to form the collector recess 331, and thereby the subcollector layer 31 within the collector recess 331 is exposed. Step B115 is between Step B11 and Step B12, i.e. first, forming the subcollector layer 31 on the compound semiconductor substrate 12, then forming the etching stop layer 32 on the subcollector layer 31, and then forming the collector layer 33 on the etching stop layer 32, such that the epitaxial structure 13 includes: the subcollector layer 31, the etching stop layer 32 and the collector layer 33. Step B545 is between Step B54 and Step B55. Step B545 may also includes a step of etching to remove the etching stop layer 32 below the bottom of the substrate recess 15, such that the substrate recess 15 is peripherally surrounded by the collector layer 33 and the etching stop layer 32, and the bottom of the substrate recess 15 is the subcollector layer 31. The collector electrode 37 is formed on the subcollector layer 31 within the collector recess 331. Thereby the first side 101 of the compound semiconductor epitaxial substrate 10 includes: the compound semiconductor substrate 12, the subcollector layer 31, the etching stop layer 32, the collector layer 33 and the collector recess 331. The power amplifier upper structure 21 includes: the base layer 34, the emitter ledge layer 35, the emitter layer 36, the base electrode 38, the emitter electrode 39 and the collector electrode 37. The first side 101 of the compound semiconductor epitaxial substrate 10 and the power amplifier upper structure 21 form the heterojunction bipolar transistor 30.

In an embodiment, the top sacrificial layer 63 is made of AlAs or TiW.

In an embodiment, the TiW of the top sacrificial layer 63 may be formed by sputtering on the epitaxial structure 13 (the collector layer 33). TiW may be etched by $H_2O_2$.

In an embodiment, the AlAs of the top sacrificial layer 63 may be formed by molecular beam epitaxy (MBE) or metal organic chemical vapor deposition (MOCVD) on the epitaxial structure 13 (the collector layer 33).

In an embodiment, the thickness of the top sacrificial layer 63 is between 10 nm and 3500 nm. In another embodiment, the optimized thickness of the top sacrificial layer 63 is between 10 nm and 1500 nm.

Please refer to FIG. 3, which shows the cross-sectional view of another embodiment of the integrated structure of power amplifier and acoustic wave device of the present invention. The main structure in FIG. 3 is basically the same as the structure shown in FIG. 1, except that the power amplifier 20 is a pseudomorphic high electron mobility transistor 40 (pHEMT). The epitaxial structure 13 includes: a buffer layer 41, a channel layer 42, a Schottky layer 43 and a cap layer 44; wherein the buffer layer 41 is formed on the compound semiconductor substrate 12; the channel layer 42 is formed on the buffer layer 41; the Schottky layer 43 is formed on the channel layer 42; the cap layer 44 is formed on the Schottky layer 43. The first side 101 of the compound semiconductor epitaxial substrate 10 further comprises a gate recess 451; the bottom of the gate recess 451 is the Schottky layer 43; wherein the power amplifier upper structure 21 includes: a drain electrode 47, a source electrode 46 and a gate electrode 45; wherein the drain electrode 47 is formed on one end of the cap layer 44; the source electrode 46 is formed on the other end of the cap layer 44, wherein the gate recess 451 is located between the drain electrode 47 and the source electrode 46; the gate electrode 45 is formed on the Schottky layer 43 within the gate recess 451; thereby the first side 101 of the compound semiconductor epitaxial substrate 10 includes: the compound semiconductor substrate 12, the buffer layer 41, the channel layer 42, the Schottky layer 43, the cap layer 44 and the gate recess 451; wherein the first side 101 of the compound semiconductor epitaxial substrate 10 and the power amplifier upper structure 21 form the pseudomorphic high electron mobility transistor 40. The acoustic wave device 50 in FIG. 3 is basically the same as the acoustic wave device 50 in FIG. 1. The substrate recess 15 of the second side 102 of the compound semiconductor epitaxial substrate 10 is peripherally surrounded by the buffer layer 41, the channel layer 42, the Schottky layer 43 and the cap layer 44; and the bottom of the substrate recess 15 is the buffer layer 41. The second side 102 of the compound semiconductor epitaxial substrate 10 and the film bulk acoustic resonator 51 form the acoustic wave device 50.

In an embodiment, the buffer layer 41 is made of GaAs, $SiO_2$ or GaN and is formed on the compound semiconductor substrate 12 by epitaxial growth.

In an embodiment, the compound semiconductor substrate 12 is made of GaAs, while the buffer layer 41 is preferable to be made of GaAs. In another embodiment, the compound semiconductor substrate 12 is made of Sapphire, while the buffer layer 41 is preferable to be made of GaN.

Figure 3A:
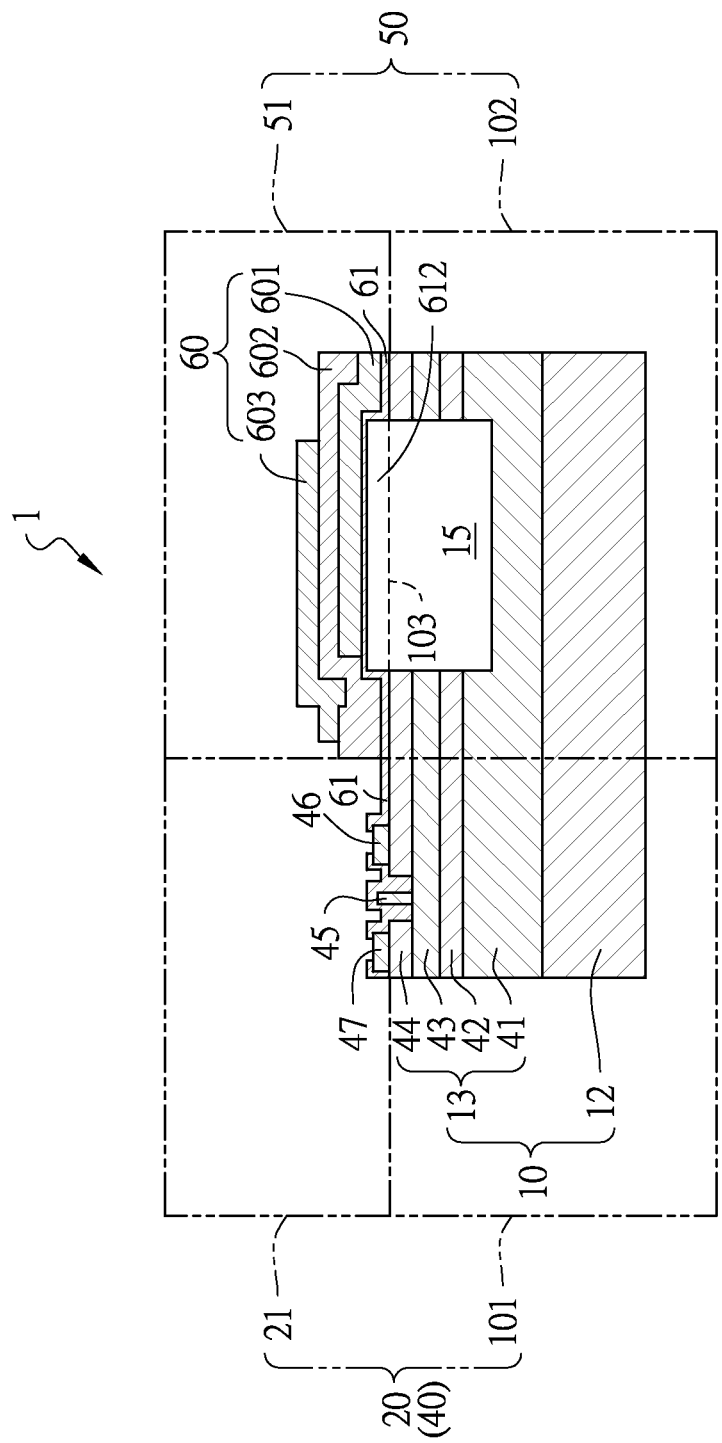

Please refer to FIG. 3A, which shows the cross-sectional view of another embodiment of the integrated structure of power amplifier and acoustic wave device of the present invention. The main structure in FIG. 3A is basically the same as the structure shown in FIG. 3, except that the pseudomorphic high electron mobility transistor 40 further comprises the supporting layer 61. The supporting layer 61 plays a role of protection, and may prevent the pseudomorphic high electron mobility transistor 40 from oxidation or corrosion. In other embodiments having basically the same structure as the embodiment in FIG. 3, the power amplifier 20 may also include the supporting layer 61.

Figure 3B:
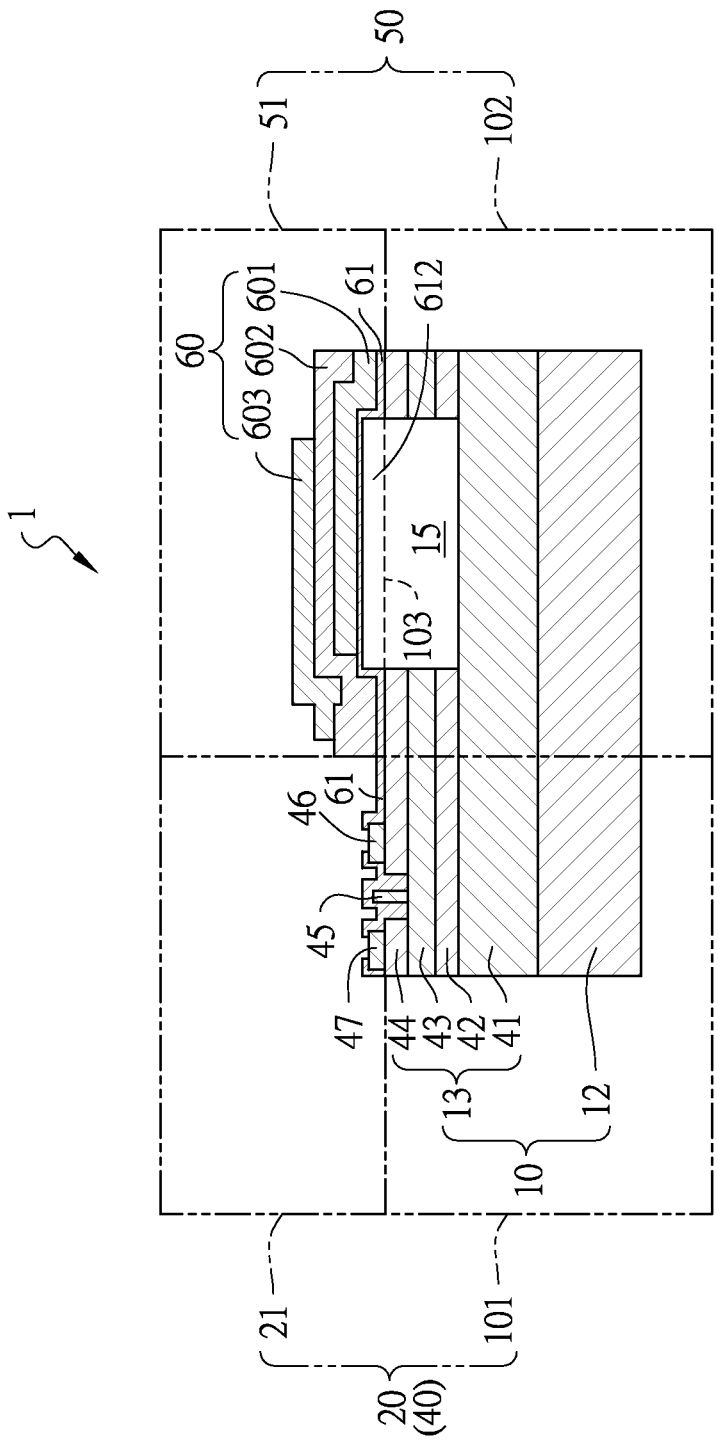

Please refer to FIG. 3B, which shows the cross-sectional view of another embodiment of the integrated structure of power amplifier and acoustic wave device of the present invention. The main structure in FIG. 3B is basically the same as the structure shown in FIG. 3, except that the substrate recess 15 of the second side 102 of the compound semiconductor epitaxial substrate 10 is peripherally surrounded by the channel layer 42, the Schottky layer 43 and the cap layer 44, and the bottom of the substrate recess 15 is the buffer layer 41. The power amplifier 20 may also include the supporting layer 61, or may choose not to include the supporting layer 61.

Figure 3C:
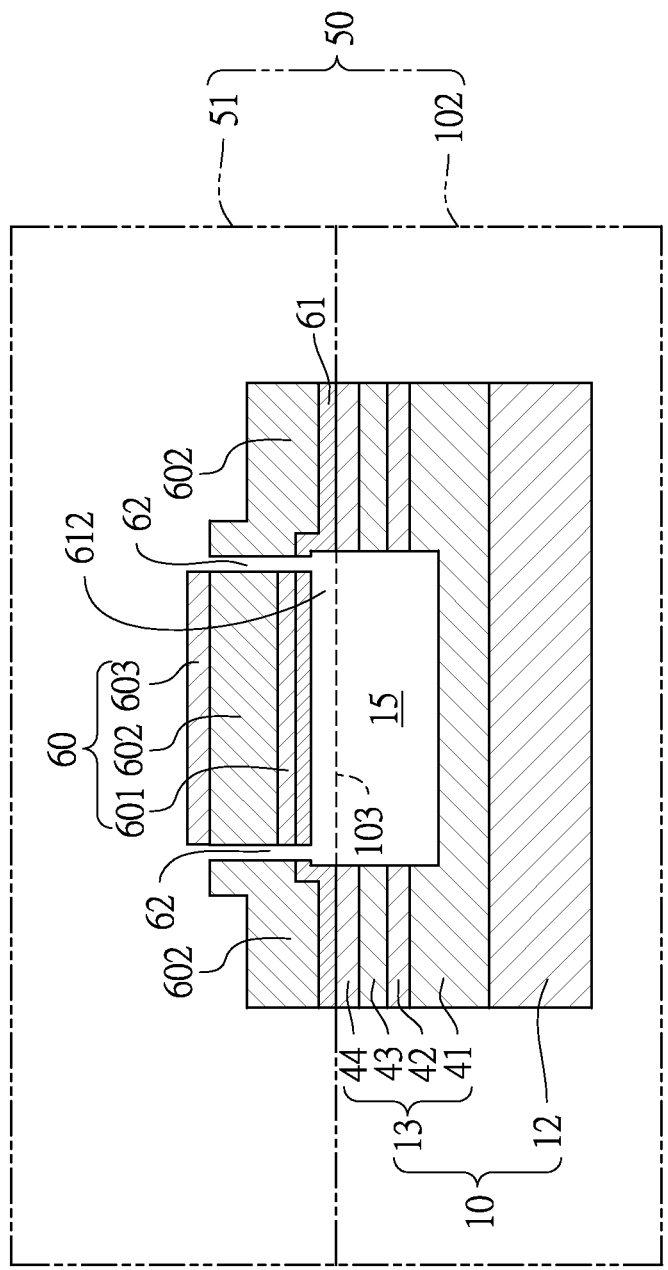
Figure 3E:
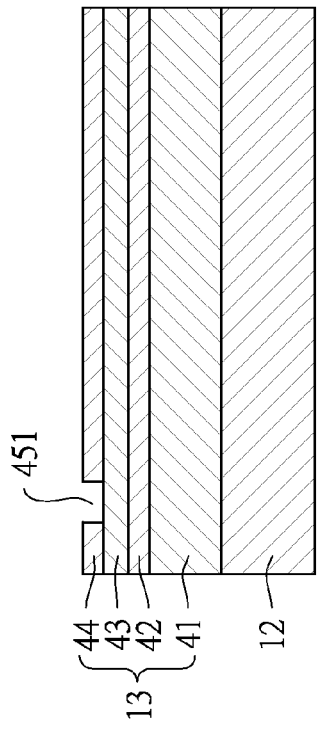
Figure 3G:
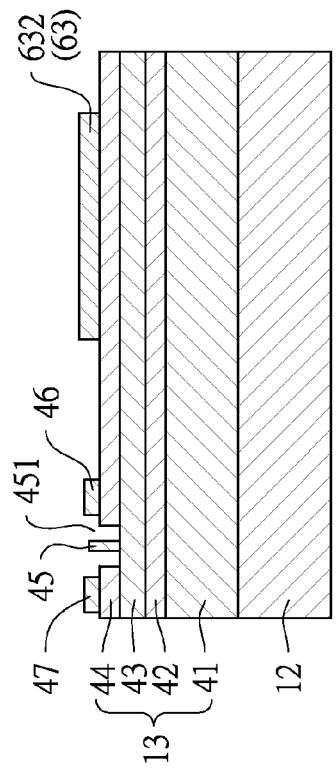
Figure 3D:
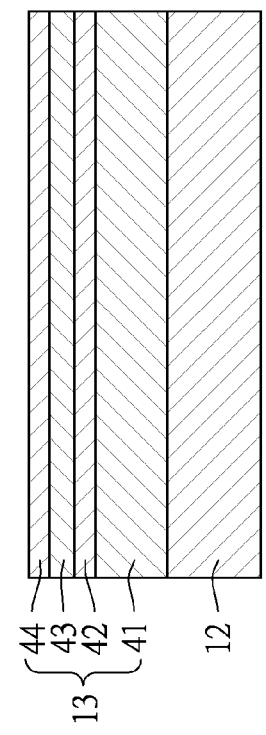
Figure 3F:
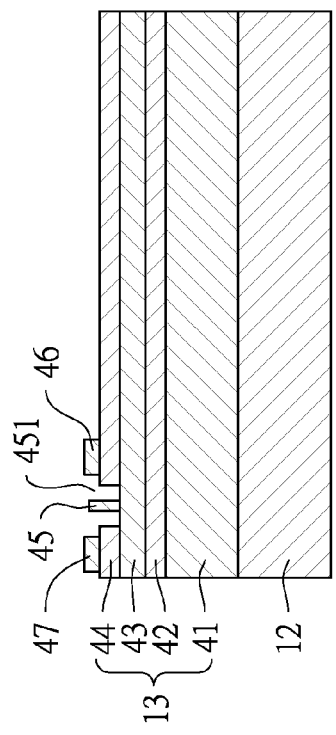

Please refer to FIG. 3C, which shows the cross-sectional view of another embodiment of the integrated structure of power amplifier and acoustic wave device of the present invention. The main structure in FIG. 3C is basically the same as the structure shown in FIG. 3, except that the film bulk acoustic resonator 51 further comprises at least one etching recess 62. The cross-sectional direction of FIG. 3C is orthogonal to that of FIG. 3. And there is only the acoustic wave device 50 at the position of the cross-sectional direction of FIG. 3C, hence there is no power amplifier 20 shown in FIG. 3C. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 3C is basically the same as that of the embodiment in FIG. 1B. The power amplifier 20 may also include the supporting layer 61, or may choose not to include the supporting layer 61.

Figures 3L, 3M:
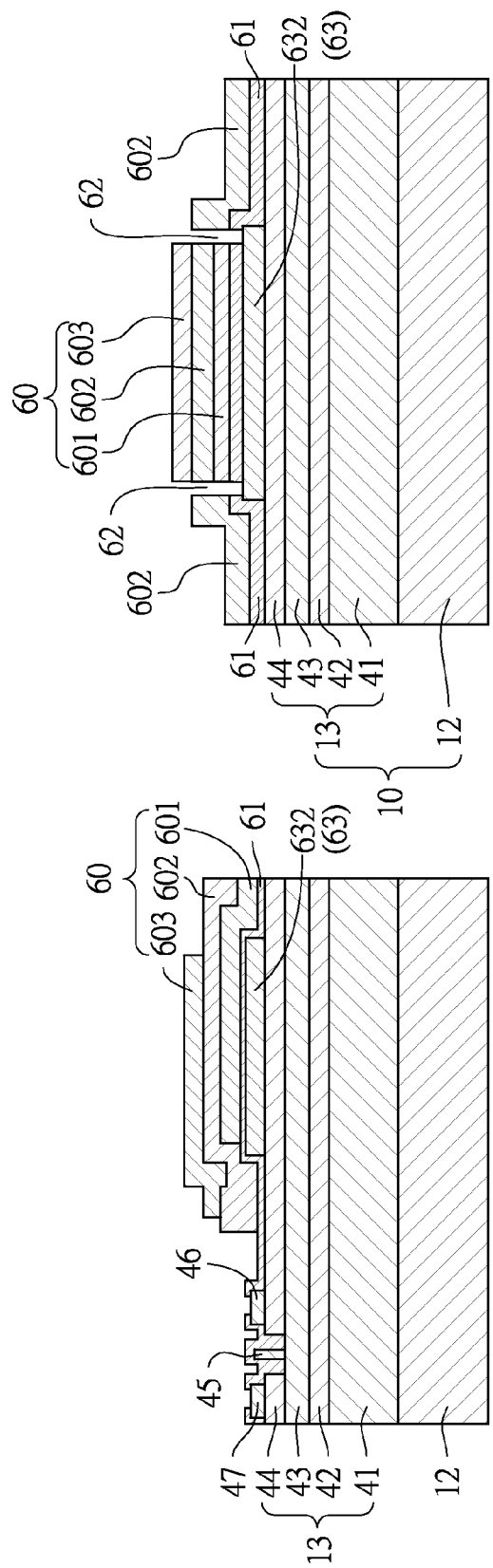

Please refer to FIGS. 3A and 3C. The cross-sectional direction of FIG. 3C is orthogonal to that of FIG. 3A. And there is only the acoustic wave device 50 at the position of the cross-sectional direction of FIG. 3C, hence there is no power amplifier 20 shown in FIG. 3C. The present invention provides a fabrication method for integrated structure of power amplifier and acoustic wave device. The fabrication method for the embodiment of FIGS. 3A and 3C comprises following steps of: Step C1: forming an epitaxial structure 13 on a compound semiconductor substrate 12 to form a compound semiconductor epitaxial substrate 10; Step C2: forming a power amplifier upper structure 21 on a first side 101 of the compound semiconductor epitaxial substrate 10 to form a power amplifier 20, wherein the power amplifier 20 is a pseudomorphic high electron mobility transistor 40; and Step C3: forming a film bulk acoustic resonator 51 on a second side 102 of the compound semiconductor epitaxial substrate 10 to form an acoustic wave device 50; wherein, the integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50. Step C1 includes following steps of: Step C11: (Please referring to FIG. 3D) forming a buffer layer 41 on the compound semiconductor substrate 12; Step C12: forming a channel layer 42 on the buffer layer 41; Step C13: forming a Schottky layer 43 on the channel layer 42; and Step C14: forming a cap layer 44 on the Schottky layer 43. Step C2 includes following steps of: Step C21: (Please referring to FIG. 3E) defining a gate electrode etching area, and etching to remove the cap layer 44 within the gate electrode etching area such that the etching stops at the Schottky layer 43 to form a gate recess 451, thereby the Schottky layer 43 within the gate recess 451 is exposed; Step C22: (Please referring to FIG. 3F) forming a drain electrode 47 on one end of the cap layer 44; Step C23: forming a source electrode 46 on the other end of the cap layer 44, wherein the gate recess 451 is located between the drain electrode 47 and the source electrode 46; and Step C24: forming a gate electrode 45 on the Schottky layer 43 within the gate recess 451. Step C3 includes following steps of: Step C31: (Please referring to FIG. 3G) forming a top sacrificial layer 63 on the compound semiconductor epitaxial substrate 10 (the cap layer 44); Step C32: defining a top sacrificial layer etching area, and etching to remove the top sacrificial layer 63 within the top sacrificial layer etching area to form a top sacrificial layer mesa 632, such that the compound semiconductor epitaxial substrate 10 (the cap layer 44) within the top sacrificial layer etching area is exposed; Step C33: (Please referring to FIGS. 3H and 3I) forming a supporting layer 61 on the top sacrificial layer 63 and the compound semiconductor epitaxial substrate 10 (the cap layer 44), wherein the supporting layer 61 has a supporting layer mesa 611 right above the top sacrificial layer mesa 632; wherein the supporting layer 61 may also be formed on the gate electrode 45, the source electrode 46, the drain electrode 47 and the gate recess 451, where the supporting layer 61 plays a role of protection; Step C34: forming a bulk acoustic resonator structure 60 on the supporting layer 61, which includes following steps of: Step C341: (Please referring to FIG. 3J) forming a bottom electrode 601 on one end of the supporting layer 61, where the bottom electrode 601 is formed on and at least extended along the supporting layer mesa 611; Step C342: (Please referring to FIG. 3K) forming a dielectric layer 602, wherein the dielectric layer 602 is formed at least on the bottom electrode 601 above the supporting layer mesa 611; and Step C343: (Please referring to FIG. 3L) forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step C35: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 (the cap layer 44) to form at least one etching recess 62, thereby part of the top sacrificial layer mesa 632 is exposed (Please referring to FIGS. 3L and 3M, wherein the cross-sectional direction of FIG. 3M is orthogonal to that of FIG. 3L, and there is only the acoustic wave device 50 at the position of the cross-sectional direction of FIG. 3M, hence there is no power amplifier 20 shown in FIG. 3M); Step C36: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 (the cap layer 44) respectively (Please referring to FIGS. 3N and 3O, wherein the cross-sectional direction of FIG. 3O is orthogonal to that of FIG. 3N, and there is only the acoustic wave device 50 at the position of the cross-sectional direction of FIG. 3O, hence there is no power amplifier 20 shown in FIG. 3O); and Step C37: etching to remove part of the compound semiconductor epitaxial substrate 10 below the supporting layer recess 612 to form a substrate recess 15 (Please referring to FIGS. 3A and 3C, wherein the cross-sectional direction of FIG. 3C is orthogonal to that of FIG. 3A, and there is only the acoustic wave device 50 at the position of the cross-sectional direction of FIG. 3C, hence there is no power amplifier 20 shown in FIG. 3C), wherein at least one substrate recess etching solution contacts with the top surface of the compound semiconductor epitaxial substrate 10 (the cap layer 44) via the at least one etching recess 62 and the supporting layer recess 612, the at least one substrate recess etching solution is uniformly distributed on the top surface of the compound semiconductor epitaxial substrate 10 (the cap layer 44) through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly; thereby the first side 101 of the compound semiconductor epitaxial substrate 10 includes: the compound semiconductor substrate 12, the buffer layer 41, the channel layer 42, the Schottky layer 43, the cap layer 44 and the gate recess 451; the power amplifier upper structure 21 includes: the drain electrode 47, the source electrode 46 and the gate electrode 45; wherein the first side 101 of the compound semiconductor epitaxial substrate 10 and the power amplifier upper structure 21 form the pseudomorphic high electron mobility transistor 40; wherein the bottom of the substrate recess 15 is the compound semiconductor epitaxial substrate 10 (the buffer layer 41), and the substrate recess 15 is peripherally surrounded by the channel layer 42, the Schottky layer 43 and the cap layer 44 or by the buffer layer 41, the channel layer 42, the Schottky layer 43 and the cap layer 44 (Please referring to FIG. 3B).

Figure 4:
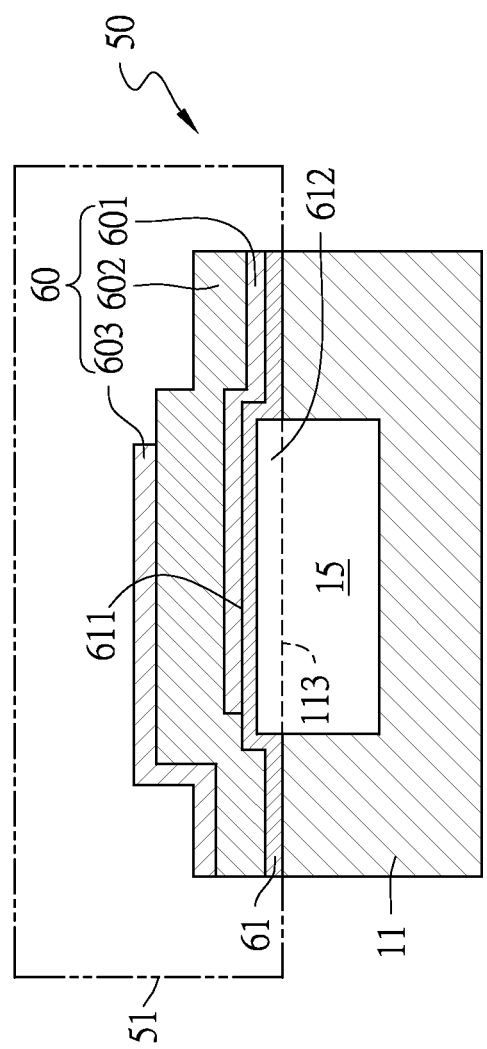

Please refer to FIG. 4, the cross-sectional view of an embodiment of the improved acoustic wave device structure of the present invention, the improved acoustic wave device structure comprises: a substrate 11 and a film bulk acoustic resonator 51; wherein the substrate 11 has a substrate recess 15 on the top of the substrate 11; the film bulk acoustic resonator 51 is formed on the substrate 11; wherein the film bulk acoustic resonator 51 includes: a supporting layer 61 and a bulk acoustic resonator structure 60; wherein supporting layer 61 is formed on the substrate 11, wherein the supporting layer 61 has a supporting layer recess 612 on the bottom of the supporting layer 61, the supporting layer 61 has an upwardly protruding supporting layer mesa 611 right above the supporting layer recess 612, and the supporting layer recess 612 is located right above the substrate recess 15, the supporting layer recess 612 is communicated with the substrate recess 15, and the supporting layer recess 612 and the substrate recess 15 have a boundary 113 therebetween and the boundary 113 is the extended from the top surface of the substrate 11; the bulk acoustic resonator structure 60 is formed on the supporting layer 61, wherein the bulk acoustic resonator structure 60 includes: a bottom electrode 601, a dielectric layer 602 and a top electrode 603. The bottom electrode 601 is formed on one end of the supporting layer 61, where the bottom electrode 601 is formed on and at least extended along the supporting layer mesa 611. The dielectric layer 602 is formed at least on the bottom electrode 601 above the supporting layer mesa 611. In the embodiment of FIG. 4, the dielectric layer 602 is formed on both the bottom electrode 601 and the supporting layer 61, and the dielectric layer 602 is also formed on the bottom electrode 601 above the supporting layer mesa 611. Please also refer to FIG. 4A, which shows the cross-sectional view of another embodiment of the improved acoustic wave device structure of the present invention. The main structure in FIG. 4A is basically the same as the structure shown in FIG. 4, except that the dielectric layer 602 is formed on the bottom electrode 601 above the supporting layer mesa 611 and on a small part of the supporting layer 61 above the supporting layer mesa 611. The top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611. In the embodiment of FIG. 4, the top electrode 603 is formed on the dielectric layer 602, while in embodiment of FIG. 4A, the top electrode 603 is formed on both the dielectric layer 602 and the supporting layer 61. The top electrode 603 and the bottom electrode 601 are not electrically connected. The gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the application of the acoustic wave device 50 may be a filter. Usually plural acoustic wave devices 50 are in series and/or in parallel in the combination of circuit to form a filter which may filter the signal.

In one embodiment, the application of the acoustic wave device 50 may be a mass sensing device, a biomedical sensing device, an UV sensing device, a pressure sensing device or a temperature sensing device.

In an embodiment, the function of the supporting layer 61 may be the supporting for the film bulk acoustic resonator 51 for preventing the film bulk acoustic resonator 51 from collapsing. The supporting layer 61 also may be the seed layer for the bottom electrode 601 and the dielectric layer 602 for improving the crystalline quality. In an embodiment, the supporting layer 61 is made of $SiN_x$ or AlN. The supporting layer 61 is formed on the substrate 11 by molecular beam epitaxy (MBE), sputtering or chemical vapor deposition (CVD).

In an embodiment, the bottom electrode 601 is needed to have a lower roughness and resistivity for benefit the preferable crystal growth axis. In an embodiment, the bottom electrode 601 is made of Mo, Pt, Al, Au, W or Ru. The bottom electrode 601 is formed on the supporting layer 61 by evaporation or sputtering.

In an embodiment, the dielectric layer 602 is made of AlN, monocrystalline $SiO_2$, ZnO, $HfO_2$, barium strontium titanate (BST) or lead zirconate titanate (PZT), and is formed on the bottom electrode 601 or formed on both the electrode 601 and the supporting layer 61 by epitaxial growth or sputtering. The selection of the materials of the dielectric layer 602 is associated with the application. AlN is a high acoustic wave velocity material (12000 m/s) and is suitable for high frequency application, and after the formation of the micro structure of the material, it has good physical and chemical stability and its properties are not easily to be influenced by the circumstance. ZnO may be formed under lower temperature and it has an acoustic wave velocity 6000 m/s. Its electromechanical coupling coefficient is higher (8.5%) and it is suitable for the application of broadband filter. However when forming ZnO, the concentration of oxygen vacancies in ZnO is not easily controlled, yet it is easily influenced by the humidity and oxygen of the circumstance. Both barium strontium titanate (BST) and lead zirconate titanate (PZT) are ferroelectric materials. Their dielectric constant may vary under external electric field. Hence, they are suitable for the application of acoustic wave device with tunable frequency within dozen MHz range of frequencies. Both barium strontium titanate (BST) and lead zirconate titanate (PZT) need to be polarized under high voltage electric field in order to obtain their piezoelectric characteristics. Lead zirconate titanate (PZT) has higher electromechanical coupling coefficient, however it contains lead.

In an embodiment, the top electrode 603 is needed to have a lower resistivity for reducing power loss so as to reduce the insertion loss. In an embodiment, the top electrode 603 may be made of Mo, Pt, Al, Au, W or Ru. The top electrode 603 is formed on the dielectric layer 602 or is formed on both the dielectric layer 602 and the supporting layer 61 by evaporation or sputtering.

In an embodiment, the bottom electrode 601 is made of Mo or Pt, while the dielectric layer 602 is made of AlN. The Mo of the bottom electrode 601 may be etched by Lithography and Lift-off process. And the AlN of the dielectric layer 602 may be etched by inductively coupled plasma (ICP) process with $CF_4$ plasma.

In an embodiment, the depth of the substrate recess 15 is between 50 nm and 10000 nm.

In an embodiment, the depth of the supporting layer recess 612 is between 10 nm and 3500 nm. In another embodiment, the optimized depth of the supporting layer recess 612 is between 10 nm and 1500 nm.

Please refer to FIG. 4B, which shows the cross-sectional view of another embodiment of the improved acoustic wave device structure of the present invention. The main structure in FIG. 4B is basically the same as the structure shown in FIG. 4, except that the film bulk acoustic resonator 51 further comprises at least one etching recess 62. The cross-sectional direction of FIG. 4B is orthogonal to that of FIG. 4. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside.

Figure 4C:
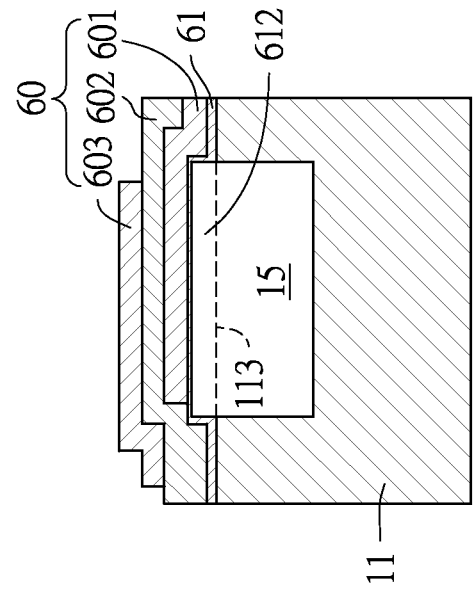
FIGS. 4C and 4D are the partial enlarged cross-sectional views of embodiments of the improved acoustic wave device structure of the present invention.
Figure 4D:
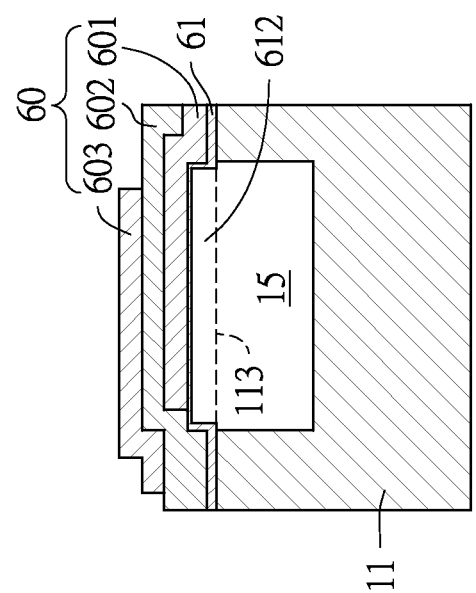

Please refer to FIG. 4C, which shows the partial enlarged cross-sectional view of an embodiment of the improved acoustic wave device structure of the present invention. In the embodiment of FIG. 4C, the supporting layer recess 612 has an opening smaller than that of the substrate recess 15. Please refer to FIG. 4D, which shows the partial enlarged cross-sectional view of another embodiment of the improved acoustic wave device structure of the present invention. In the embodiment of FIG. 4D, the supporting layer recess 612 has an opening almost equal to that of the substrate recess 15.

Figure 4E:
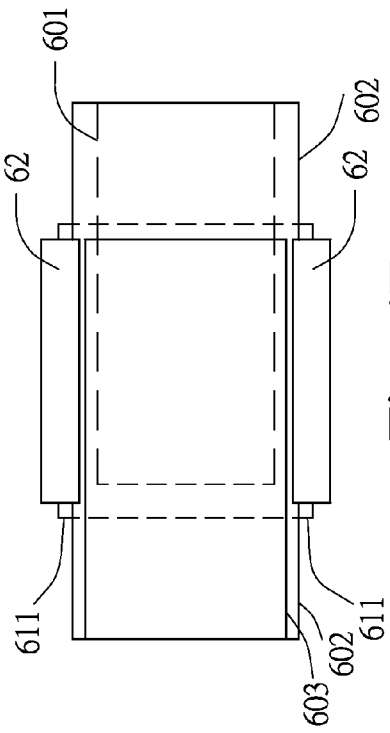
FIG. 4E~4H are the top views showing the relative position of the etching recess and the supporting layer mesa in the embodiments of the improved acoustic wave device structure of the present invention.
Figure 4F:
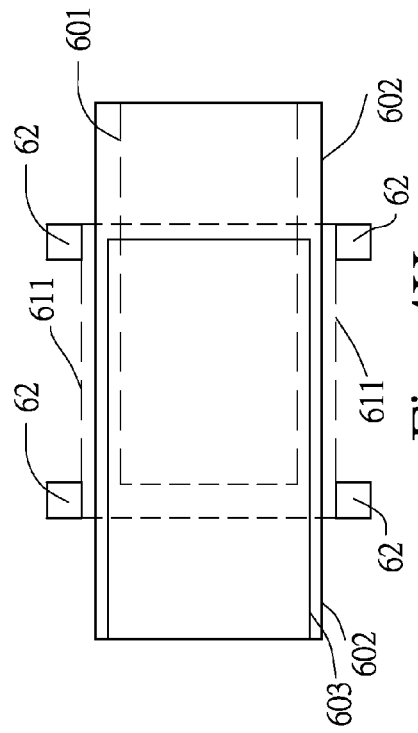
Figure 4G:
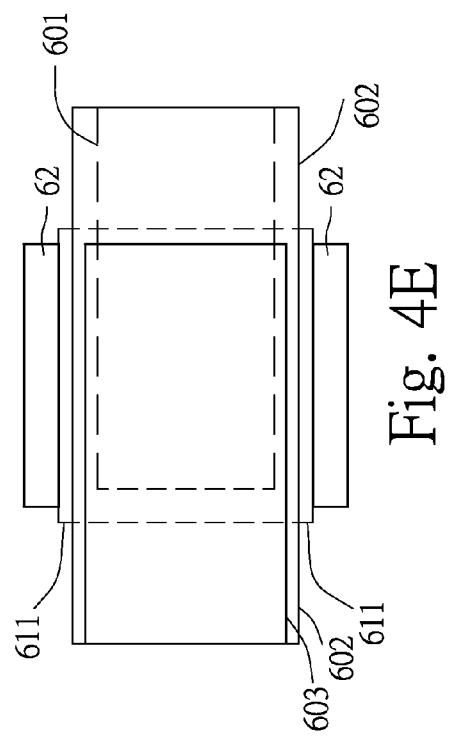
Figure 4H:
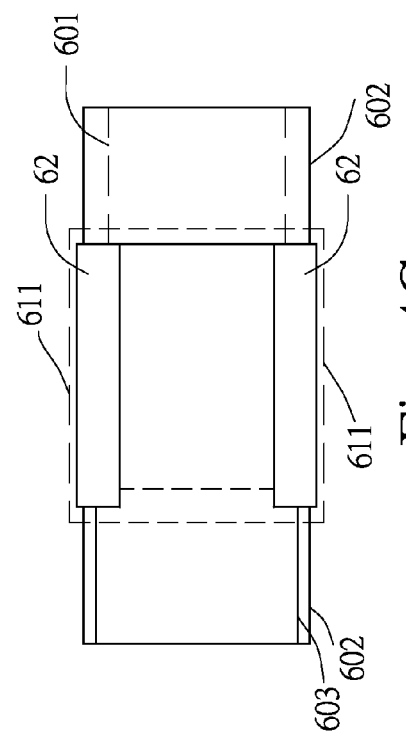

Please refer to FIGS. 4E, 4F, 4G and 4H, which show the top views of the relative position of the etching recess and the supporting layer mesa in the embodiments of the improved acoustic wave device structure of the present invention. In the embodiment of FIG. 4E, the improved acoustic wave device structure 50 has two etching recess 62 with long strip opening. The two etching recesses 62 are located on two opposite sides of the supporting layer mesa 611 respectively. And the etching recesses 62 penetrate the supporting layer 61 (not shown in FIG. 4E), and thereby the supporting layer recess 612 (not shown in FIG. 4E) is communicated with the outside. In the embodiment of FIG. 4F, the improved acoustic wave device structure 50 has two etching recess 62 with long strip opening. The two etching recesses 62 are located on two opposite sides of the supporting layer mesa 611 respectively. (part of the etching recesses 62 are within the supporting layer mesa 611, the rest part of the etching recesses 62 are outside the supporting layer mesa 611) And the etching recesses 62 penetrate the supporting layer 61 (not shown in FIG. 4F) and the dielectric layer 602. In the embodiment of FIG. 4G, the improved acoustic wave device structure 50 has two etching recess 62 with long strip opening. The two etching recesses 62 are located respectively on two opposite sides of the supporting layer mesa 611 within the supporting layer mesa 611. And the etching recesses 62 penetrate the supporting layer 61 (not shown in FIG. 4G), the bottom electrode 601, the dielectric layer 602 and the top electrode 603. In the embodiment of FIG. 4H, the improved acoustic wave device structure 50 has four etching recess 62 with square opening. The four etching recesses 62 are located on four corners of the supporting layer mesa 611 respectively. And the etching recesses 62 penetrate the supporting layer 61 (not shown in FIG. 4H). The amount of the etching recesses 62 is not limited to one, two, three, four or more. The etching recesses 62 may locate on other position and should not be limited by FIG. 4E, 4F, 4G or 4H.

Figure 5:
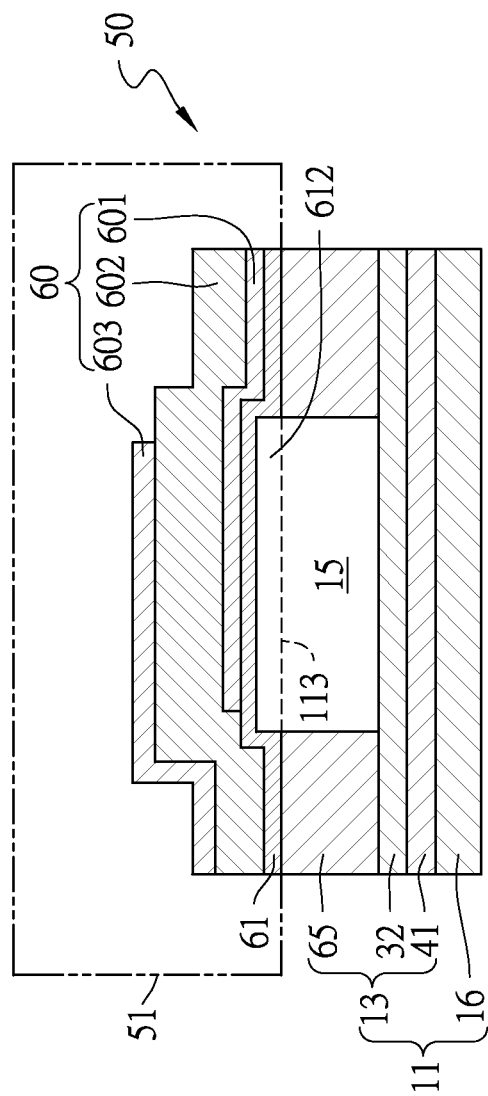
FIGS. 5 and 5A~5C are the cross-sectional views of embodiments of the improved acoustic wave device structure of the present invention.

Please refer to FIG. 5, which shows the cross-sectional view of another embodiment of the improved acoustic wave device structure of the present invention. The main structure in FIG. 5 is basically the same as the structure shown in FIG. 4, except that the substrate 11 includes a base substrate 16 and an epitaxial structure 13 formed on the base substrate 16. The epitaxial structure 13 includes: a buffer layer 41, an etching stop layer 32 and a bottom sacrificial layer 65; wherein the buffer layer 41 is formed on the base substrate 16; the etching stop layer 32 is formed on the buffer layer 41; the bottom sacrificial layer 65 is formed on the etching stop layer 32; wherein the substrate recess 15 is peripherally surrounded by the bottom sacrificial layer 65, and the bottom of the substrate recess 15 is the etching stop layer 32.

In an embodiment, the base substrate 16 may be made of GaAs, SiC, InP, GaN, AlN, Sapphire, Si or glass.

In an embodiment, the buffer layer 41 is made of GaAs, $SiO_2$ or GaN and is formed on the base substrate 16 by epitaxial growth.

In an embodiment, the base substrate 16 is made of GaAs, while the buffer layer 41 is preferable to be made of GaAs. In another embodiment, the base substrate 16 is made of Sapphire, while the buffer layer 41 is preferable to be made of GaN. In one embodiment, the base substrate 16 is made of Si, while the buffer layer 41 is preferable to be made of $SiO_2$.

In an embodiment, the etching stop layer 32 is made of InGaP. In one embodiment, the thickness of the etching stop layer 32 is between 5 nm and 1000 nm. In another embodiment, the optimized thickness of the etching stop layer 32 is 20 nm.

In an embodiment, the bottom sacrificial layer 65 is made of GaAs and is formed on the etching stop layer 32 by molecular beam epitaxy (MBE) or metal organic chemical vapor deposition (MOCVD). In another embodiment, the thickness of the bottom sacrificial layer 65 is between 500 nm and 3000 nm.

In an embodiment, the buffer layer 41 is made of GaAs, $SiO_2$ or GaN. The bottom sacrificial layer 65 is made of GaAs, Phosphosilicate glass (PSG) or Borophosphosilicate glass (BPSG). The etching stop layer 32 is made of InGaP, $SiN_x$, Pt, Al or Au.

In an embodiment, the bottom sacrificial layer 65 is made of GaAs; the etching stop layer 32 is made of InGaP; GaAs of the bottom sacrificial layer 65 may be etched by citric acid; and the etching may stop at InGaP of the etching stop layer 32. In another embodiment, the bottom sacrificial layer 65 is made of Phosphosilicate glass (PSG) or Borophosphosilicate glass (BPSG); the etching stop layer 32 is made of $SiN_x$, Pt, Al or Au.

Figure 5A:
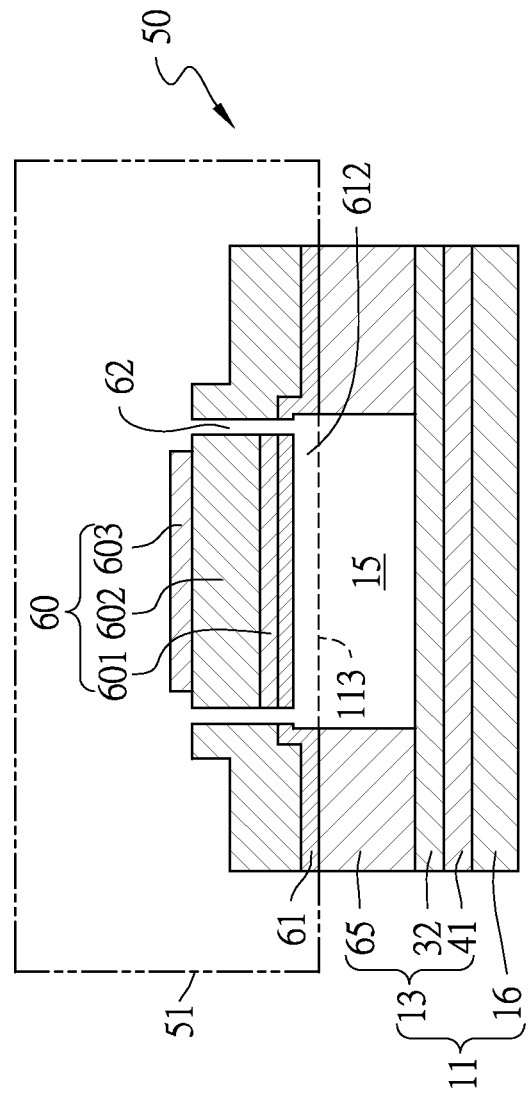

Please refer to FIG. 5A, which shows the cross-sectional view of another embodiment of the improved acoustic wave device structure of the present invention. The main structure in FIG. 5A is basically the same as the structure shown in FIG. 5, except that the film bulk acoustic resonator 51 further comprises at least one etching recess 62. The cross-sectional direction of FIG. 5A is orthogonal to that of FIG. 5. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 5A is basically the same as that of the embodiment in FIG. 4B.

Figure 5C:
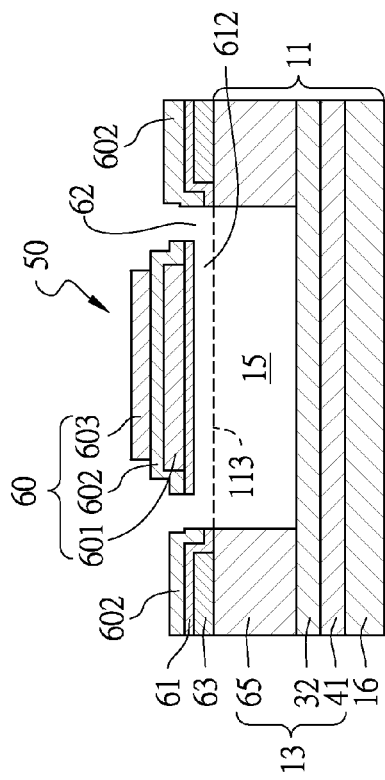
Figure 5B:
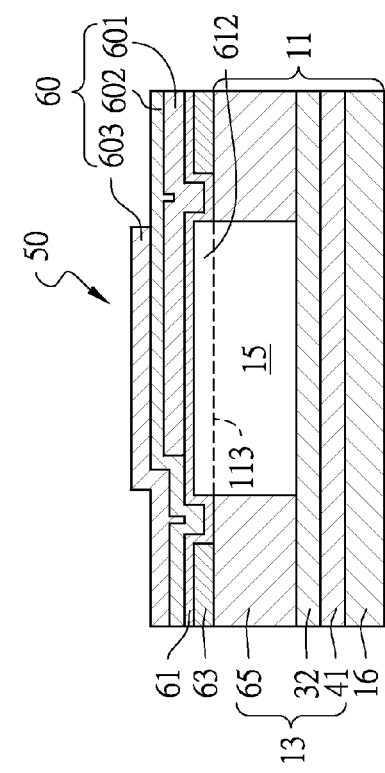
Figure 5E:
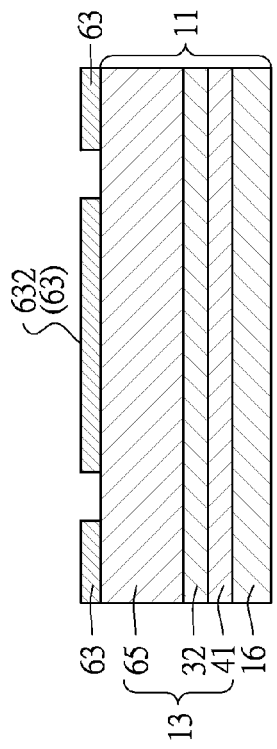
FIG. 5D~5M are the cross-sectional schematics showing steps of a fabrication method for the embodiments of the improved acoustic wave device structure of the present invention.
Figure 5D:
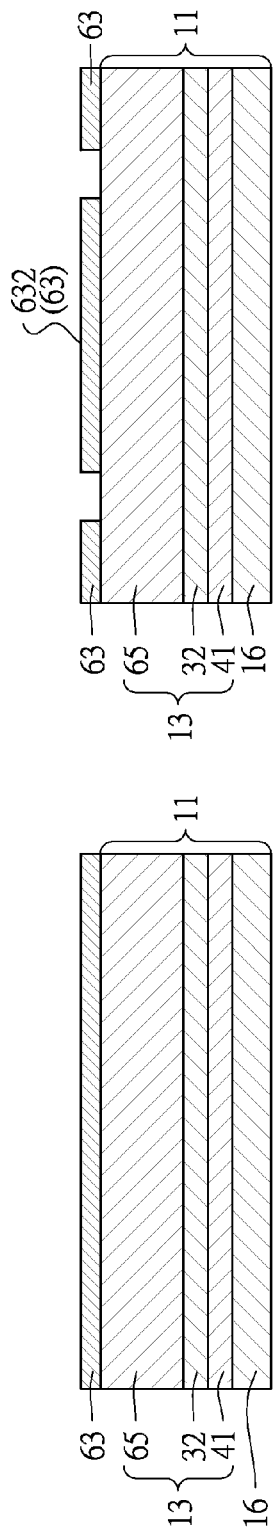
Figure 5F:
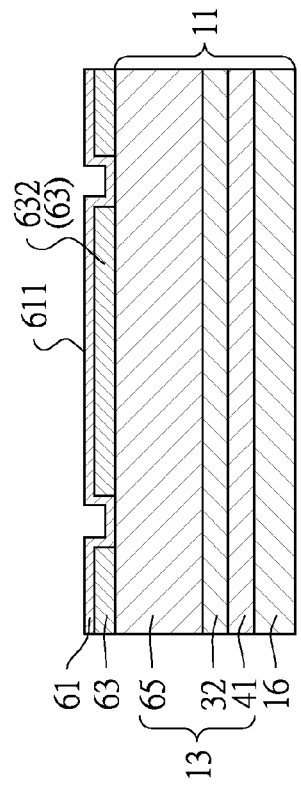
Figure 5G:
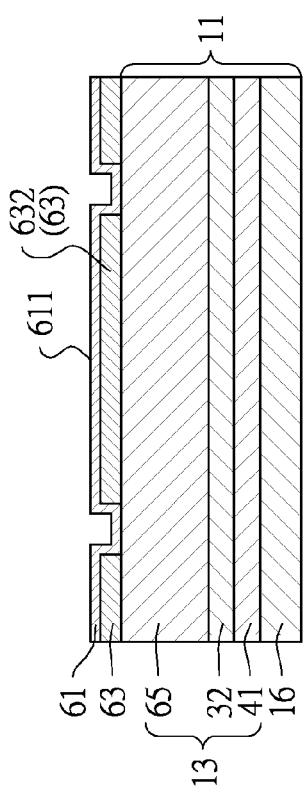
Figure 5H:
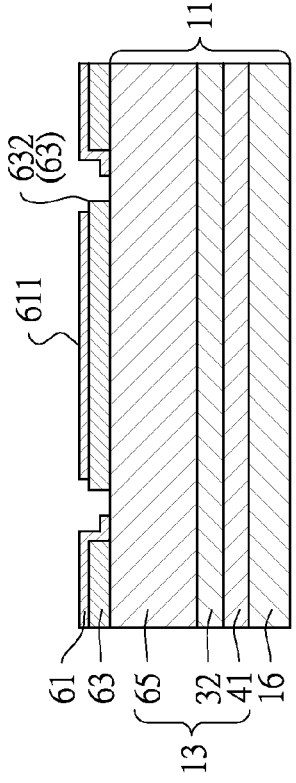
Figure 5I:
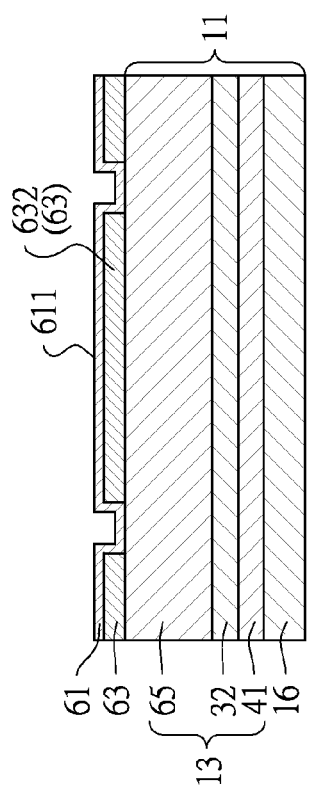
Figure 5J:
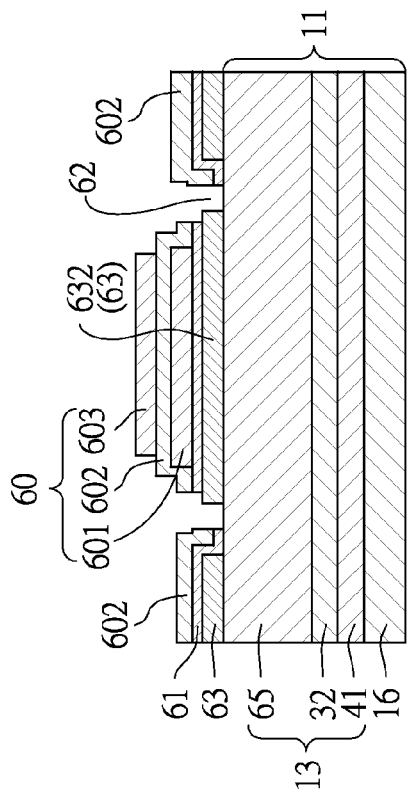
Figure 5K:
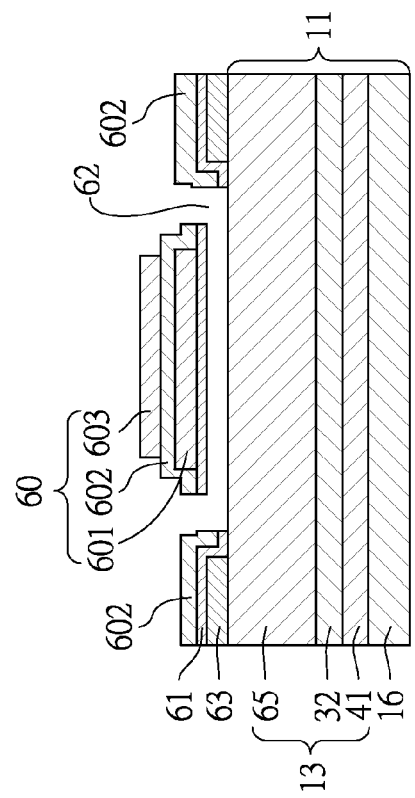
Figure 5L:
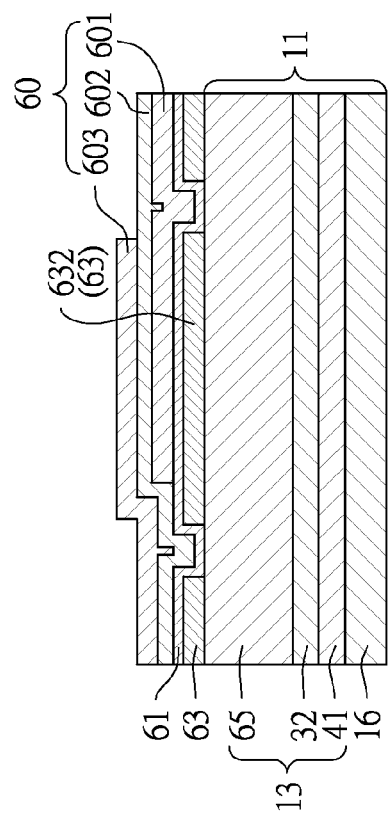
Figure 5M:
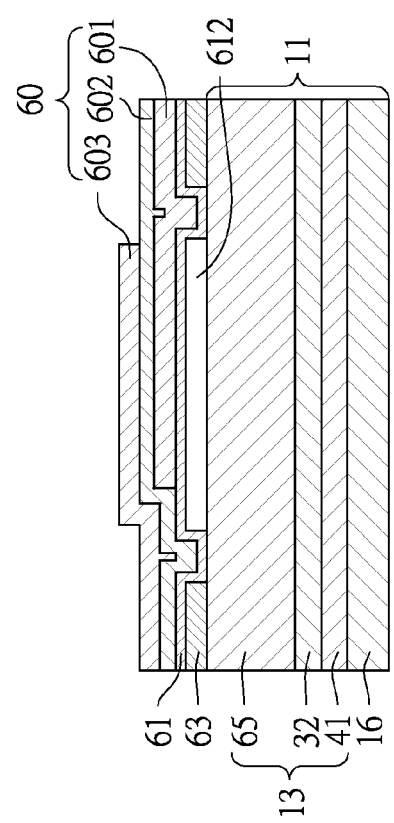

Please refer to FIGS. 5B and 5C. The cross-sectional direction of FIG. 5C is orthogonal to that of FIG. 5B. The present invention provides a fabrication method for improved acoustic wave device structure. The fabrication method for the embodiment of FIGS. 5B and 5C comprises following steps of: Step D1: forming an epitaxial structure 13 on a base substrate 16 to form a substrate 11; and Step D2: forming a film bulk acoustic resonator 51 on the substrate 11 (the epitaxial structure 13). Step D1 includes following steps of: Step D11: (Please referring to FIG. 5D) forming a buffer layer 41 on the base substrate 16; Step D12: forming an etching stop layer 32 on the buffer layer 41; and Step D13: forming a bottom sacrificial layer 65 on the etching stop layer 32; wherein the epitaxial structure 13 includes: the buffer layer 41, the etching stop layer 32 and the bottom sacrificial layer 65. Step D2 includes following steps of: Step D21: (Please referring to FIG. 5D) forming a top sacrificial layer 63 on the substrate 11 (the bottom sacrificial layer 65); Step D22: (Please referring to FIG. 5E) defining a top sacrificial layer etching area, and etching to remove the top sacrificial layer 63 within the top sacrificial layer etching area to form a top sacrificial layer mesa 632, such that the substrate 11 (the bottom sacrificial layer 65) within the top sacrificial layer etching area is exposed; Step D23: forming a supporting layer 61 on the top sacrificial layer 63 and the substrate 11 (the bottom sacrificial layer 65), wherein the supporting layer 61 has a supporting layer mesa 611 right above the top sacrificial layer mesa 632 (Please referring to FIGS. 5F and 5G, wherein the cross-sectional direction of FIG. 5G is orthogonal to that of FIG. 5F); wherein after Step D23, it may also choose to execute the step: defining a supporting layer etching area, and etching to remove the supporting layer 61 within the supporting layer etching area, such that the top sacrificial layer mesa 632 and/or the substrate 11 (the bottom sacrificial layer 65) within the supporting layer etching area are/is exposed (please also referring to FIGS. 5H and 5I, wherein the cross-sectional direction of FIG. SI is orthogonal to that of FIG. 5H); Step D24: forming a bulk acoustic resonator structure 60 on the supporting layer 61 (Please referring to FIGS. 5J and 5K, wherein the cross-sectional direction of FIG. 5K is orthogonal to that of FIG. 5J), which includes following steps of: Step D241: forming a bottom electrode 601 on one end of the supporting layer 61, where the bottom electrode 601 is formed on and at least extended along the supporting layer mesa 611; Step D242: forming a dielectric layer 602, wherein the dielectric layer 602 is formed at least on the bottom electrode 601 above the supporting layer mesa 611; and Step D243: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611;

Step D25: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the substrate 11 (the bottom sacrificial layer 65) to form at least one etching recess 62, thereby part of the top sacrificial layer mesa 632 is exposed; Step D26: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the substrate 11 (the bottom sacrificial layer 65) respectively (Please referring to FIGS. 5L and 5M, wherein the cross-sectional direction of FIG. 5M is orthogonal to that of FIG. 5L); and Step D27: etching to remove part of the substrate 11 below the supporting layer recess 612 to form a substrate recess 15 (Please referring to FIGS. 5B and 5C, wherein the cross-sectional direction of FIG. 5C is orthogonal to that of FIG. 5B), wherein the substrate recess 15 is peripherally surrounded by the bottom sacrificial layer 65, and the bottom of the substrate recess 15 is the etching stop layer 32, wherein at least one substrate recess etching solution contacts with the top surface of the substrate 11 via the at least one etching recess 62 and the supporting layer recess 612, the at least one substrate recess etching solution is uniformly distributed on the top surface of the substrate 11 through the supporting layer recess 612 so as to uniformly etch part of the substrate 11 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 113 therebetween and the boundary 113 is the extended from the top surface of the substrate 11, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the top sacrificial layer 63 is made of AlAs or TiW.

In an embodiment, the TiW of the top sacrificial layer 63 may be formed by sputtering on the epitaxial structure 13. TiW may be etched by $H_2O_2$.

In an embodiment, the AlAs of the top sacrificial layer 63 may be formed by molecular beam epitaxy (MBE) or metal organic chemical vapor deposition (MOCVD) on the epitaxial structure 13.

In an embodiment, the thickness of the top sacrificial layer 63 is between 10 nm and 3500 nm. In another embodiment, the optimized thickness of the top sacrificial layer 63 is between 10 nm and 1500 nm.

Please refer to FIG. 6, which shows the cross-sectional view of another embodiment of the improved acoustic wave device structure of the present invention. The main structure in FIG. 6 is basically the same as the structure shown in FIG. 4, except that the substrate 11 is a silicon substrate 14.

In another embodiment, the substrate 11 is a glass substrate.

Please refer to FIG. 6A, which shows the cross-sectional view of another embodiment of the improved acoustic wave device structure of the present invention. The main structure in FIG. 6A is basically the same as the structure shown in FIG. 6, except that the film bulk acoustic resonator 51 further comprises at least one etching recess 62. The cross-sectional direction of FIG. 6A is orthogonal to that of FIG. 6. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 6A is basically the same as that of the embodiment in FIG. 4B.

Figure 6D:
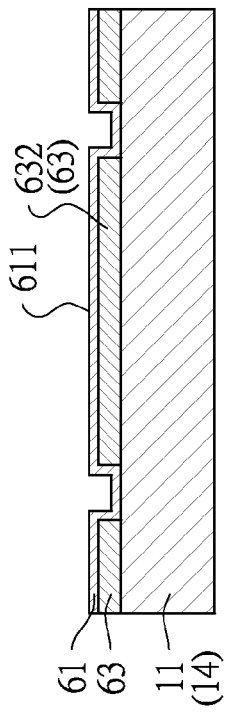
Figure 6E:
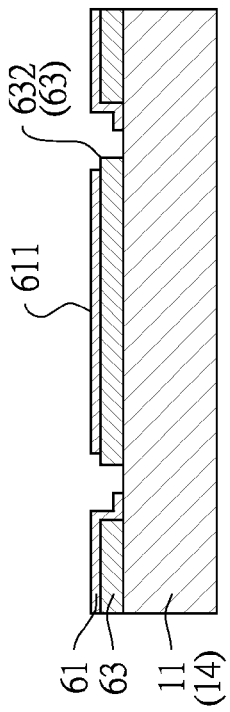
Figure 6F:
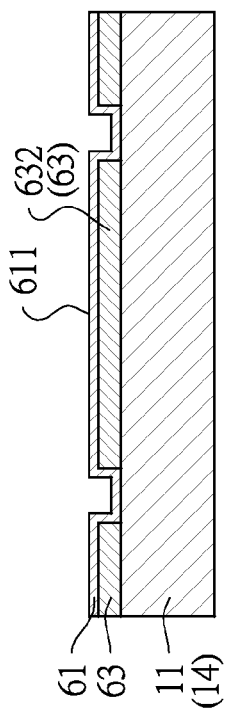
Figure 6G:
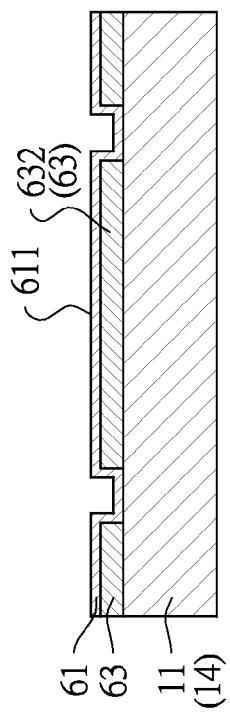
Figure 6H:
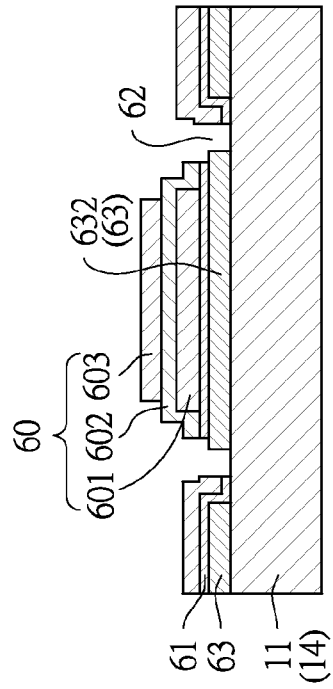
Figure 6I:
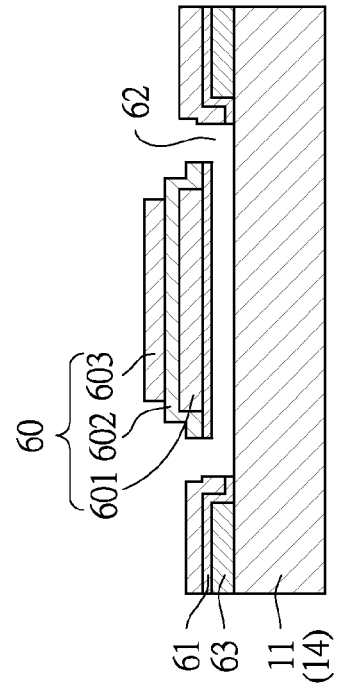
Figure 6J:
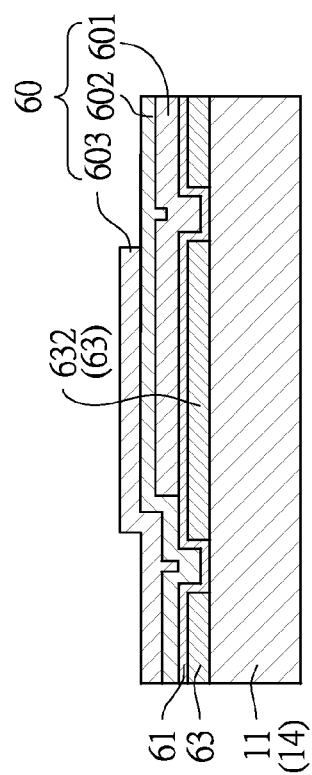
Figure 6K:
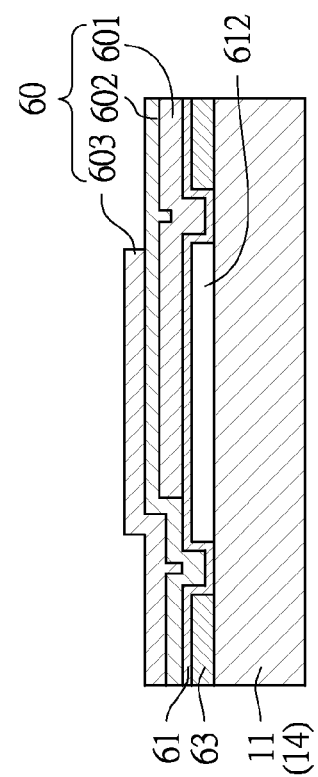
Figure 7:
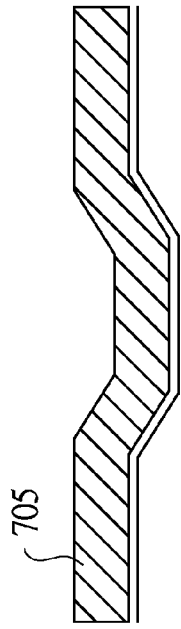
FIGS. 7 and 7A~7D are the schematics of conventional production processes of acoustic wave device.
Figure 7B:
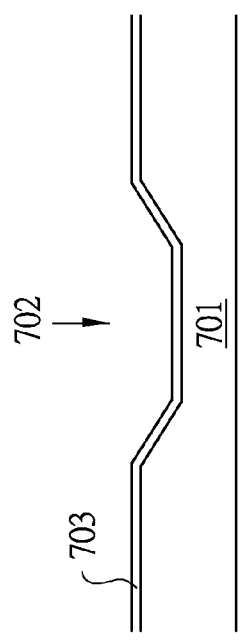
Figure 7A:
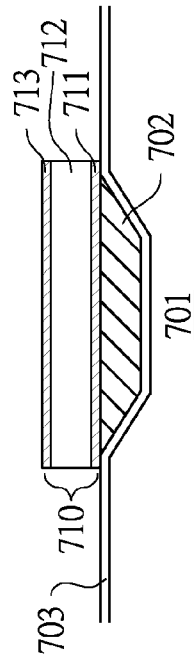
Figure 7C:
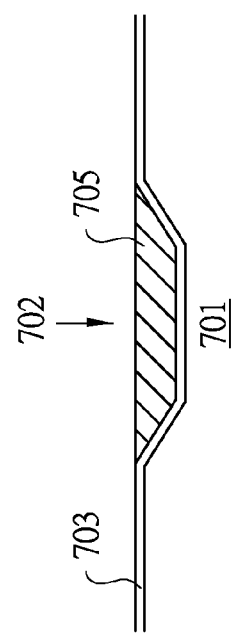
Figure 7D:
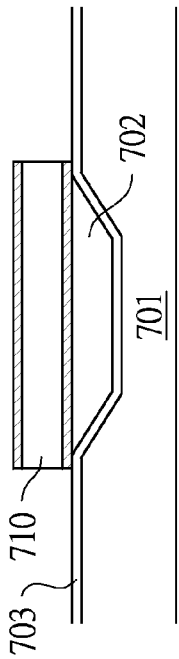

Please refer to FIGS. 6 and 6A. The cross-sectional direction of FIG. 6A is orthogonal to that of FIG. 6. The present invention provides a fabrication method for improved acoustic wave device structure. The fabrication method for the embodiment of FIGS. 6 and 6A comprises following steps of: Step E1: forming a film bulk acoustic resonator 51 on a substrate 11, which includes following steps of: Step E11: (Please referring to FIG. 6B) forming a top sacrificial layer 63 on the substrate 11, wherein the substrate 11 is a silicon substrate 14; Step E12: (Please referring to FIG. 6C) defining a top sacrificial layer etching area, and etching to remove the top sacrificial layer 63 within the top sacrificial layer etching area to form a top sacrificial layer mesa 632, such that the substrate 11 within the top sacrificial layer etching area is exposed; Step E13: forming a supporting layer 61 on the top sacrificial layer 63 and the substrate 11, wherein the supporting layer 61 has a supporting layer mesa 611 right above the top sacrificial layer mesa 632 (Please referring to FIGS. 6D and 6E, wherein the cross-sectional direction of FIG. 6E is orthogonal to that of FIG. 6D); wherein after Step E13, it may also choose to execute the step: defining a supporting layer etching area, and etching to remove the supporting layer 61 within the supporting layer etching area, such that the top sacrificial layer mesa 632 and/or the substrate 11 within the supporting layer etching area are/is exposed (please also referring to FIGS. 6F and 6G, wherein the cross-sectional direction of FIG. 6G is orthogonal to that of FIG. 6F); Step E14: forming a bulk acoustic resonator structure 60 on the supporting layer 61 (Please referring to FIGS. 6H and 6I, wherein the cross-sectional direction of FIG. 6I is orthogonal to that of FIG. 6H), which includes following steps of: Step E141: forming a bottom electrode 601 on one end of the supporting layer 61, where the bottom electrode 601 is formed on and at least extended along the supporting layer mesa 611; Step E142: forming a dielectric layer 602, wherein the dielectric layer 602 is formed at least on the bottom electrode 601 above the supporting layer mesa 611; and Step E143: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step E15: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the substrate 11 to form at least one etching recess 62, thereby part of the top sacrificial layer mesa 632 is exposed; Step E16: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the substrate 11 respectively (Please referring to FIGS. 6J and 6K, wherein the cross-sectional direction of FIG. 6K is orthogonal to that of FIG. 6J); and Step E17: etching to remove part of the substrate 11 below the supporting layer recess 612 to form a substrate recess 15 (Please referring to FIGS. 6 and 6A, wherein the cross-sectional direction of FIG. 6A is orthogonal to that of FIG. 6), wherein the bottom of the substrate recess 15 is the substrate 11, wherein at least one substrate recess etching solution contacts with the top surface of the substrate 11 via the at least one etching recess 62 and the supporting layer recess 612, the at least one substrate recess etching solution is uniformly distributed on the top surface of the substrate 11 through the supporting layer recess 612 so as to uniformly etch part of the substrate 11 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 113 therebetween and the boundary 113 is the extended from the top surface of the substrate 11, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In another embodiment, the substrate 11 is a silicon substrate 14, the top sacrificial layer 63 is made of TiW.

In an embodiment, the TiW of the top sacrificial layer 63 may be formed by sputtering on the substrate 11. TiW may be etched by $H_2O_2$.

In an embodiment, the thickness of the top sacrificial layer 63 is between 10 nm and 3500 nm. In another embodiment, the optimized thickness of the top sacrificial layer 63 is between 10 nm and 1500 nm.

Please refer to FIGS. 6M and 6N, which show the cross-sectional views of another embodiment of the improved acoustic wave device structure of the present invention, wherein the cross-sectional direction of FIG. 6N is orthogonal to that of FIG. 6M. The main structure in FIGS. 6M and 6N is basically the same as the structure shown in FIGS. 6 and 6A, except that in Step E12 (Please compare FIGS. 6C and 6L), the top sacrificial layer 63 is etched and removed, except the top sacrificial layer mesa 632.

As disclosed in the above description and attached drawings, the present invention can provide an improved acoustic wave device structure, an integrated structure of power amplifier and acoustic wave device, and fabrication methods thereof with reduced component size, optimized the impedance matching, and reduced the signal loss between the power amplifier and the acoustic wave device. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A fabrication method for integrated structure of power amplifier and acoustic wave device, which comprises following steps of:
   forming an epitaxial structure on a compound semiconductor substrate to form a compound semiconductor epitaxial substrate;
   forming a power amplifier upper structure on a first side of said compound semiconductor epitaxial substrate to form a power amplifier; and
   forming a film bulk acoustic resonator on a second side of said compound semiconductor epitaxial substrate to form an acoustic wave device;
   wherein forming said film bulk acoustic resonator on said second side of said compound semiconductor epitaxial substrate includes following steps of:
      forming a top sacrificial layer on said compound semiconductor epitaxial substrate;
      defining a top sacrificial layer etching area, and etching to remove said top sacrificial layer within said top sacrificial layer etching area to form a top sacrificial layer mesa, such that said compound semiconductor epitaxial substrate within said top sacrificial layer etching area is exposed;
      forming a supporting layer on said top sacrificial layer and said compound semiconductor epitaxial substrate, wherein said supporting layer has a supporting layer mesa right above said top sacrificial layer mesa;
      forming a bulk acoustic resonator structure on said supporting layer, which includes following steps of:
         forming a bottom electrode on one end of said supporting layer, where said bottom electrode is formed on and at least extended along said supporting layer mesa;
         forming a dielectric layer, wherein said dielectric layer is formed at least on said bottom electrode above said supporting layer mesa; and
         forming a top electrode, wherein said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa;
      defining at least one recess etching area, and etching to remove said supporting layer within said at least one recess etching area or etching to remove said supporting layer and said bulk acoustic resonator structure within said at least one recess etching area such that the etching stops at said top sacrificial layer mesa and/or said compound semiconductor epitaxial substrate to form at least one etching recess, thereby part of said top sacrificial layer mesa is exposed;
      etching to remove said top sacrificial layer mesa to form a supporting layer recess, wherein at least one top sacrificial layer etching solution contacts with said top sacrificial layer mesa via said at least one etching recess and etches to remove said top sacrificial layer mesa, thereby the top and the bottom of said supporting layer recess are said supporting layer and said compound semiconductor epitaxial substrate respectively; and etching to remove part of said compound semiconductor epitaxial substrate below said supporting layer recess to form a substrate recess, wherein the bottom of said substrate recess is said compound semiconductor epitaxial substrate, wherein at least one substrate recess etching solution contacts with the top surface of said compound semiconductor epitaxial substrate via said at least one etching recess and said supporting layer recess, said at least one substrate recess etching solution is uniformly distributed on the top surface of said compound semiconductor epitaxial substrate through said supporting layer recess so as to uniformly etch part of said compound semiconductor epitaxial substrate below said supporting layer recess to form said substrate recess, and thereby prevents the side etching phenomenon during the etching, wherein said supporting layer recess is communicated with said substrate recess, and said supporting layer recess and said substrate recess have a boundary therebetween and the boundary is the extended from the top surface of said compound semiconductor epitaxial substrate, wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly, wherein, the integrated structure of said power amplifier and said acoustic wave device on the same said compound semiconductor epitaxial substrate is capable of reducing the component size, optimizing the impedance matching, and reducing the signal loss between said power amplifier and said acoustic wave device.

2. The fabrication method for integrated structure of power amplifier and acoustic wave device according to claim 1, wherein said top sacrificial layer is made of AlAs or TiW.

3. The fabrication method for integrated structure of power amplifier and acoustic wave device according to claim 1, wherein said top sacrificial layer has a thickness between 10 nm and 3500 nm.

4. The fabrication method for integrated structure of power amplifier and acoustic wave device according to claim 3, wherein said top sacrificial layer has a thickness between 10 nm and 1500 nm.

5. The fabrication method for integrated structure of power amplifier and acoustic wave device according to claim 1, wherein said supporting layer recess has an opening smaller than or almost equal to that of said substrate recess.

6. A fabrication method for integrated structure of power amplifier and acoustic wave device, which comprises following steps of:

forming an epitaxial structure on a compound semiconductor substrate to form a compound semiconductor epitaxial substrate, wherein forming said epitaxial structure on said compound semiconductor substrate includes following steps of:

forming a subcollector layer on said compound semiconductor substrate; and forming a collector layer on said subcollector layer;

forming a power amplifier upper structure on a first side of said compound semiconductor epitaxial substrate to form a power amplifier, wherein said power amplifier is a heterojunction bipolar transistor (HBT), wherein forming said power amplifier upper structure on said first side of said compound semiconductor epitaxial substrate includes following steps of:

forming a base layer on said collector layer;

forming an emitter ledge layer on said base layer;

forming an emitter layer on said emitter ledge layer;

defining an emitter layer etching area, and etching to remove said emitter layer within said emitter layer etching area;

defining an emitter ledge layer etching area, and etching to remove said emitter ledge layer within said emitter ledge layer etching area;

forming a base electrode on said base layer and/or said emitter ledge layer;

defining a base layer etching area, and etching to remove said base layer within said base layer etching area;

forming an emitter electrode on said emitter layer;

defining a collector electrode etching area, and etching to remove said collector layer within said collector electrode etching area such that the etching stops at said subcollector layer to form a collector recess, thereby said subcollector layer within said collector recess is exposed; and forming a collector electrode on said subcollector layer within said collector recess; and forming a film bulk acoustic resonator on a second side of said compound semiconductor epitaxial substrate to form an acoustic wave device;

thereby said first side of said compound semiconductor epitaxial substrate includes: said compound semiconductor substrate, said subcollector layer, said collector layer and said collector recess; said power amplifier upper structure includes: said base layer, said emitter ledge layer, said emitter layer, said base electrode, said emitter electrode and said collector electrode; wherein said first side of said compound semiconductor epitaxial substrate and said power amplifier upper structure form said heterojunction bipolar transistor;

wherein, the integrated structure of said power amplifier and said acoustic wave device on the same said compound semiconductor epitaxial substrate is capable of reducing the component size, optimizing the impedance matching, and reducing the signal loss between said power amplifier and said acoustic wave device.

7. The fabrication method for integrated structure of power amplifier and acoustic wave device according to claim 6, wherein said collector layer is made of GaAs.

8. The fabrication method for integrated structure of power amplifier and acoustic wave device according to claim 6, wherein said collector layer has a thickness between 500 nm and 3000 nm.

9. The fabrication method for integrated structure of power amplifier and acoustic wave device according to claim 6, wherein said base layer is made of GaAs.

10. The fabrication method for integrated structure of power amplifier and acoustic wave device according to claim 6, wherein said base layer has a thickness between 60 nm and 100 nm.

11. The fabrication method for integrated structure of power amplifier and acoustic wave device according to claim 6, further comprises a step of forming an etching stop layer on said subcollector layer, and a step of etching to remove said etching stop layer within said collector electrode etching area; wherein forming said etching stop layer on said subcollector layer and then forming said collector layer on said etching stop layer such that said epitaxial structure includes: said subcollector layer, said etching stop layer and said collector layer; and wherein etching to remove said etching stop layer within said collector electrode etching area such that the etching stops at said subcollector layer to form said collector recess, and thereby said subcollector layer within said collector recess is exposed; wherein said the bottom of said substrate recess is said etching stop layer; thereby said first side of said compound semiconductor epitaxial substrate includes: said compound semiconductor substrate, said subcollector layer, said etching stop layer, said collector layer and said collector recess; said power amplifier upper structure includes: said base layer, said emitter ledge layer, said emitter layer, said base electrode, said emitter electrode and said collector electrode; wherein said first side of said compound semiconductor epitaxial substrate and said power amplifier upper structure form said heterojunction bipolar transistor.

12. The fabrication method for integrated structure of power amplifier and acoustic wave device according to claim 11, further comprises a step of etching to remove said etching stop layer below the bottom of said substrate recess such that said substrate recess is peripherally surrounded by said collector layer and said etching stop layer, and the bottom of said substrate recess is said subcollector layer.

13. The fabrication method for integrated structure of power amplifier and acoustic wave device according to claim 11, wherein said etching stop layer is made of InGaP.

14. The fabrication method for integrated structure of power amplifier and acoustic wave device according to claim 11, wherein said etching stop layer has a thickness between 5 nm and 1000 nm.

15. The fabrication method for integrated structure of power amplifier and acoustic wave device according to claim 14, wherein said etching stop layer has a thickness 20 nm.

16. A fabrication method for integrated structure of power amplifier and acoustic wave device, which comprises following steps of:
    forming an epitaxial structure on a compound semiconductor substrate to form a compound semiconductor epitaxial substrate,
    wherein forming said epitaxial structure on said compound semiconductor substrate includes following steps of:
        forming a buffer layer on said compound semiconductor substrate;
        forming a channel layer on said buffer layer;
        forming a Schottky layer on said channel layer; and
        forming a cap layer on said Schottky layer;
    forming a power amplifier upper structure on a first side of said compound semiconductor epitaxial substrate to form a power amplifier; wherein said power amplifier is a field effect transistor (FET), a high electron mobility transistor (HEMT) or a pseudomorphic high electron mobility transistor (pHEMT); and
    forming a film bulk acoustic resonator on a second side of said compound semiconductor epitaxial substrate to form an acoustic wave device;
    wherein, the integrated structure of said power amplifier and said acoustic wave device on the same said compound semiconductor epitaxial substrate is capable of reducing the component size, optimizing the impedance matching, and reducing the signal loss between said power amplifier and said acoustic wave device.

17. The fabrication method for integrated structure of power amplifier and acoustic wave device according to claim 16, wherein the bottom of said substrate recess is said buffer layer, and said substrate recess is peripherally surrounded by said channel layer, said Schottky layer and said cap layer or by said buffer layer, said channel layer, said Schottky layer and said cap layer.

18. The fabrication method for integrated structure of power amplifier and acoustic wave device according to claim 16, wherein forming said power amplifier upper structure on said first side of said compound semiconductor epitaxial substrate includes following steps of:
    defining a gate electrode etching area, and etching to remove said cap layer within said gate electrode etching area such that the etching stops at said Schottky layer to form a gate recess, thereby said Schottky layer within said gate recess is exposed;
    forming a drain electrode on one end of said cap layer;
    forming a source electrode on the other end of said cap layer, wherein said gate recess is located between said drain electrode and said source electrode; and
    forming a gate electrode on said Schottky layer within said gate recess;
    thereby said first side of said compound semiconductor epitaxial substrate includes: said compound semiconductor substrate, said buffer layer, said channel layer, said Schottky layer, said cap layer and said gate recess; said power amplifier upper structure includes: said drain electrode, said source electrode and said gate electrode; wherein said first side of said compound semiconductor epitaxial substrate and said power amplifier upper structure form said pseudomorphic high electron mobility transistor.

19. The fabrication method for integrated structure of power amplifier and acoustic wave device according to claim 1, wherein said compound semiconductor substrate is made of GaAs, SiC, InP, GaN, AlN or Sapphire.

20. A fabrication method for improved acoustic wave device structure comprises the following steps of:
    forming a film bulk acoustic resonator on a substrate, which includes following steps of:
        forming a top sacrificial layer on said substrate;
        defining a top sacrificial layer etching area, and etching to remove said top sacrificial layer within said top sacrificial layer etching area to form a top sacrificial layer mesa, such that said substrate within said top sacrificial layer etching area is exposed;
        forming a supporting layer on said top sacrificial layer and said substrate, wherein said supporting layer has a supporting layer mesa right above said top sacrificial layer mesa;
        forming a bulk acoustic resonator structure on said supporting layer, which includes following steps of:
            forming a bottom electrode on one end of said supporting layer, where said bottom electrode is formed on and at least extended along said supporting layer mesa;
            forming a dielectric layer, wherein said dielectric layer is formed at least on said bottom electrode above said supporting layer mesa; and
            forming a top electrode, wherein said top electrode is formed on the other end with respect to said bottom electrode, where said top electrode is formed on said dielectric layer or formed on both said dielectric layer and said supporting layer, and said top electrode is formed on and at least extended along said dielectric layer above said supporting layer mesa;

defining at least one recess etching area, and etching to remove said supporting layer within said at least one recess etching area or etching to remove said supporting layer and said bulk acoustic resonator structure within said at least one recess etching area such that the etching stops at said top sacrificial layer mesa and/or said substrate to form at least one etching recess, thereby part of said top sacrificial layer mesa is exposed;

etching to remove said top sacrificial layer mesa to form a supporting layer recess, wherein at least one top sacrificial layer etching solution contacts with said top sacrificial layer mesa via said at least one etching recess and etches to remove said top sacrificial layer mesa, thereby the top and the bottom of said supporting layer recess are said supporting layer and said substrate respectively; and etching to remove part of said substrate below said supporting layer recess to form a substrate recess, wherein the bottom of said substrate recess is said substrate, wherein at least one substrate recess etching solution contacts with the top surface of said substrate via said at least one etching recess and said supporting layer recess, said at least one substrate recess etching solution is uniformly distributed on the top surface of said substrate through said supporting layer recess so as to uniformly etch part of said substrate below said supporting layer recess to form said substrate recess, and thereby prevents the side etching phenomenon during the etching, wherein said supporting layer recess is communicated with said substrate recess, and said supporting layer recess and said substrate recess have a boundary therebetween and the boundary is the extended from the top surface of said substrate, wherein the gap between said supporting layer mesa and the bottom of said substrate recess is increased by the communication of said supporting layer recess and said substrate recess, so as to avoid the contact of said supporting layer mesa and the bottom of said substrate recess when said film bulk acoustic resonator is affected by stress such that said supporting layer mesa is bended downwardly.

21. The fabrication method for improved acoustic wave device structure according to claim 20, wherein said substrate includes a base substrate and an epitaxial structure formed on said base substrate.

22. The fabrication method for improved acoustic wave device structure according to claim 21, wherein said base substrate is made of GaAs, SiC, InP, GaN, AlN, Sapphire, Si or glass.

23. The fabrication method for improved acoustic wave device structure according to claim 21, wherein forming said epitaxial structure on said base substrate includes following steps of:

forming a buffer layer on said base substrate;
forming an etching stop layer on said buffer layer; and
forming a bottom sacrificial layer on said etching stop layer;
wherein said substrate recess is peripherally surrounded by said bottom sacrificial layer, and the bottom of said substrate recess is said etching stop layer.

24. The fabrication method for improved acoustic wave device structure according to claim 23, wherein said bottom sacrificial layer is made of GaAs.

25. The fabrication method for improved acoustic wave device structure according to claim 23, wherein said bottom sacrificial layer has a thickness between 500 nm and 3000 nm.

26. The fabrication method for improved acoustic wave device structure according to claim 23, wherein said etching stop layer is made of InGaP.

27. The fabrication method for improved acoustic wave device structure according to claim 23, wherein said etching stop layer has a thickness between 5 nm and 1000 nm.

28. The fabrication method for improved acoustic wave device structure according to claim 27, wherein said etching stop layer has a thickness 20 nm.

29. The fabrication method for improved acoustic wave device structure according to claim 20, wherein said substrate is made of a silicon substrate.

30. The fabrication method for improved acoustic wave device structure according to claim 29, wherein said top sacrificial layer is made of TiW.

31. The fabrication method for improved acoustic wave device structure according to claim 20, wherein said top sacrificial layer is made of AlAs or TiW.

32. The fabrication method for improved acoustic wave device structure according to claim 20, wherein said top sacrificial layer has a thickness between 10 nm and 3500 nm.

33. The fabrication method for improved acoustic wave device structure according to claim 32, wherein said top sacrificial layer has a thickness between 10 nm and 1500 nm.

34. The fabrication method for improved acoustic wave device structure according to claim 20, wherein said supporting layer recess has an opening smaller than or almost equal to that of said substrate recess.

* * * * *